United States Patent
Shimomura et al.

(10) Patent No.: US 9,786,495 B2
(45) Date of Patent: Oct. 10, 2017

(54) METHOD FOR EVALUATING SEMICONDUCTOR FILM AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Akihisa Shimomura, Kanagawa (JP); Naoki Okuno, Kanagawa (JP); Mitsuhiro Ichijo, Kanagawa (JP); Noriyoshi Suzuki, Kanagawa (JP); Tetsuhiro Tanaka, Kanagawa (JP); Sachiaki Tezuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/855,648

(22) Filed: Sep. 16, 2015

(65) Prior Publication Data

US 2016/0086792 A1     Mar. 24, 2016

(30) Foreign Application Priority Data

Sep. 19, 2014    (JP) .................. 2014-191058

(51) Int. Cl.
    *H01L 21/02*       (2006.01)
    *H01L 21/66*       (2006.01)
    (Continued)

(52) U.S. Cl.
    CPC ......... *H01L 21/0234* (2013.01); *C23C 14/08* (2013.01); *C23C 14/5806* (2013.01);
    (Continued)

(58) Field of Classification Search
    CPC .......... H01L 29/66969; H01L 21/0234; H01L 22/12; H01L 21/02554; H01L 21/02565;
    (Continued)

(56) References Cited

U.S. PATENT DOCUMENTS 5,528,032 A    6/1996   Uchiyama
5,731,856 A    3/1998   Kim et al.
(Continued)

FOREIGN PATENT DOCUMENTS

EP     1737044 A    12/2006
EP     2226847 A     9/2010
(Continued)

OTHER PUBLICATIONS

Nonaka.Y et al., "Investigation of defects in In—Ga—Zn oxide thin film using electron spin resonance signals", J. Appl. Phys. (Journal of Applied Physics), Apr. 1, 2014, vol. 115, pp. 163707-1-163707-5.

(Continued)

*Primary Examiner* — Thanh T Nguyen
(74) *Attorney, Agent, or Firm* — Fish & Richardson P.C.

(57) ABSTRACT

A method for evaluating a semiconductor film of a semiconductor device which is configured to include an insulating film, the semiconductor film, and a conductive film and to have a region where the semiconductor film and the conductive film overlap with each other with the insulating film provided therebetween, includes a step of performing plasma treatment after formation of the insulating film, and a step of calculating a peak value of resistivity of a microwave in the semiconductor film by a microwave photoconductive decay method after the plasma treatment, so that the hydrogen concentration in the semiconductor film is estimated.

16 Claims, 49 Drawing Sheets

(51) Int. Cl.
*H01J 37/32* (2006.01)
*C23C 14/08* (2006.01)
*C23C 14/58* (2006.01)

(52) U.S. Cl.
CPC ...... *C23C 14/5826* (2013.01); *C23C 14/5853* (2013.01); *H01J 37/32935* (2013.01); *H01J 37/32972* (2013.01); *H01L 22/12* (2013.01); *H01L 21/02554* (2013.01); *H01L 21/02565* (2013.01); *H01L 21/02631* (2013.01)

(58) Field of Classification Search
CPC ... H01L 21/02631; H01L 21/02; H01L 21/66; C23C 14/08; C23C 14/5806; C23C 14/5826; C23C 14/5853; H01J 37/32935; H01J 37/32972
USPC ........................................................ 438/104
See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,851,318 B2 | 12/2010 | Koyama et al. |
| 8,377,804 B2 | 2/2013 | Momo et al. |
| 8,481,393 B2 | 7/2013 | Koyama et al. |
| 8,513,046 B2 | 8/2013 | Hiura et al. |
| 8,551,810 B2 | 10/2013 | Yamazaki |
| 8,551,824 B2 | 10/2013 | Yamazaki et al. |
| 8,772,094 B2 | 7/2014 | Yamade et al. |
| 8,828,811 B2 | 9/2014 | Yamazaki |
| 8,865,534 B2 | 10/2014 | Yamazaki |
| 8,999,773 B2 | 4/2015 | Hanaoka et al. |
| 9,064,898 B2 | 6/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0115029 A1* | 5/2009 | Koyama ........... H01L 21/76254 257/632 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0263083 A1* | 10/2011 | Yamazaki ......... H01L 21/67017 438/161 |
| 2013/0244374 A1* | 9/2013 | Okazaki ........... H01L 29/78696 438/104 |
| 2014/0038351 A1 | 2/2014 | Yamazaki et al. |
| 2014/0370656 A1 | 12/2014 | Yamazaki |
| 2015/0093854 A1 | 4/2015 | Yamazaki |
| 2015/0214041 A1 | 7/2015 | Hanaoka et al. |
| 2015/0243768 A1 | 8/2015 | Yamazaki |
| 2015/0355095 A1* | 12/2015 | Hayashi ............. G01N 21/6489 250/459.1 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |

(56) References Cited

FOREIGN PATENT DOCUMENTS

| | | | | |
|---|---|---|---|---|
| JP | 08-264794 A | 10/1996 | | |
| JP | 11-505377 A | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2012-033857 A | 2/2012 | | |
| JP | 2014-019931 A | 2/2014 | | |
| JP | WO 2014112153 A1 | * | 7/2014 | ......... G01N 21/6489 |
| WO | WO-2004/114391 | 12/2004 | | |

OTHER PUBLICATIONS

Yasuno.S et al., "Transient photoconductivity responses in amorphous In—Ga—Zn—O films", J. Appl. Phys. (Journal of Applied Physics), Jan. 1, 2012, vol. 112, pp. 053715-1-053715-6.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer"Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Applications", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs"SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philospical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga —Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 5A
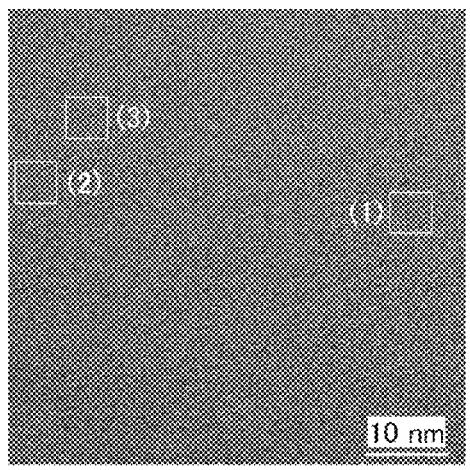
FIG. 5B  FIG. 5C  FIG. 5D
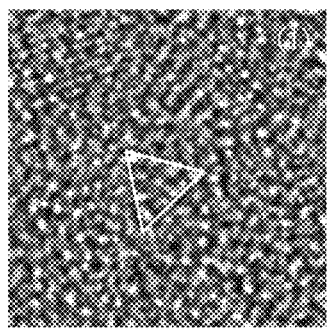 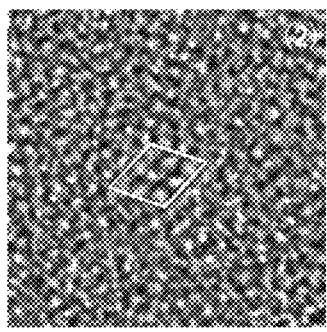 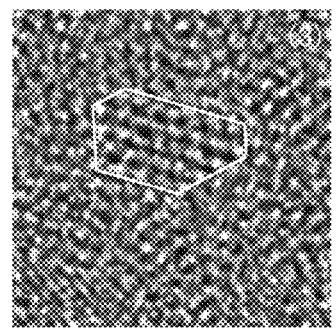

FIG. 31A1
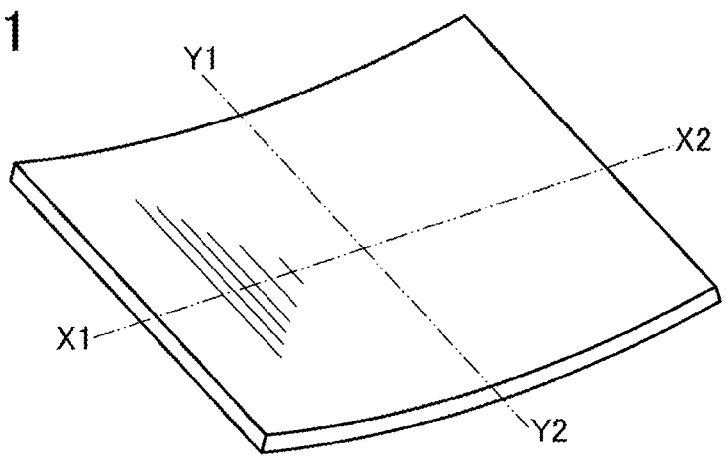
FIG. 31A2
FIG. 31A3
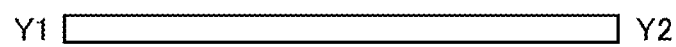
FIG. 31B1
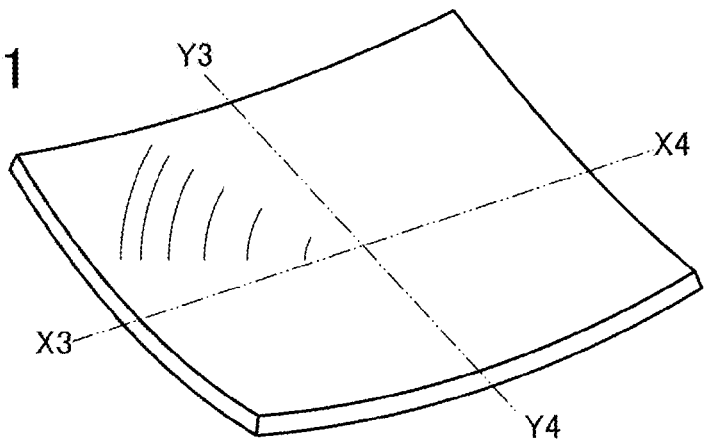
FIG. 31B2
FIG. 31B3

METHOD FOR EVALUATING SEMICONDUCTOR FILM AND METHOD FOR MANUFACTURING SEMICONDUCTOR DEVICE

BACKGROUND OF THE INVENTION

1. Field of the Invention

The present invention relates to, for example, an insulating film, a transistor, and a semiconductor device. The present invention relates to, for example, methods for evaluating an insulating film, a transistor, and a semiconductor device. The present invention relates to, for example, methods for manufacturing an insulating film, a transistor, and a semiconductor device. The present invention relates to, for example, an insulating film, a display device, a light-emitting device, a lighting device, a power storage device, a memory device, a processor, and an electronic device. The present invention relates to methods for manufacturing an insulating film, a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor film over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor film of a transistor, either amorphous silicon or polycrystalline silicon is used in accordance with the purpose. For example, in the case of a transistor included in a large display device, it is preferable to use amorphous silicon, which can be used to form a film on a large substrate with the established technique. In the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In addition, a transistor using an oxide semiconductor film is disclosed (see Patent Document 1). An oxide semiconductor film can be formed by a sputtering method or the like, and thus can be used for a semiconductor film of a transistor in a large display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

As a method for examining characteristics of an oxide semiconductor film performed under a condition without contact with the oxide semiconductor film (contactless method), a method in which the oxide semiconductor film is irradiated with excitation light and a microwave and a reflected wave of the microwave changing by irradiation of the excitation light is measured is disclosed (see Patent Document 2 and Patent Document 3). Patent Document 2 shows that in the case of an amorphous oxide semiconductor film, the penetration length (also called penetration depth) of excitation light with a wavelength of 349 nm is approximately 10 nm.

Non-Patent Document 1 discloses a relation between conductivity and spin densities measured by electron spin resonance (ESR) of an In—Ga—Zn oxide that is a typical oxide semiconductor. As a carrier source of the In—Ga—Zn oxide, defect states caused by oxygen vacancies and hydrogen are given.

REFERENCE

Patent Document

[Patent Document 1] Japanese Translation of PCT International Application No. H11-505377
[Patent Document 2] Japanese Published Patent Application No. 2012-033857
[Patent Document 3] Japanese Published Patent Application No. 2014-019931

Non-Patent Document

[Non-Patent Document 1] Y. Nonaka, et al.: Journal of Applied Physics 2014 vol. 115, 163707

SUMMARY OF THE INVENTION

An object is to provide a contactless method for examining characteristics of a semiconductor film. Another object is to provide a contactless method for examining characteristics of a wide-gap semiconductor film. Another object is to provide a contactless method for examining characteristics of an oxide semiconductor film. Another object is to provide a novel examination method. Another object is to provide a novel measurement method.

Another object is to provide a transistor including a semiconductor film with small in-plane variation. Another object is to provide a transistor including a semiconductor film with a low density of defect states. Another object is to provide a transistor with favorable electrical characteristics. Another object is to provide a transistor having stable electrical characteristics. Another object is to provide a transistor having low off-state current. Another object is to provide a semiconductor device including the transistor. Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Another object is to provide a method for examining distribution of the hydrogen concentration in a semiconductor film in a transistor.

Another object is to provide a transistor with a high yield. Another object is to provide a transistor with high productivity. Another object is to provide a transistor with low cost. Another object is to provide a semiconductor device including the transistor with high yield. Another object is to provide a semiconductor device including the transistor with high productivity. Another object is to provide a semiconductor device including the transistor with low cost.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for evaluating a semiconductor film in a semiconductor device. The semiconductor device includes an insulating film, a semiconductor film, and a conductive film. The semiconductor film has a region overlapping with the conductive film with the insulating film provided therebetween. Plasma treatment is performed after the insulating film is formed. After the plasma treatment, a peak value of resistivity of a microwave in the semiconductor film is calculated by a microwave photoconductive decay method, so that the hydrogen concentration in the semiconductor film is estimated.

According to the above evaluation method, in the microwave photoconductive decay method, excitation light with a wavelength less than or equal to 349 nm is used.

According to the above evaluation method, the semiconductor film includes an oxide containing one or more elements selected from indium, zinc, and an element M, and the element M is aluminum, gallium, yttrium, or tin.

Another embodiment of the present invention is a method for manufacturing a semiconductor device including a step of forming a semiconductor film, a step of forming an insulating film over the semiconductor film, a step of performing plasma treatment on the insulating film, and a step of forming a conductive film over the insulating film. The plasma treatment is performed for a period longer than or equal to 90 seconds and shorter than 180 seconds.

In the above manufacturing method, a gas containing oxygen is preferably used for the plasma treatment.

In the above manufacturing method, the semiconductor film includes an oxide containing one or more elements selected from indium, zinc, and an element M, and the element M is aluminum, gallium, yttrium, or tin.

A contactless method for examining characteristics of a semiconductor film can be provided. A contactless method for examining characteristics of a wide-gap semiconductor film can be provided. A contactless method for examining characteristics of an oxide semiconductor film can be provided. A novel examination method can be provided. A novel measurement method can be provided.

A transistor including a semiconductor film with a small in-plane variation can be provided. A transistor including a semiconductor film with a low density of defect states can be provided. A transistor with favorable electrical characteristics can be provided. A transistor having stable electrical characteristics can be provided. A transistor with high frequency characteristics can be provided. A transistor with low off-state current can be provided. A semiconductor device including the transistor can be provided. A module including the semiconductor device can be provided. An electronic device including the semiconductor device or the module can be provided. A novel semiconductor device can be provided. A novel module can be provided. A novel electronic device can be provided.

A method for examining the distribution of hydrogen concentration in a semiconductor film in a transistor can be provided.

A transistor can be manufactured with high yield. A transistor can be manufactured with high productivity. A transistor can be manufactured with low cost. A semiconductor device including the transistor can be manufactured with high yield. A semiconductor device including the transistor can be manufactured with high productivity. A semiconductor device including the transistor can be manufactured with low cost.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 5A to 5D are Cs-corrected high-resolution TEM images of a plane of a CAAC-OS.

FIGS. 31A1, 31A2, 31A3, 31B1, 31B2, and 31B3 are perspective views of semiconductor devices of one embodiment of the present invention.

DETAILED DESCRIPTION OF THE INVENTION

Figure 1A:
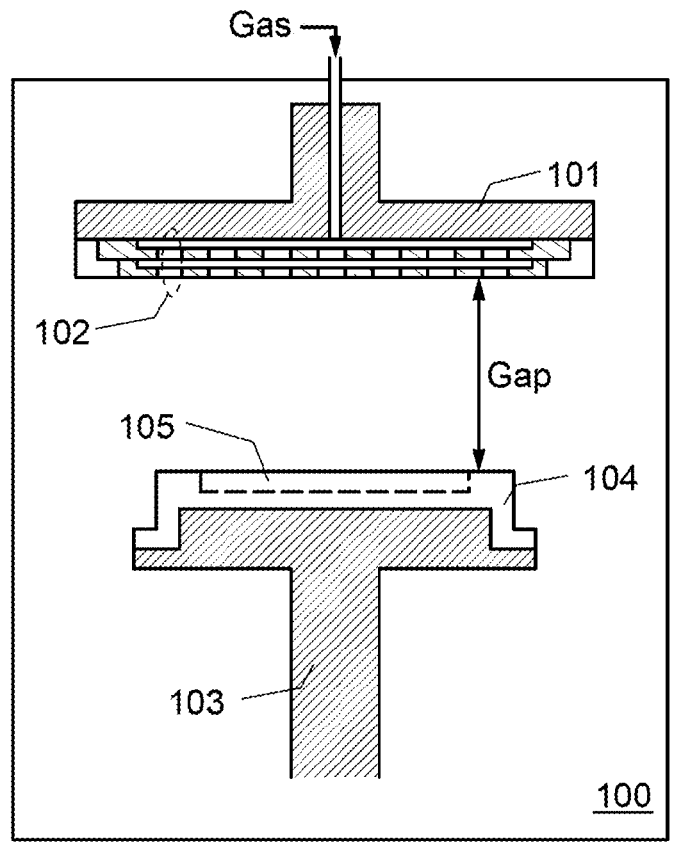
FIGS. 1A and 1B are schematic views partly showing an inside of a chamber of a deposition apparatus.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms "film" and "layer" can be interchanged with each other. Also, the term "insulator" can be changed into the term "insulating film (or insulating layer)" and vice versa. The term "conductor" can be changed into the term "conductive film (or conductive layer)" and vice versa. In addition, the term "semiconductor" can be changed into the term "semiconductor film (or semiconductor layer)" and vice versa.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

The channel length refers to, for example, a distance between a source (a source region or a source electrode) and a drain (a drain region or a drain electrode) in a region where a semiconductor film (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor film when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width, that is, the width of a source or a drain in a region where a semiconductor and a gate electrode overlap with each other, is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Method for Suppressing In-Plane Variation in Insulating Film>

A method for suppressing in-plane variation in an insulating film provided over a semiconductor film is described below.

In the case where an insulating film with large in-plane variation is formed over a semiconductor film, electrical characteristics of a transistor are affected. In particular, in the case where the semiconductor film is an oxide semiconductor film that is a wide-gap semiconductor, oxygen is added to the insulating film by plasma treatment, and oxygen is supplied from the insulating film to the oxide semiconductor film. When the insulating film is formed under high pressure, oxygen is easily supplied from the insulating film, and hydrogen is less likely to enter the insulating film. However, plasma is less likely to diffuse; accordingly, the plasma treatment in the plane of the insulating film is not performed uniformly. In such a case, the amount of oxygen supplied to the oxide semiconductor film varies, the density of oxygen vacancies in the oxide semiconductor film varies in the plane. Thus, in a region of the oxide semiconductor film where the amount of oxygen supplied from the insulating film is small, hydrogen in a site of oxygen vacancy (the hydrogen is also called VoH) cannot be substituted for oxygen, and the carrier density is increased, so that an abnormal shift of the threshold voltage of the transistor in the negative direction occurs.

In order to reduce in-plane variation in plasma treatment in deposition of the insulating film, it is necessary that the plasma be distributed sufficiently in the film. As a method for distribution of plasma widely in the entire film, an increase of the size of an upper electrode on the side through which a gas that is a material of the film comes can be given. However, in this case, a structure of a deposition apparatus has to be changed; a cost for the apparatus is caused.

Thus, a method for distribution of plasma in an entire film with use of the existing deposition apparatus is described.

<Deposition Apparatus>

First, a deposition apparatus is described with reference to drawings.

Figure 1B:
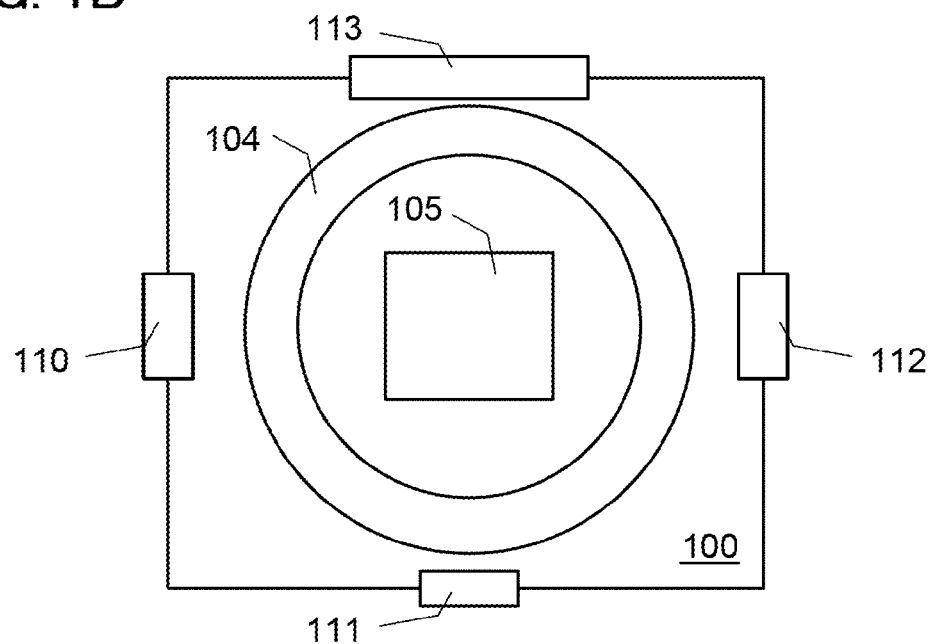

FIGS. 1A and 1B are schematic views partly illustrating an inside of a chamber of a plasma enhanced chemical vapor deposition (PECVD) apparatus that can be used as a deposition apparatus. FIG. 1A is a cross-sectional schematic view illustrating part of an inside of the chamber. FIG. 1B is a top schematic view illustrating part of an inside of the chamber. A chamber 100 of the apparatus in FIGS. 1A and 1B includes an upper electrode 101, a shower plate 102, a lower electrode 103, a support 104, a substrate 105, a window 110, a window 111, a window 112, and a gate valve 113.

The shower plate 102 has a two-layer structure for diffusing a gas uniformly, but the structure is not limited thereto. It may have a single-layer structure or a layered structure including three or more layers. In addition, the lower electrode 103 has a heater function for holding a temperature of the substrate 105.

A thin film is deposited in the following manner: a carrier gas is made to flow uniformly into the chamber 100 through the shower plate 102 from a pipe provided in the upper electrode 101; the substrate 105 over the support 104 is heated; a high-frequency power is applied between the upper electrode 101 and the lower electrode 103 which are provided to face each other; the carrier gas is made to be in a plasma state; a source gas flowing out uniformly from the pipe provided in the upper electrode 101 through the shower plate 102 is made to flow in the chamber, so that components of the source gas are precipitated on the substrate over the support 104.

In deposition of a film, a distance between a surface of the shower plate 102 and a surface of the support 104 (the distance is also called Gap) is adjusted by moving the lower electrode 103, so that a variation in plasma distribution can be suppressed. When Gap is large, the distribution of plasma varies widely. When Gap is small, the distribution of plasma less varies because distance from the substrate 105 is small. However, when a film is deposited over a semiconductor film with use of the PECVD apparatus, a peak value of resistivity of a microwave examined by a microwave photoconductive decay method becomes small in the entire semiconductor film.

The peak value of resistivity of microwave indicates a value that is a constant value when the rate of generation excessive carrier and the rate of disappearance of excessive carrier becomes equal to each other and saturated by absorption of laser light in the irradiated semiconductor film.

As illustrated in FIG. 1B, a side wall of the chamber 100 is provided with the window 110, the window 111, the window 112, and the gate valve 113. The windows 110 to 112 are insulators, and the gate valve 113 is a conductor; thus, there is a possibility that the distribution of plasma tilts toward the gate valve 113 that is a conductor, and a variation in plasma distribution is increased. As a countermeasure against this, conductors are provided in portions of the windows 110 to 112, whereby side walls of the chamber 100 are made of conductors. Thus, the plasma can be distributed uniformly.

The peak value of resistivity of microwave after the insulating film is deposited with use of the PECVD apparatus has a correlation with the amount of impurities such as hydrogen (including water, a hydrogen ion, a hydroxide ion, or the like) contained in the semiconductor film. Thus, by measurement of distribution of peak values of resistivity of microwave, the distribution of the amount of impurities such as hydrogen contained in the semiconductor film can be investigated.

<$NO_x$ and VoH>

When the content of nitrogen oxide (hereinafter, referred to as $NO_x$ (x is greater than 0 and less than or equal to 2, preferably greater than or equal to 1 and less than or equal to 2)) in the insulating film in contact with the semiconductor film is large, trap of carrier at the interface between the insulating film and the semiconductor film is increased, and the threshold voltage of the transistor largely shifts; accordingly a fluctuation of electrical characteristics of the transistor is increased. In other words, $NO_x$ in the insulating film serves as a defect. A defect derived from $NO_x$ can be measured as the spin density attributed to $NO_x$ in ESR measurement. In order to reduce the spin density attributed to $NO_x$, a reduction in thickness of the insulating film (i.e., shortening the deposition time) is effective. On the other hand, the spin density attributed to VoH in the semiconductor film is increased.

In order to reduce the spin density attributed to VoH in the semiconductor film as well as the spin density attributed to $NO_x$ in the insulating film, the amount of hydrogen in the semiconductor film needs to be decreased. In particular, in the case of using an oxide semiconductor film as the semiconductor film, the hydrogen concentration in the oxide semiconductor film is preferably lower than $7\times10^{19}$ atoms/cm$^3$, further preferably lower than $1\times10^{19}$ atoms/cm$^3$. In order to reduce the hydrogen concentration in the semiconductor film, oxygen is supplied to the insulating film, and the oxygen in the insulating film is supplied to the semiconductor film in contact with the insulating film, so that the supplied oxygen is bonded with hydrogen in the semiconductor film to be water. Then, heat treatment is performed. In the above manner, hydrogen (or water) in the semiconductor film can be released to the outside.

As a method for supplying oxygen to the insulating film, performance of plasma treatment after deposition of the insulating film is effective. Examples of plasma treatment include oxygen plasma treatment and nitrous oxide plasma treatment, and particularly, oxygen plasma treatment is preferably performed. When the plasma treatment is performed for a long period, the spin density attributed to VoH in the semiconductor film can be further reduced. In contrast, when the oxygen plasma treatment is performed for a long period, the spin density attributed to $NO_x$ in the insulating film is increased. Thus, the time period for plasma treatment is preferably longer than or equal to 90 seconds and shorter than 180 seconds. Instead of plasma treatment, an ion injection method, an ion doping method, a plasma immersion ion implantation method, or the like may be used to supply oxygen into the insulating film.

<Microwave Photoconductive Decay Method>

A microwave photoconductive decay method is described with reference to drawings.

Figure 2:
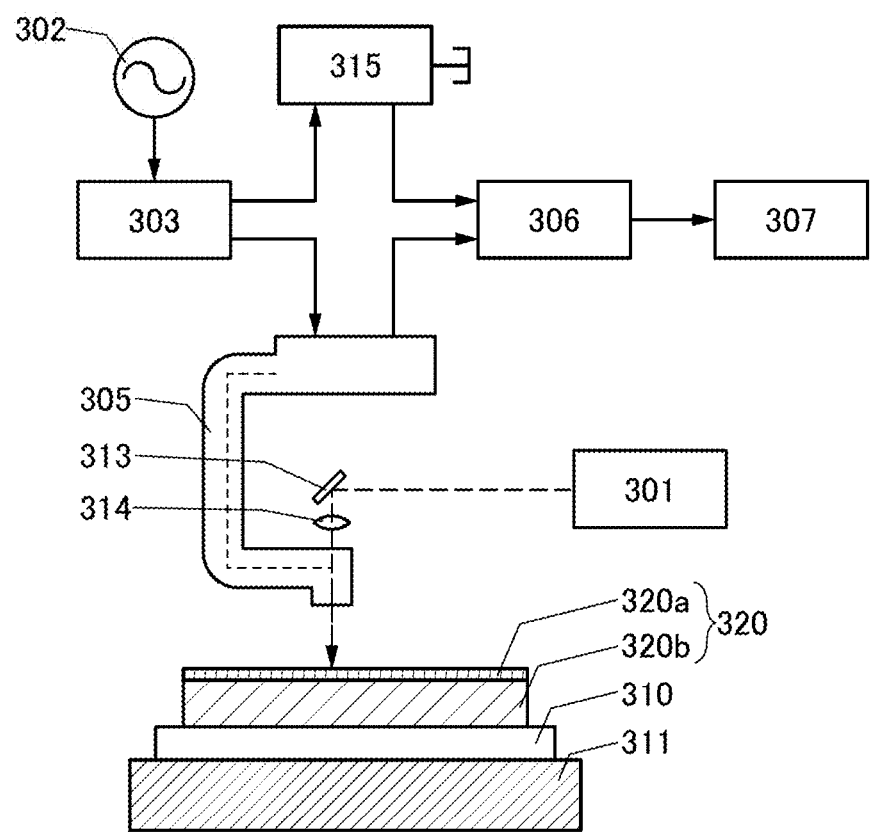
FIG. 2 is a schematic view of an apparatus used for examination with a microwave photoconductive decay method.

FIG. 2 is a schematic view illustrating an example of an apparatus used in a microwave photoconductive decay method. The apparatus illustrated in FIG. 2 is preferably used for evaluation of a thin wide-gap semiconductor film. In particular, the apparatus is preferably used for evaluation of a wide-gap semiconductor with a thickness greater than or equal to 1 nm and less than or equal to 1 μm, greater than or equal to 2 nm and less than or equal to 500 nm, greater than or equal to 3 nm and less than or equal to 200 nm, or greater than or equal to 5 nm and less than or equal to 100 nm, which is used for a semiconductor in a transistor.

The apparatus illustrated in FIG. 2 includes a pulsed laser oscillator 301, a microwave oscillator 302, a directional coupler 303, a waveguide 305, a mixer 306, a signal processing device 307, and a sample stage 311. In FIG. 2, the waveguide 305 has corner portions with curvature, but the shape thereof is not limited thereto. A sample 320 can be located over the sample stage 311. The sample 320 includes, for example, a substrate 320b and a semiconductor film 320a that is over the substrate 320b.

A conductor is arranged on a top surface of the sample stage 311. The conductor may be formed to have a single-layer structure or a stacked structure using a conductor containing, for example, one or more of boron, nitrogen, oxygen, fluorine, silicon, phosphorus, aluminum, titanium, chromium, manganese, iron, cobalt, nickel, copper, zinc, gallium, yttrium, zirconium, molybdenum, ruthenium, silver, indium, tin, tantalum, and tungsten. An alloy or a compound of stainless steel and the like may be used, for example, and a conductor containing aluminum, a conductor containing copper and titanium, a conductor containing copper and manganese, a conductor containing indium, tin, and oxygen, a conductor containing titanium and nitrogen, or the like may be used.

Note that a spacer 310 may be provided between the sample 320 and the sample stage 311. The spacer 310 may be formed to have, for example, a single-layer structure or a stacked structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The spacer 310 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The thickness of the spacer 310 may be adjusted so that the distance between a top surface of the semiconductor film 320a and a top surface of the sample stage 311 is approximately one fourth of the wavelength of microwave at the substrate 320b and the spacer 310. Arrangement of the spacer 310 enables the evaluation to be performed when the sample 320 is placed upside down. When the sample 320 is placed upside down, for example, data including an influence of an interface between the substrate 320b and the semiconductor film 320a can be obtained in some cases.

A method for evaluating the semiconductor film 320a by a microwave photoconductive decay method is described below.

First, a microwave is emitted from the microwave oscillator 302. The emitted microwave is specifically called traveling wave (also referred to as incident wave). The wave traveling through the directional coupler 303 is divided into two: one passes through the waveguide 305, and the other passes through a phase shifter 315. The traveling wave through the waveguide 305 enters the sample 320. At this time, a microwave reflected at the semiconductor film 320a in the sample 320 (the microwave is specifically called reflected wave) enters the waveguide 305 again. In the mixer 306, the reflected wave is combined with the other traveling wave passing through the phase shifter 315. The combined signal is detected in the signal processing device 307.

The intensity of signal detected in the signal processing device 307 changes and depends on the reflectivity of the microwave at the semiconductor film 320a. For example, the higher the carrier density of excessive carriers injected by light irradiation in the semiconductor film 320a is, the higher the reflectivity of the microwave is.

In the semiconductor film 320a, holes and electrons are generated by absorption of excitation light. In other words, the semiconductor film 320a is irradiated with the excitation light, whereby the carrier density of the semiconductor film 320a is increased. The excitation light may be incident on the semiconductor film 320a through a mirror 313 and a lens 314.

The reflectivity of microwave has a positive correlation with the carrier density. Accordingly, when the semiconductor film 320a is irradiated with excitation light, the reflectivity of microwave at the semiconductor film 320a becomes high. In the case where the irradiation of the semiconductor film 320a with excitation light continues for a certain amount of time, the reflectivity of microwave has a fixed value depending on a balance between carrier generation by excitation light and carrier disappearance by recombination or the like. This value is the highest value of the reflectivity of microwave and can be called a peak value of reflectivity. The peak value of reflectivity depends on the density of defect states of the semiconductor film 320a and changes in some cases. Specifically, when the density of defect states of the semiconductor film 320a is high, the peak value of reflectivity is low. When the shallow density of defect states of the semiconductor film 320a is low, the peak value of reflectivity is high. This is because the defect states are considered to promote the disappearance of carrier.

For example, as the excitation light, laser light emitted from the pulsed laser oscillator 301 can be used. The laser light preferably has a wavelength of energy that is sufficiently higher than an energy gap of the semiconductor film 320a. In particular, it is preferable to use laser light whose depth of penetration into the semiconductor film 320a is less than 250 nm, less than 100 nm, less than 70 nm, or less than 50 nm. For example, laser light with a wavelength less than or equal to 349 nm, less than 337 nm, less than 315 nm, less than 300 nm, or less than 270 nm may be used. Furthermore, in order to suppress an increase of cost of an optical system, the wavelength of laser light is preferably greater than or equal to 200 nm. However, it is possible to use laser light whose wavelength is less than 200 nm. Note that a fourth harmonic has a wavelength of 266 nm, which is included in a laser using yttrium lithium fluoride to which neodymium is added for a laser medium (the laser is also referred to as YLF laser). The traveling length of light corresponds to a depth where the light intensity attenuates to 1/e, which can be represented by the following formula.

$$d = \frac{\lambda}{4\pi k} \qquad \text{[Formula 1]}$$

Here, d indicates the traveling length [nm], λ indicates the wavelength [nm], and k indicates the attenuation coefficient.

For example, in the case where laser light with a wavelength of energy that is sufficiently higher than an energy gap of the semiconductor film 320a is not used, it is necessary that an output of laser light be increased to some extent in order to improve the detection sensitivity. Thus, quality of the semiconductor film 320a is changed in some cases. With use of laser light with a wavelength that is sufficiently higher than an energy gap of the semiconductor film 320a, the carrier density of the semiconductor film 320a can be sufficiently high even in the case where an output of laser light is small. Therefore, a change in quality of the semiconductor film 320a described above can be suppressed.

Furthermore, with use of laser light whose depth of penetration into the semiconductor film 320a is shallow, data on a base such as the substrate 320b can be prevented from being reflected in measurement results. In addition, the use of the laser light can suppress, in the measurement result, generation of unevenness which is caused by an interference effect and depends on the thickness of the semiconductor film 320a.

When irradiation of the semiconductor film 320a with the excitation light is stopped, generation of carrier is stopped, and the carrier density of the semiconductor film 320a becomes decreased. In other words, the reflectivity of microwave becomes low. Note that the reflectivity of microwave has a positive correlation with the carrier density, and accordingly, the lifetime of carrier in the semiconductor film 320a can be measured. The lifetime of carrier can be divided into two types from the peak value of the reflectivity of microwave: an element attenuating rapidly (also referred to as τ1); and an element attenuating gently (also referred to as τ2). For a method for calculating τ1 and τ2 with a microwave photoconductive decay method, the description in a paper (S. Yasuno, et al.: Journal of Applied Physics 2012 vol. 112, 053715) is referred to.

As described above, the semiconductor film 320a can be evaluated by a microwave photoconductive decay method. By a shift of the sample stage 311 in X direction and Y direction, a plurality of portions in a plane of the substrate 320b can be examined.

Figure 3:
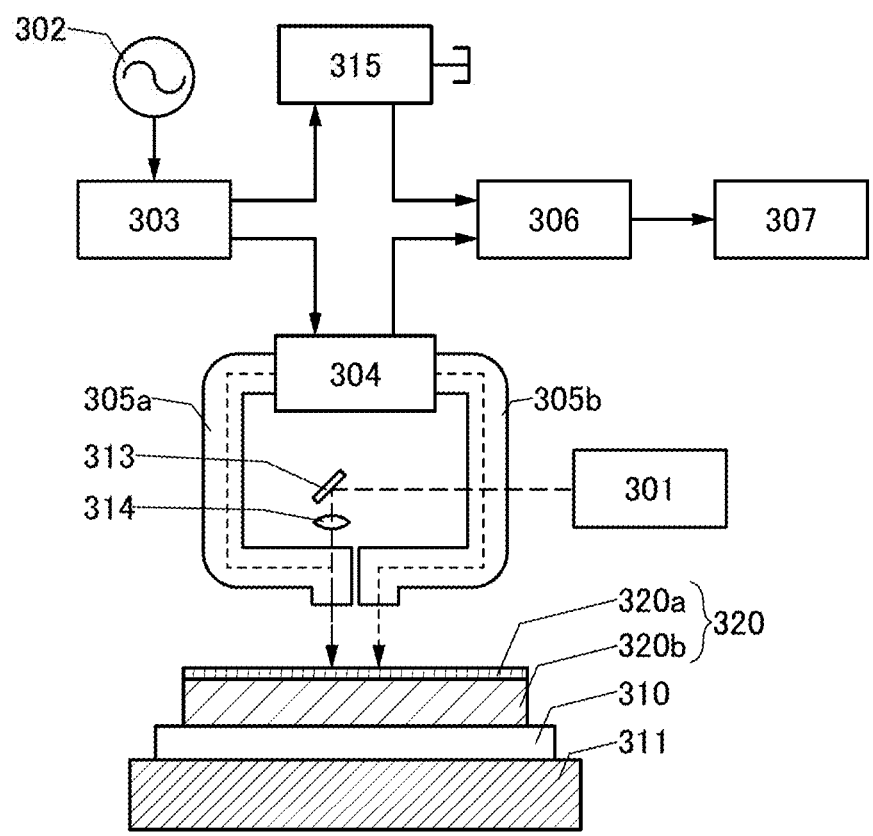
FIG. 3 is a schematic view of an apparatus used for examination with a microwave photoconductive decay method.

It is possible to employ an apparatus including two waveguides (the waveguide 305*a* and the waveguide 305*b*) and a T-shape waveguide 304 as illustrated in FIG. 3. It is preferable that the waveguide 305*a* and the waveguide 305*b* have symmetry. Alternatively, it is preferable that path lengths of microwave of the waveguide 305*a* and the waveguide 305*b* be same. In FIG. 3, the waveguide 305*a* and the waveguide 305*b* have corner portions with curvature, but the shapes thereof are not limited thereto.

In the case of using the apparatus illustrated in FIG. 3, a microwave is emitted from the microwave oscillator 302. The wave traveling through the directional coupler 303 is divided into two: one passes through the T-shape waveguide 304, and the other passes through the phase shifter 315. Through the T-shape waveguide 304, the traveling wave is divided into two: one passes through the waveguide 305*a*, and the other passes through the waveguide 305*b*. The traveling wave through the waveguide 305*a* is incident on the sample 320 with excitation light. The traveling light through the waveguide 305*b* is directly incident on the sample 320. The microwave reflected at the semiconductor film 320*a* in the sample 320 enters the T-shape waveguide 304 again through the waveguide 305*a* and the waveguide 305*b*. The reflected wave through the waveguide 305*a* and the reflected wave through the waveguide 305*b* are joined in the T-shape waveguide 304, and then the T-shape waveguide 304 outputs the signal of the joined wave. After that, in the mixer 306, the wave is combined with the traveling wave passing through the phase shifter 315. The combined signal is detected in the signal processing device 307.

The reflected wave through the waveguide 305*b* includes noise derived from the microwave oscillator 302, disturbance caused by mechanical frequency, and the like at the same level as the reflected wave through the waveguide 305*a*. Thus, the reflected waves are combined to obtain a signal of the joined wave, whereby the influence by the noise can be reduced. Therefore, with use of the apparatus illustrated in FIG. 3, a change in reflectivity of the microwave due to excitation light can be detected with high sensitivity.

<Wide-Gap Semiconductor>

A wide-gap semiconductor has a lager energy gap than silicon or the like. Specifically, the wide-gap semiconductor indicates a semiconductor whose energy gap is greater than or equal to 2 eV and less than or equal to 5 eV, greater than or equal to 2.2 eV and less than or equal to 4.6 eV, particularly greater than or equal to 2.5 eV and less than or equal to 4.0 eV.

In the case of wide-gap semiconductor, due to a large energy gap, the penetration depth of laser light with a wavelength of 349 nm, which has been used for silicon, becomes large in a microwave photoconductive decay method. Thus, the above-described defect occurs in some cases. In a wide-gap semiconductor with low density of defect states, particularly, the penetration depth of laser light may become much larger than that which has been conventionally assumed.

For example, as a typical wide-gap semiconductor, an oxide semiconductor can be given. A structure of an oxide semiconductor, and the like are described below.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 4A:
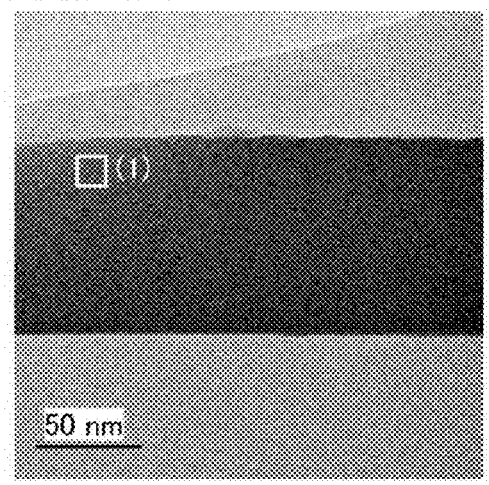
FIGS. 4A to 4C are Cs-corrected high-resolution TEM images of a cross section of a CAAC-OS.

The CAAC-OS observed with a TEM is described below. FIG. 4A shows an example of a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 4B:
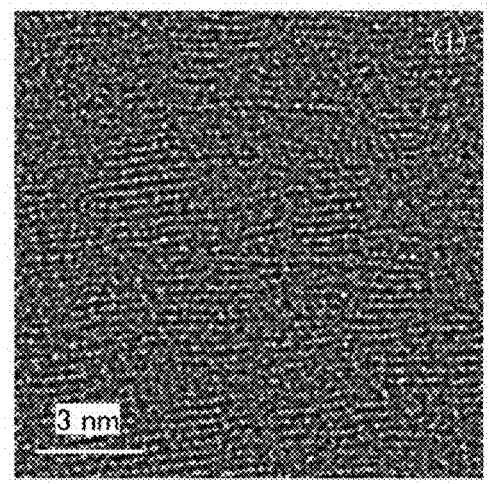

FIG. 4B is an enlarged Cs-corrected high-resolution TEM image of a region (1) in FIG. 4A. FIG. 4B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 4C:
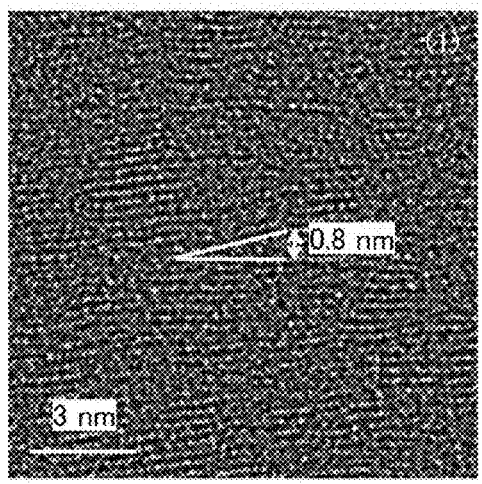

As shown in FIG. 4B, the CAAC-OS film has a characteristic atomic arrangement. The characteristic atomic arrangement is denoted by an auxiliary line in FIG. 4C. FIGS. 4B and 4C prove that the size of a pellet is approximately 1 nm to 3 nm, and the size of a space caused by tilt of the pellets is approximately 0.8 nm. Therefore, the pellet can also be referred to as a nanocrystal (nc).

Figure 4D:
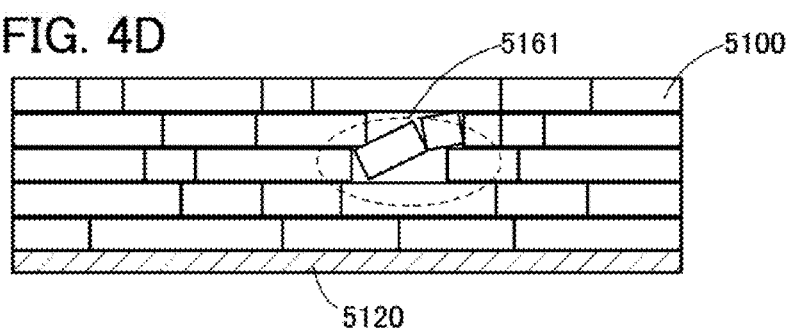
FIG. 4D is a cross-sectional schematic view of a CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 4D). The part in which the pellets are tilted as observed in FIG. 4C corresponds to a region 5161 shown in FIG. 4D.

FIG. 5A shows a Cs-corrected high-resolution TEM image of a plane of the CAAC-OS observed from a direction substantially perpendicular to the sample surface. FIGS. 5B, 5C, and 5D are enlarged Cs-corrected high-resolution TEM images of regions (1), (2), and (3) in FIG. 5A, respectively. FIGS. 5B, 5C, and 5D indicate that metal atoms are arranged in a triangular, quadrangular, or hexagonal configuration in a pellet. However, there is no regularity of arrangement of metal atoms between different pellets.

Figure 6A:
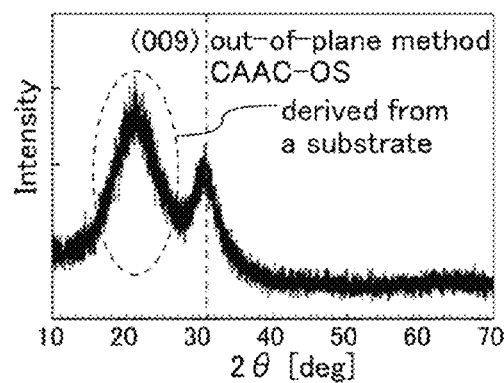
FIGS. 6A to 6C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 6A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 6B:
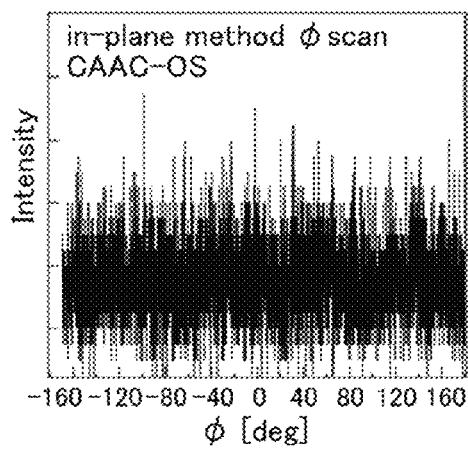
Figure 6C:
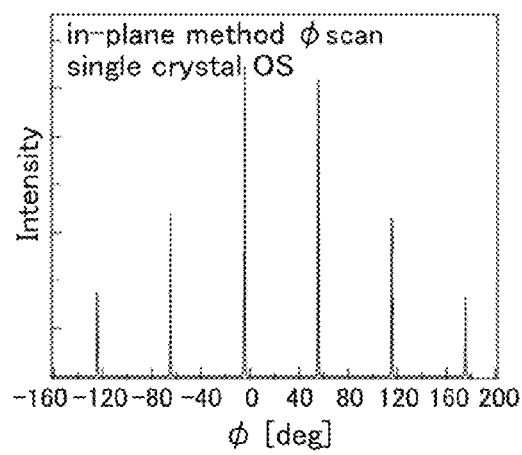

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at 56° and with the sample rotated about a normal vector of the sample surface as an axis (φ axis), as shown in FIG. 6B, a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed (see FIG. 6C). Accordingly, the structural analysis using XRD shows that the directions of a-axes and b-axes are irregularly orientated in the CAAC-OS.

Figure 7A:
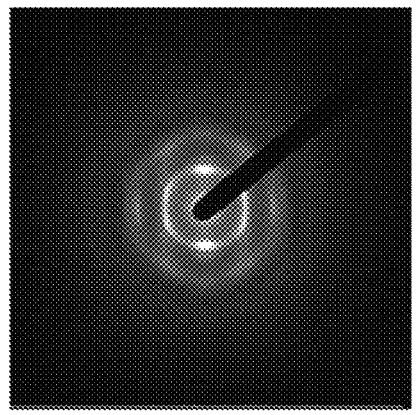
FIGS. 7A and 7B show electron diffraction patterns of a CAAC-OS.
Figure 7B:
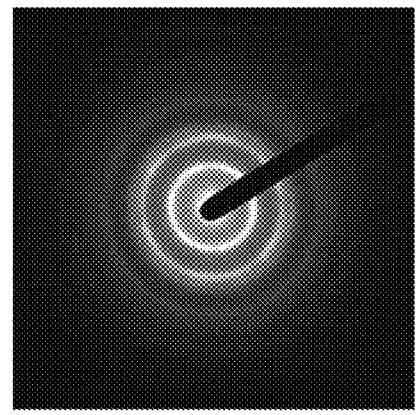

Next, a CAAC-OS analyzed by electron diffraction is described. For example, when an electron beam with a probe diameter of 300 nm is incident on a CAAC-OS film including an InGaZnO$_4$ crystal in a direction parallel to the sample surface, a diffraction pattern (also referred to as a selected-area transmission electron diffraction pattern) shown in FIG. 7A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 7B shows a diffraction pattern obtained in such a manner that an electron beam with a probe diameter of 300 nm is incident on the same sample in a direction perpendicular to the sample surface. As shown in FIG. 7B, a ring-like diffraction pattern is observed. Thus, the electron diffraction also indicates that the a-axes and b-axes of the pellets included in the CAAC-OS do not have regular alignment. The first ring in FIG. 7B is considered to be derived from the (010) plane, the (100) plane, and the like of the InGaZnO$_4$ crystal. The second ring in FIG. 7B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small amount of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. A charge trapped by the carrier traps in the oxide semiconductor takes a long time to be released. The trapped charge may behave like a fixed charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS film, a crystal grain boundary is not always found clearly. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed.

Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-Like Oxide Semiconductor Layer>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 8:
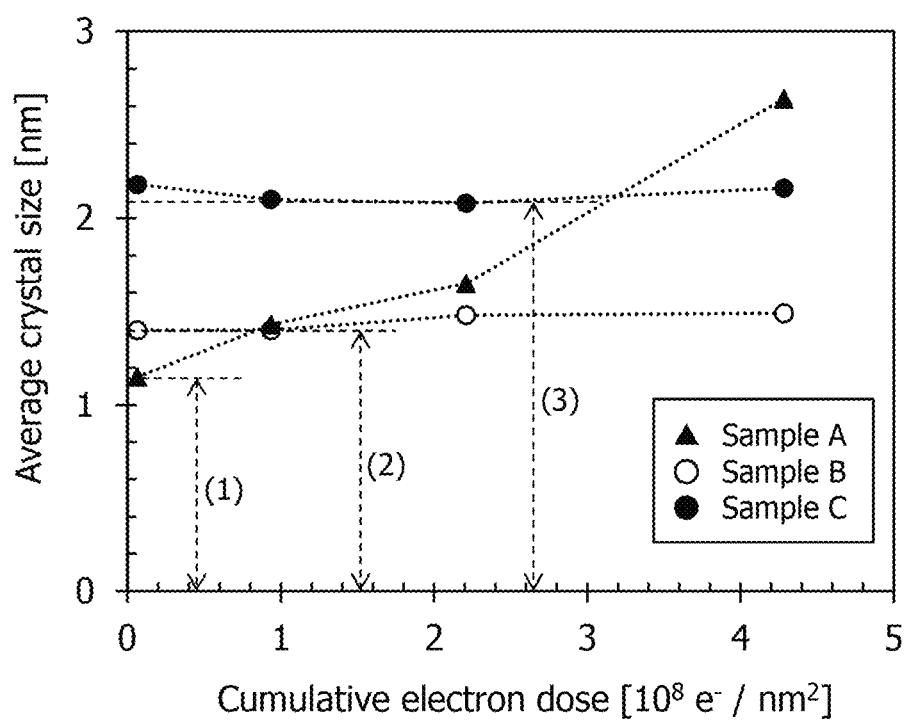
FIG. 8 shows a change in the crystal part of an In—Ga—Zn oxide induced by electron irradiation.

FIG. 8 shows change in the average size of crystal parts (at 22 points to 45 points) in each sample. Note that the crystal part size corresponds to the length of a lattice fringe. FIG. 8 indicates that the crystal part size in the a-like OS (sample A) increases with an increase in the cumulative electron dose. Specifically, as shown by (1) in FIG. 8, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS (sample B) and the CAAC-OS (sample C) shows little change from the start of electron irradiation to a cumulative electron dose of $4.2\times10^8$ e$^-$/nm$^2$. Specifically, as shown by (2) and (3) in FIG. 8, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

The above is the description of the oxide semiconductor.

<Transistor>

A transistor of one embodiment of the present invention is described below.

<Structure of Transistor>

Figure 9A:
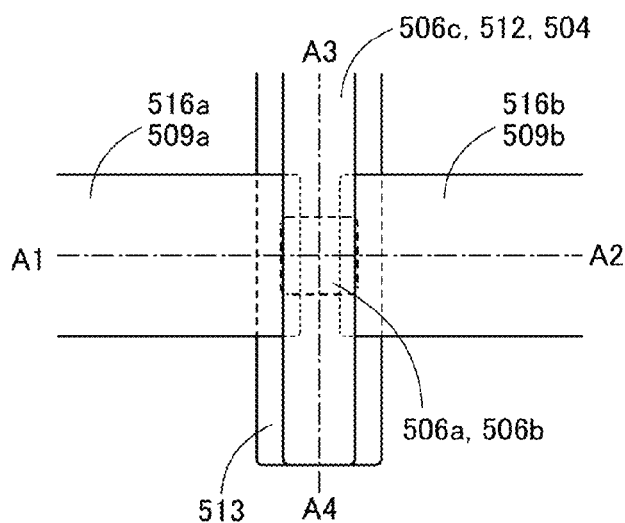
FIGS. 9A and 9B are a top view and a cross-sectional view illustrating a transistor of one embodiment of the present invention.
Figure 9B:
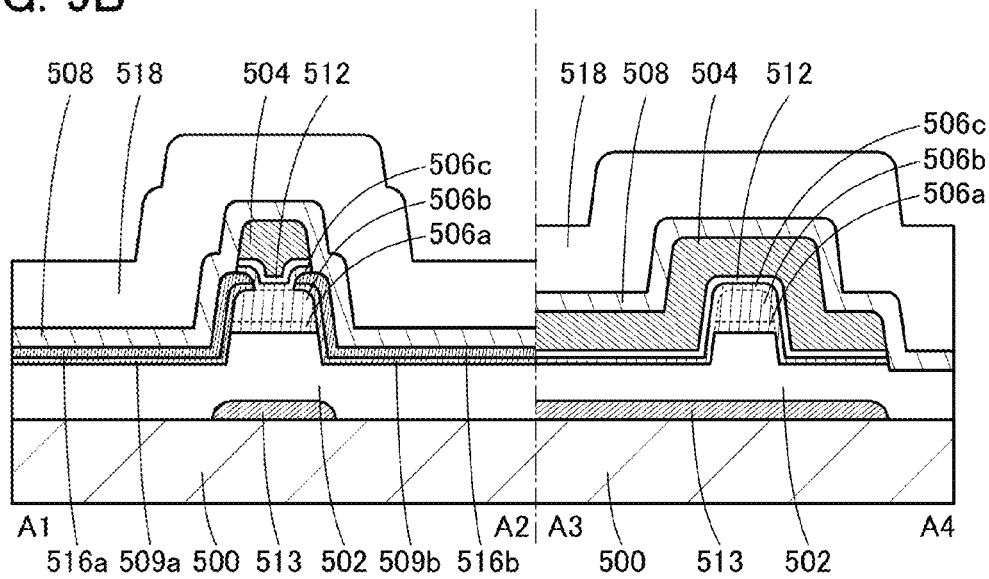

FIGS. 9A and 9B are a top view and a cross-sectional view of a transistor of one embodiment of the present invention. FIG. 9A is a top view and FIG. 9B is a cross-sectional view taken along dashed-dotted line A1-A2 and dashed-dotted line A3-A4 in FIG. 9A. Note that for simplification of the drawing, some components in the top view in FIG. 9A are not illustrated.

The transistor illustrated in FIGS. 9A and 9B includes a conductive film 513 over a substrate 500, an insulating film 502 having a projection over the substrate 500 and the conductive film 513, a semiconductor film 506a over the projection of the insulating film 502, a semiconductor film 506b over the semiconductor film 506a, a layer 509a and a layer 509b that are in contact with a top surface and side surfaces of the semiconductor film 506b and located to be apart from each other, a conductive film 516a over the layer 509a, a conductive film 516b over the layer 509b, a semiconductor film 506c over the semiconductor film 506b, the layer 509a, the layer 509b, the conductive film 516a, and the conductive film 516b, an insulating film 512 over the semiconductor film 506c, a conductive film 504 over the insulating film 512, an insulating film 508 over the conductive film 516a, the conductive film 516b, and the conductive film 504, and an insulating film 518 over the insulating film 508. Although the conductive film 513 is part of the transistor in this case, a transistor structure of one embodiment of the present invention is not limited thereto. For example, the conductive film 513 may be a component independent of the transistor.

Note that the semiconductor film 506c is in contact with at least a top surface and a side surface of the semiconductor film 506b in the cross section taken along dashed-dotted line A3-A4. Furthermore, the conductive film 504 faces the top surface and the side surface of the semiconductor film 506b with the semiconductor film 506c and the insulating film 512 provided therebetween in the cross section taken along dashed-dotted line A3-A4. The conductive film 513 faces a bottom surface of the semiconductor film 506b with the insulating film 502 provided therebetween. Note that the insulating film 502 does not necessarily include a projection. The conductive film 513 is not necessarily provided. The semiconductor film 506a is not necessarily provided. The semiconductor film 506c is not necessarily provided. The insulating film 508 is not necessarily provided. The insulating film 518 is not necessarily provided. The layer 509a is not necessarily provided. The layer 509b is not necessarily provided.

The semiconductor film 506b serves as a channel formation region of the transistor. The conductive film 504 serves as a first gate electrode (also referred to as a front gate electrode) of the transistor. The conductive film 513 serves as a second gate electrode (also referred to as a back gate electrode) of the transistor. The conductive film 516a and the conductive film 516b serve as a source electrode and a drain electrode of the transistor. The insulating film 508 functions as a barrier layer. The insulating film 508 has, for example, a function of blocking oxygen and/or hydrogen. Alternatively, the insulating film 508 has, for example, a higher capability of blocking oxygen and/or hydrogen than the semiconductor film 506a and/or the semiconductor film 506c.

The insulating film 502 is preferably an insulating film containing excess oxygen.

An insulating film containing excess oxygen means an insulating film from which oxygen is released by heat treatment, for example. Silicon oxide containing excess oxygen means silicon oxide from which oxygen can be released by heat treatment or the like, for example. Therefore, the insulating film 502 is an insulator in which oxygen can be moved. In other words, the insulating film 502 may be an insulating film having an oxygen-transmitting property. For example, the insulating film 502 may be an insulating film having a higher oxygen-transmitting property than the semiconductor film 506a.

The insulating film containing excess oxygen has a function of reducing oxygen vacancies in the semiconductor film 506b in some cases. Such an oxygen vacancy forms DOS in the semiconductor film 506b and serves as a hole trap or the like. In addition, hydrogen comes into the site of such an oxygen vacancy and forms an electron serving as a carrier. Therefore, by reducing the oxygen vacancy in the semiconductor film 506b, the transistor can have stable electrical characteristics.

Here, an insulating film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in the range of a surface temperature higher than or equal to 100° C. and lower than or equal to 700° C. or higher than or equal to 100° C. and lower than or equal to 500° C.

Here, the method for measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O_2} = \frac{N_{H_2}}{S_{H_2}} \times S_{O_2} \times \alpha \qquad \text{[Formula 2]}$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1 \times 10^{16}$ atoms/cm$^2$ as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulating film from which oxygen is released by heat treatment may contain a peroxide radical. Specifically, the spin density attributed to the peroxide radical is greater than or equal to $5 \times 10^{17}$ spins/cm$^3$. Note that the insulating film containing a peroxide radical may have an asymmetric signal with a g factor of approximately 2.01 in ESR.

The insulating film containing excess oxygen may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 9B, the side surfaces of the semiconductor film 506b are in contact with the layer 509a and the layer 509b. The semiconductor film 506b can be electrically surrounded by an electric field of the conductive film 504 (a structure in which a semiconductor film is electrically surrounded by an electric field of a conductive film is referred to as a surrounded channel (s-channel) structure). Therefore, a channel is formed in the entire semiconductor film 506b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

For example, by applying a lower voltage or a higher voltage than a source electrode to the conductive film 513, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductive film 513 may be variable or fixed. When the voltage applied to the conductive film 513 is a variable, a circuit for controlling the voltage may be electrically connected to the conductive film 513.

Next, a semiconductor film which can be used as the semiconductor film 506a, the semiconductor film 506b, the semiconductor film 506c, or the like is described below. Note that for the semiconductor film 506a, the semiconductor film 506b, the semiconductor film 506c, or the like, a wide-gap semiconductor film may be used.

The semiconductor film 506b is an oxide semiconductor containing indium, for example. The semiconductor film 506b can have high carrier mobility (electron mobility) by containing indium, for example. The semiconductor film 506b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor film 506b preferably contains zinc. When the oxide semiconductor contains zinc, the oxide semiconductor is easily to be crystallized, for example.

Note that the semiconductor film 506b is not limited to the oxide semiconductor containing indium. The semiconductor film 506b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor film 506b, an oxide with a wide energy gap is used. For example, the energy gap of the semiconductor film 506b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor film 506a and the semiconductor film 506c are oxide semiconductors including one or more, or two or more elements other than oxygen included in the semiconductor film 506b. Since the semiconductor film 506a and the semiconductor film 506c each include one or more elements, or two or more elements other than oxygen included in the semiconductor film 506b, a defect state is less likely to be formed at the interface between the semiconductor film 506a and the semiconductor film 506b and the interface between the semiconductor film 506b and the semiconductor film 506c.

The semiconductor film 506a, the semiconductor film 506b, and the semiconductor film 506c preferably contain at least indium. In the case of using an In-M-Zn oxide as the semiconductor film 506a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor film 506b, when a summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor film 506c, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor film 506c may be an oxide that is a type the same as that of the semiconductor film 506a. Note that the semiconductor film 506a and/or the semiconductor film 506c do/does not necessarily contain indium in some cases. For example, the semiconductor film 506a and/or the semiconductor film 506c may be gallium oxide. Note that the atomic ratios of the elements included in the semiconductor film 506a, the semiconductor film 506b, the semiconductor film 506c are not necessarily simple ratios of integers.

As the semiconductor film 506b, an oxide having an electron affinity higher than those of the semiconductor film 506a and the semiconductor film 506c is used. For example, as the semiconductor film 506b, an oxide having an electron affinity higher than those of the semiconductor film 506a and the semiconductor film 506c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor film 506c preferably includes an indium gallium oxide. The gallium atomic ratio [Ga/(In+Ga)] is, for example, higher than or equal to 70%, preferably higher than or equal to 80%, further preferably higher than or equal to 90%.

When a gate voltage is applied, a channel is formed in the semiconductor film 506b having an electron affinity higher than those of the semiconductor film 506a and the semiconductor film 506c.

Here, in some cases, a region where the semiconductor film 506a and the semiconductor film 506b are mixed is provided between the semiconductor film 506a and the semiconductor film 506b. In addition, a region where the semiconductor film 506b and the semiconductor film 506c are mixed is formed between the semiconductor film 506b and the semiconductor film 506c in some cases. The mixed region has a low density of defect states. For that reason, the stack including the semiconductor film 506a, the semiconductor film 506b, and the semiconductor film 506c has a band structure where energy at each interface and in the vicinity of the interface is changed continuously (continuous junction).

At this time, electrons move mainly in the semiconductor film 506b, not in the semiconductor film 506a and the semiconductor film 506c. As described above, when the density of defect states at the interface between the semiconductor film 506a and the semiconductor film 506b and the density of defect states at the interface between the semiconductor film 506b and the semiconductor film 506c are decreased, electron movement in the semiconductor film 506b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 µm×1 µm of a top surface or a bottom surface of the semiconductor film 506b (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the oxide semiconductor film 506b contains oxygen vacancies (also denoted by Vo), donor levels are formed by entry of hydrogen into sites of oxygen vacancies in some cases. A state in which hydrogen enters oxygen vacancy sites is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor film 506b, the on-state current of the transistor can be increased in some cases.

Furthermore, in the case where the density of defect states is high in a region where a channel is formed, electrical characteristics of the transistor vary in some cases. For example, in the case where the defect states serve as carrier generation sources, the threshold voltage of the transistor might vary.

To decrease oxygen vacancies in the semiconductor film 506b, for example, there is a method in which excess oxygen in the insulating film 502 is moved to the semiconductor film 506b through the semiconductor film 506a. In this case, the semiconductor film 506a is preferably a layer having an oxygen-transmitting property (a layer through which oxygen passes or is transmitted).

The density of defect states in the oxide semiconductor can be examined by a microwave photoconductive decay method or ESR, for example. In the oxide semiconductor including defect states, for example, the peak value of reflectivity of microwave observed by a microwave photoconductive decay method is lowered in some cases. In ESR, a signal appears at g factor greater than or equal to 1.89 and less than or equal to 1.96 (typically 1.93 or 1.94), in some cases.

In the case where the transistor has the s-channel structure mentioned above, a channel is formed in the whole of the semiconductor film 506b. Therefore, as the semiconductor film 506b has a larger thickness, a channel region becomes larger. In other words, the thicker the semiconductor film 506b is, the larger the on-state current of the transistor is. For example, the semiconductor film 506b has a region with a thickness greater than or equal to 10 nm, preferably greater than or equal to 20 nm, further preferably greater than or equal to 40 nm, still further preferably greater than or equal to 60 nm, yet further preferably greater than or equal to 100 nm. Note that the semiconductor film 506b has a region with a thickness, for example, less than or equal to 300 nm, preferably less than or equal to 200 nm, or further preferably less than or equal to 150 nm because the productivity of the semiconductor device might be decreased. In some cases, when the channel formation region is reduced in size, electrical characteristics of the transistor with a smaller thickness of the semiconductor film 506b may be improved. Therefore, the semiconductor film 506b may have a thickness less than 10 nm.

Moreover, the thickness of the semiconductor film 506c is preferably as small as possible to increase the on-state current of the transistor. For example, the semiconductor film 506c has a region with a thickness less than 10 nm, preferably less than or equal to 5 nm, or further preferably less than or equal to 3 nm, for example. Meanwhile, the semiconductor film 506c has a function of blocking entry of elements other than oxygen (such as hydrogen and silicon) included in the adjacent insulating film into the semiconductor film 506b where a channel is formed. For this reason, it is preferable that the semiconductor film 506c have a certain thickness. For example, the semiconductor film 506c has a region with a thickness greater than or equal to 0.3 nm, preferably greater than or equal to 1 nm, further preferably greater than or equal to 2 nm, for example. The semiconductor film 506c preferably has an oxygen blocking property to suppress outward diffusion of oxygen released from the insulating film 502 and the like.

To improve the reliability, preferably, the thickness of the semiconductor film 506a is large and the thickness of the semiconductor film 506c is small. For example, the semiconductor film 506a has a region with a thickness greater than or equal to 10 nm, preferably greater than or equal to 20 nm, further preferably greater than or equal to 40 nm, still further preferably greater than or equal to 60 nm, yet still further preferably greater than or equal to 100 nm. When the thickness of the semiconductor film 506a is made large, a distance from an interface between the adjacent insulating film and the semiconductor film 506b in which a channel is formed can be large. Since the productivity of the semiconductor device might be decreased, the semiconductor film 506a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) lower than or equal to $1\times10^{19}$ atoms/cm$^3$, preferably lower than or equal to $5\times10^{18}$ atoms/cm$^3$, further preferably lower than or equal to $2\times10^{18}$ atoms/cm$^3$ is provided between the semiconductor film 506b and the semiconductor film 506a. A region in which the concentration of silicon which is measured by SIMS is lower than or equal to $1\times10^{19}$ atoms/cm$^3$, preferably lower than or equal to $5\times10^{18}$ atoms/cm$^3$, preferably lower than or equal to $5\times10^{18}$ atoms/cm$^3$, and further preferably lower than or equal to $2\times10^{18}$ atoms/cm$^3$ is provided between the semiconductor film 506a to the semiconductor film 506b.

It is preferable to reduce the concentrations of hydrogen in the semiconductor film 506a and the semiconductor film 506c in order to reduce the concentration of hydrogen in the semiconductor film 506b. The semiconductor film 506a and the semiconductor film 506c each have a region in which the concentration of hydrogen measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the nitrogen concentration in the semiconductor film 506a and the semiconductor film 506c in order to reduce the nitrogen concentration in the semiconductor film 506b. The semiconductor film 506a and the semiconductor film 506c each have a region in which the nitrogen concentration measured by SIMS is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example. For example, a two-layer structure without the semiconductor film 506a or the semiconductor film 506c may be employed. A four-layer structure in which any one of the semiconductor films described as examples of the semiconductor film 506a, the semiconductor film 506b, and the semiconductor film 506c is provided under or over the semiconductor film 506a or under or over the semiconductor film 506c may be employed. An n-layer structure (n is an integer of 5 or more) in which any one of the semiconductor films described as examples of the semiconductor film 506a, the semiconductor film 506b, and the semiconductor film 506c is provided at two or more of the following positions: over the semiconductor film 506a, under the semiconductor film 506a, over the semiconductor film 506c, and under the semiconductor film 506c.

As the substrate 500, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

As the substrate 500, a flexible substrate may be used. Note that as a method for forming a transistor over a flexible substrate, there is a method in which, after a transistor is formed over a non-flexible substrate, the transistor is separated from the non-flexible substrate and transferred to the substrate 500 which is a flexible substrate. In that case, a separation layer is preferably provided between the non-flexible substrate and the transistor. As the substrate 500, a sheet, a film, or a foil containing a fiber may be used. The substrate 500 may have elasticity. The substrate 500 may have a property of returning to its original shape when bending or pulling is stopped. Alternatively, the substrate 500 may have a property of not returning to its original shape. The thickness of the substrate 500 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 500 has a small thickness, the weight of the semiconductor device can be reduced. When the substrate 500 has a small thickness, even in the case of using glass or the like, the substrate 500 may have elasticity or a property of returning to its original shape when bending or pulling is stopped. Therefore, an impact applied to the semiconductor device over the substrate 500, which is caused by dropping or the like, can be reduced. That is, a durable semiconductor device can be provided.

For the substrate 500 which is a flexible substrate, metal, an alloy, resin, glass, or fiber thereof can be used, for example. The flexible substrate 500 preferably has a lower coefficient of linear expansion because deformation due to an environment is suppressed. The flexible substrate 500 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 500 because of its low coefficient of linear expansion.

The conductive film 513 may have a single-layer structure or a layered structure of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

The insulating film 502 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 502 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 502 may have a function of preventing diffusion of impurities from the substrate 500. In the case where the semiconductor 506b is an oxide semiconductor film, the insulating film 502 can have a function of supplying oxygen to the semiconductor film 506b.

The layer 509a and the layer 509b may be formed using a transparent conductive film, an oxide semiconductor film, a nitride semiconductor film, or an oxynitride semiconductor film, for example. The layer 509a and the layer 509b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layer 509a and the layer 509b may have a property of transmitting visible light. Alternatively, the layer 509a and the layer 509b may have a property of not transmitting visible light, ultraviolet light, infrared light, or X-rays by reflecting or absorbing it. In some cases, such a property can suppress a change in electrical characteristics of the transistor due to stray light.

The layer 509a and the layer 509b may preferably be formed using a layer which does not form a Schottky barrier with the semiconductor film 506b or the like. Accordingly, on-state characteristics of the transistor can be improved.

The conductive film 516a and the conductive film 516b may have a single-layer structure or a layered structure including a conductive film containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

Note that the layer 509a and the layer 509b may preferably be formed using a layer having a resistance higher than that of the conductive film 516a and the conductive film 516b. The layer 509a and the layer 509b may preferably be formed using a layer having a resistance lower than that of the channel of the transistor. For example, the layer 509a and the layer 509b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layer 509a and the layer 509b having resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layer 509a and the layer 509b (e.g., the layer on the drain side) may preferably be provided.

The insulating film 512 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 512 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductive film 504 may have a single-layer structure or a layered structure using a conductive film containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

The insulating film 508 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 508 may be preferably formed to have, for example, a single-layer structure or a stacked-layer structure including an insulating film containing aluminum oxide, silicon nitride oxide, silicon nitride, gallium oxide, yttrium oxide, zirconium oxide, lanthanum oxide, neodymium oxide, hafnium oxide, or tantalum oxide.

The insulating film 518 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 518 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 10A:
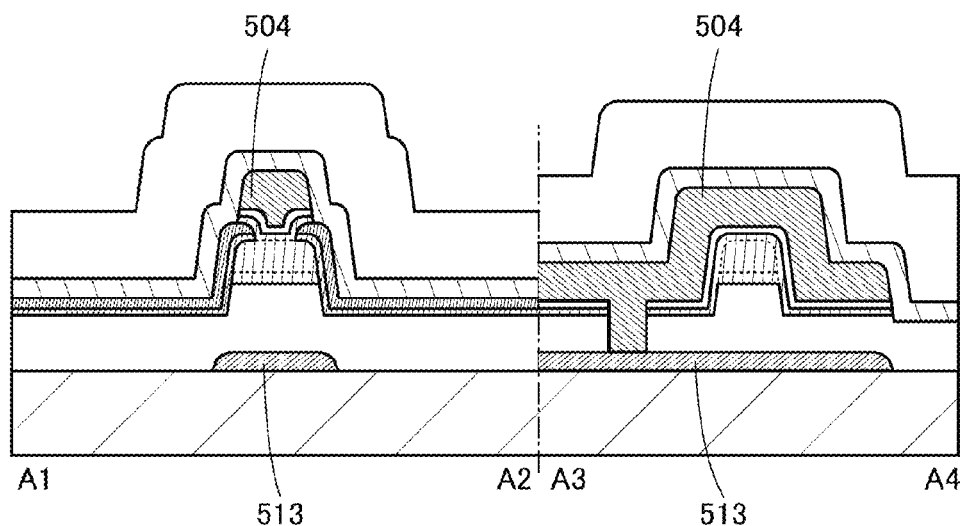
FIGS. 10A and 10B are cross-sectional views each illustrating a transistor of one embodiment of the present invention.
Figure 10B:
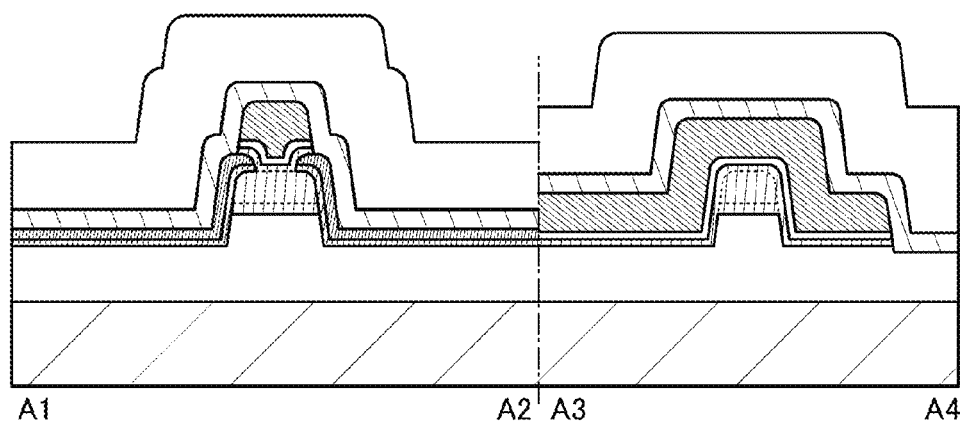

Although FIGS. 9A and 9B show an example where the conductive film 504 which is a first gate electrode of a transistor is not electrically connected to the conductive film 513 which is a second gate electrode, a transistor structure of one embodiment of the present invention is not limited thereto. For example, as illustrated in FIG. 10A, the conductive film 504 and the conductive film 513 may be electrically connected to each other. With such a structure, the conductive film 504 and the conductive film 513 are supplied with the same potential; thus, switching characteristics of the transistor can be improved. Alternatively, as illustrated in FIG. 10B, the conductive film 513 is not necessarily provided.

Figure 11A:
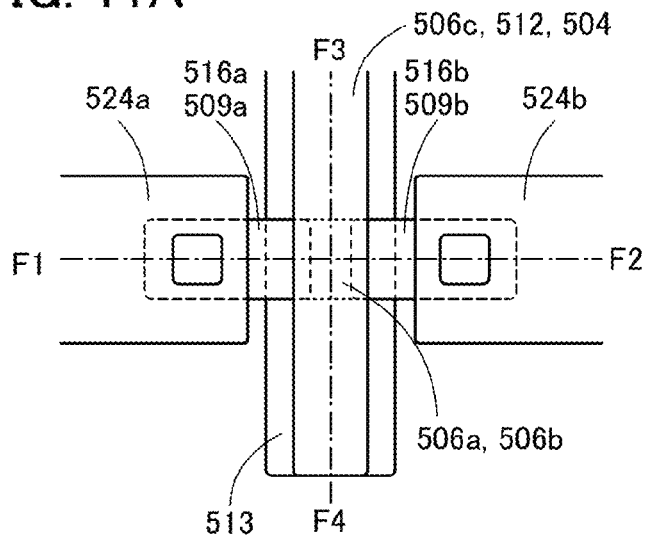
FIGS. 11A and 11B are a top view and a cross-sectional view illustrating a transistor of one embodiment of the present invention.
Figure 11B:
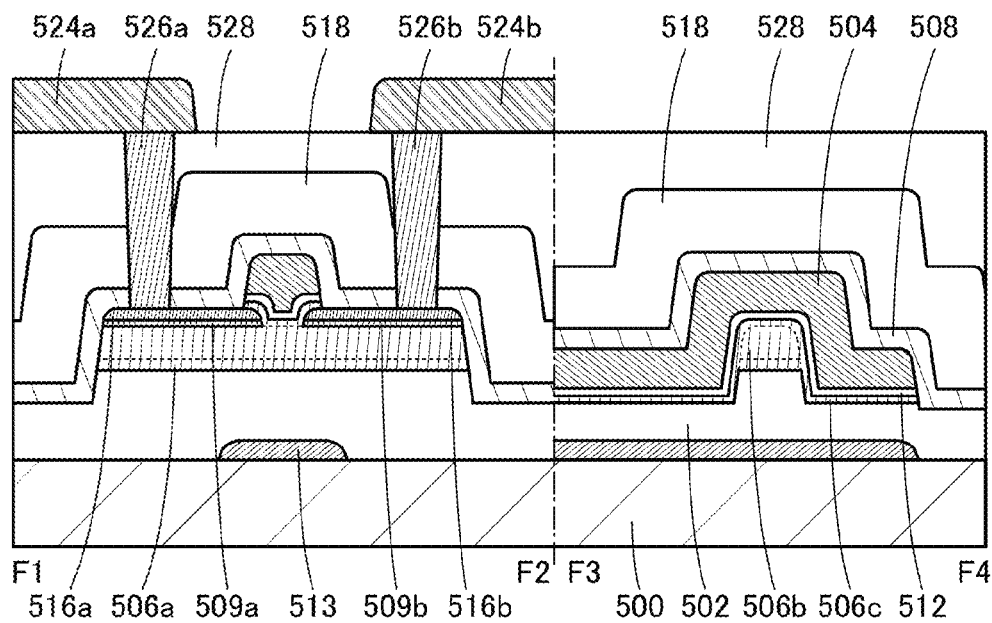

FIG. 11A is an example of a top view of a transistor. FIG. 11B is an example of a cross-sectional view taken along dashed-dotted line F1-F2 and dashed-dotted line F3-F4 in FIG. 11A. Note that some components such as an insulating film are omitted in FIG. 11A for easy understanding.

Although FIGS. 9A and 9B and the like show an example where the conductive film 516a and the conductive film 516b which function as the source electrode and the drain electrode are in contact with a top surface and a side surface of the semiconductor film 506b, a top surface of the insulating film 502, and the like, a transistor structure of one embodiment of the present invention is not limited thereto. For example, as illustrated in FIGS. 11A and 11B, the conductive film 516a and the conductive film 516b may be in contact with only the top surface of the semiconductor film 506b.

As illustrated in FIG. 11B, an insulating film 528 may be provided over the insulating film 518. The insulating film 528 preferably has a flat top surface. The insulating film 528 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 528 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulating film 528, planarization treatment may be performed by a chemical mechanical polishing (CMP) method or the like.

A resin may be used as the insulating film 528. For example, a resin containing polyimide, polyamide, acrylic, silicone, or the like may be used. The use of a resin does not need planarization treatment performed on a top surface of the insulating film 528 in some cases. By using a resin, a thick film can be formed in a short time; thus, the productivity can be increased.

As illustrated in FIGS. 11A and 11B, a conductive film 524a and a conductive film 524b may be provided over the insulating film 528. The conductive film 524a and the conductive film 524b function as wirings, for example. The insulating film 528 may include an opening and the conductive film 516a and the conductive film 524a may be electrically connected to each other through the opening. The insulating film 528 may have another opening and the conductive film 516b and the conductive film 524b may be electrically connected to each other through the opening. In this case, the conductive film 526a and the conductive film 526b may be provided in the respective openings.

Each of the conductive film 524a and the conductive film 524b may be formed to have, for example, a single-layer structure or a stacked-layer structure including a conductive film containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive containing indium, tin, and oxygen, a conductor containing titanium and nitrogen, or the like may be used.

In the transistor illustrated in FIGS. 11A and 11B, the layer 509a and the layer 509b are not in contact with side surfaces of the semiconductor film 506b. Thus, an electric field applied from the conductive film 504 functioning as a first gate electrode to the side surfaces of the semiconductor film 506b is less likely to be blocked by the layer 509a and the layer 509b, and the like. The layer 509a and the layer 509b are not in contact with a top surface of the insulating film 502. Thus, excess oxygen (oxygen) released from the insulating film 502 is not consumed to oxidize the layer 509a and the layer 509b. Accordingly, excess oxygen (oxygen) released from the insulating film 502 can be efficiently used to reduce oxygen vacancies in the semiconductor film 506b. In other words, the transistor having the structure illustrated in FIGS. 11A and 11B has excellent electrical characteristics such as a high on-state current, high field-effect mobility, a small subthreshold swing value, and high reliability.

Figure 12A:
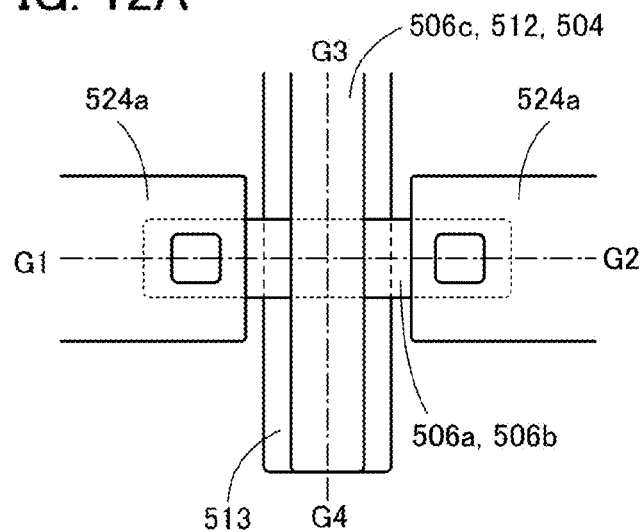
FIGS. 12A and 12B are a top view and a cross-sectional view illustrating a transistor of one embodiment of the present invention.
Figure 12B:
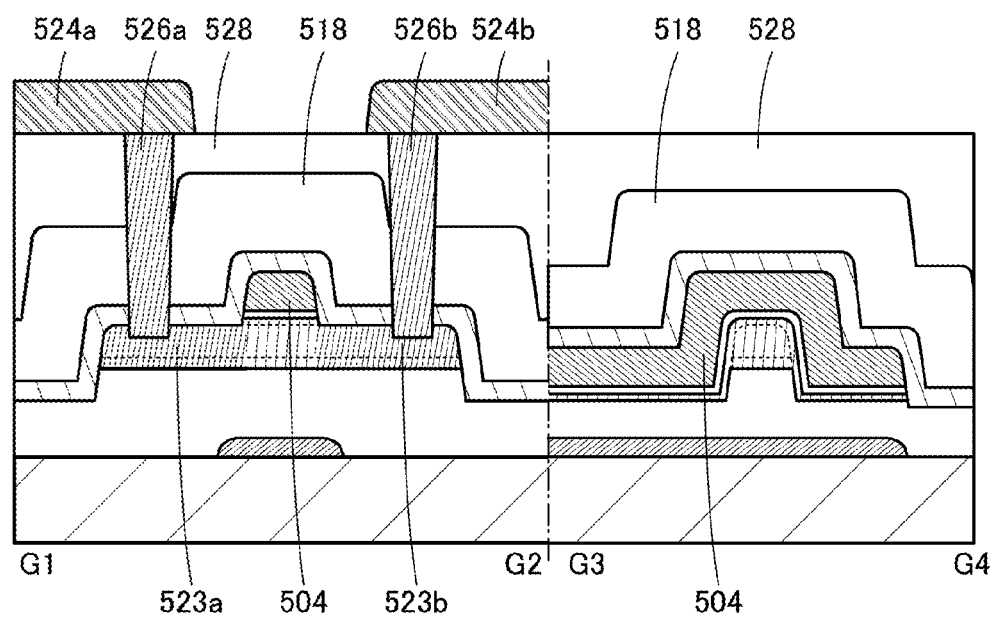

FIGS. 12A and 12B are a top view and a cross-sectional view of a transistor of one embodiment of the present invention. FIG. 12A is the top view and FIG. 12B is the cross-sectional view taken along dashed-dotted line G1-G2 and dashed-dotted line G3-G4 in FIG. 12A. Note that for simplification of the drawing, some components in the top view in FIG. 12A are not illustrated.

The transistor may have a structure in which, as illustrated in FIGS. 12A and 12B, the layer 509a, the layer 509b, the conductive film 516a, and the conductive film 516b are not provided and the conductive film 526a and the conductive film 526b are in contact with the semiconductor film 506b. In this case, a low-resistance region 523a (low-resistance region 523b) is preferably provided in a region in contact with at least the conductive film 526a and the conductive film 526b in the semiconductor film 506b and/or the semiconductor film 506a. The low-resistance region 523a and the low-resistance region 523b may be formed in such a manner that, for example, the conductive film 504 and the like are used as masks and impurities are added to the semiconductor film 506b and/or the semiconductor film 506a. The conductive film 526a and the conductive film 526b may be provided in holes (portions which penetrate) or recessed portions (portions which do not penetrate) of the semiconductor film 506b. When the conductive film 526a and the conductive film 526b are provided in holes or recessed portions of the semiconductor film 506b, contact areas between the conductive films 526a and 526b and the semiconductor film 506b are increased; thus, the adverse effect of the contact resistance can be decreased. In other words, the on-state current of the transistor can be increased.

Figure 13A:
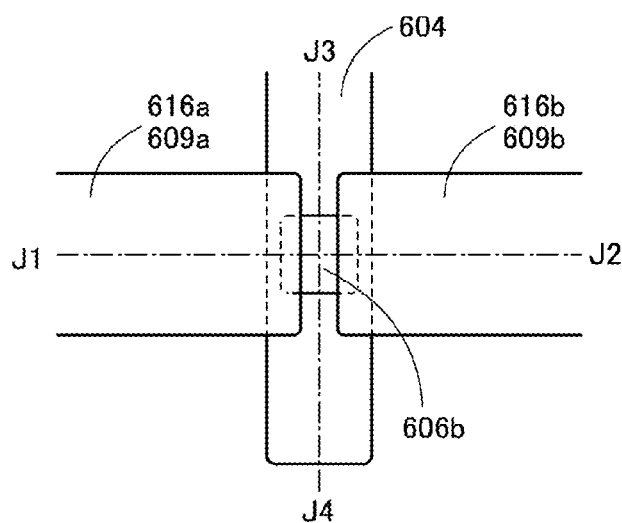
FIGS. 13A and 13B are a top view and a cross-sectional view illustrating a transistor of one embodiment of the present invention.
Figure 13B:
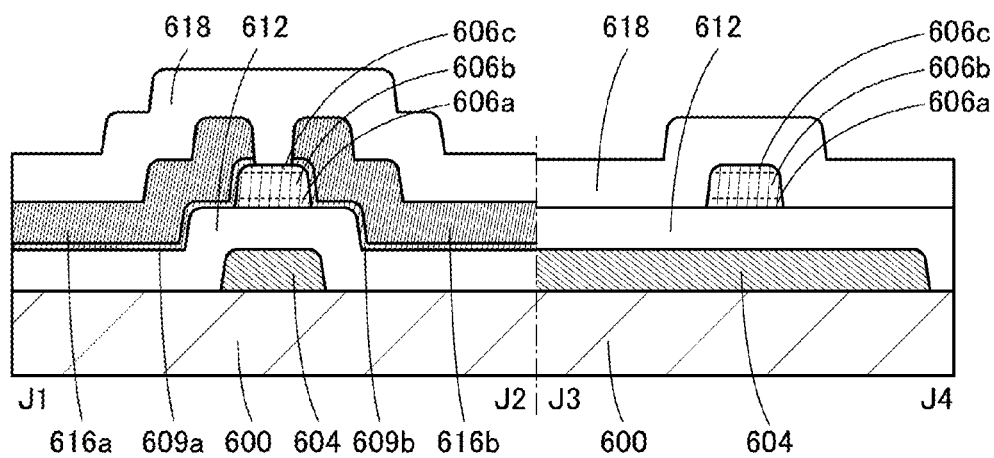

FIGS. 13A and 13B are a top view and a cross-sectional view which illustrate a transistor of one embodiment of the present invention. FIG. 13A is a top view and FIG. 13B is a cross-sectional view taken along dashed-dotted line J1-J2 and dashed-dotted line J3-J4 in FIG. 13A. Note that for simplification of the drawing, some components in the top view in FIG. 13A are not illustrated.

The transistor in FIGS. 13A and 13B includes a conductive film 604 over a substrate 600, an insulating film 612 over the conductive film 604, a semiconductor film 606a over the insulating film 612, a semiconductor film 606b over the semiconductor film 606a, a semiconductor film 606c over the semiconductor film 606b, a layer 609a and a layer 609b which are in contact with the semiconductor film 606a, the semiconductor film 606b, and the semiconductor film 606c and which are arranged to be apart from each other, a conductive film 616a over the layer 609a, a conductive film 616b over the layer 609b, and an insulating film 618 over the semiconductor film 606c, the conductive film 616a, and the conductive film 616b. The conductive film 604 faces a bottom surface of the semiconductor film 606b with the insulating film 612 provided therebetween. The insulating film 612 may have a projection. Note that an insulating film may be provided between the substrate 600 and the conductive film 604. For the insulating film, the description of the insulating film 502 or the insulating film 508 is referred to. Alternatively, the semiconductor film 606a is not necessarily provided. The insulating film 618 is not necessarily provided. The layer 609a is not necessarily provided. The layer 609b is not necessarily provided.

The semiconductor film 606b functions as a channel formation region of the transistor. The conductive film 604 functions as a first gate electrode (also referred to as a front gate electrode) of the transistor. The conductive film 616a and the conductive film 616b function as a source electrode and a drain electrode of the transistor.

The insulating film 618 is preferably an insulating film containing excess oxygen.

For the substrate 600, the description of the substrate 500 is referred to. For the conductive film 604, the description of the conductive film 504 is referred to. For the insulating film 612, the description of the insulating film 512 is referred to. For the semiconductor film 606a, the description of the semiconductor film 506a is referred to. For the semiconductor film 606b, the description of the semiconductor film 506b is referred to. For the semiconductor film 606c, the description of the semiconductor film 506c is referred to. For the layer 609a and the layer 609b, the description of the layer 509a and the layer 509b is referred to. For the conductive film 616a and the conductive film 616b, the description of the conductive film 516a and the conductive film 516b is referred to. For the insulating film 618, the description of the insulating film 502 is referred to.

Over the insulating film 618, a display element may be provided. For example, a pixel electrode, a liquid crystal layer, a common electrode, a light-emitting layer, an organic EL layer, an anode electrode, a cathode electrode, or the like may be provided. The display element is connected to the conductive film 616a or the like, for example.

Figure 14A:
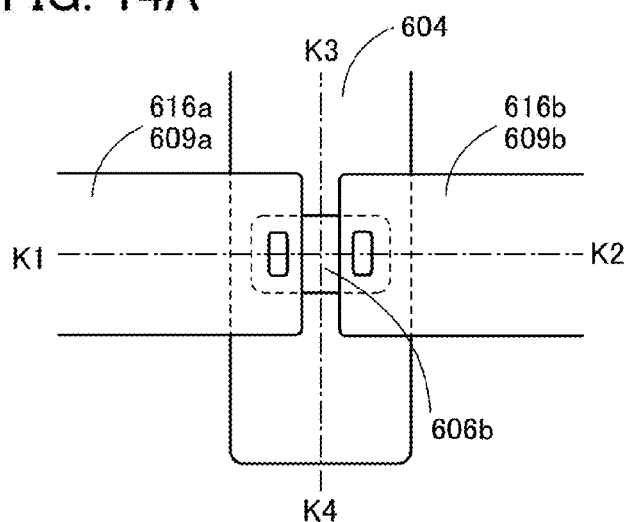
FIGS. 14A and 14B are a top view and a cross-sectional view illustrating a transistor of one embodiment of the present invention.
Figure 14B:
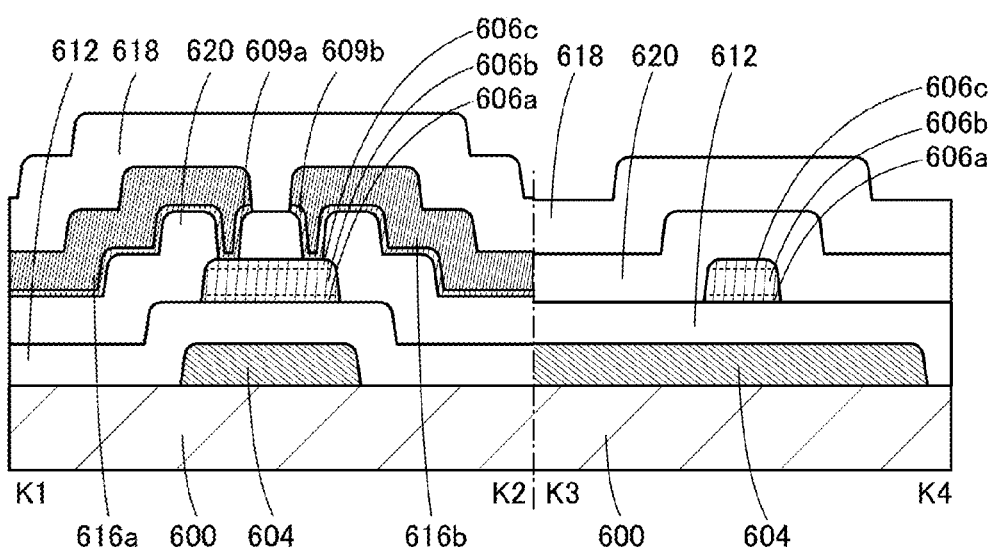

FIG. 14A is an example of a top view of a transistor. FIG. 14B is an example of a cross-sectional view taken along dashed-dotted line K1-K2 and dashed-dotted line K3-K4 in FIG. 14A. Note that some components such as an insulating film are omitted in FIG. 14A for easy understanding.

Over the semiconductor film, an insulating film that can function as a channel protective film may be provided. For example, as illustrated in FIGS. 14A and 14B, an insulating film 620 may be provided between the semiconductor film 606c and the layers 609a and 609b. In that case, the layer 609a (the layer 609b) and the semiconductor film 606c are connected to each other through an opening in the insulating film 620. For the insulating film 620, the description of the insulating film 618 may be referred to.

Figure 15A:
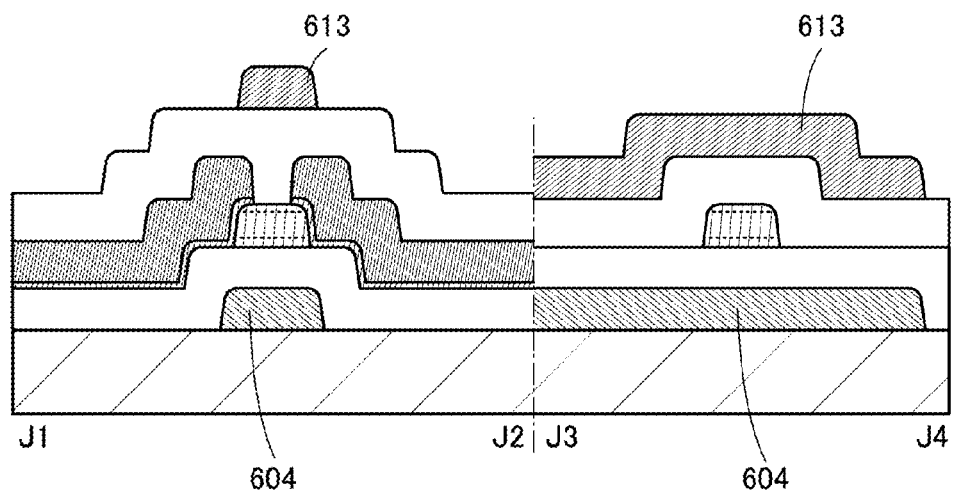
FIGS. 15A and 15B are cross-sectional views illustrating transistors of embodiments of the present invention.
Figure 15B:
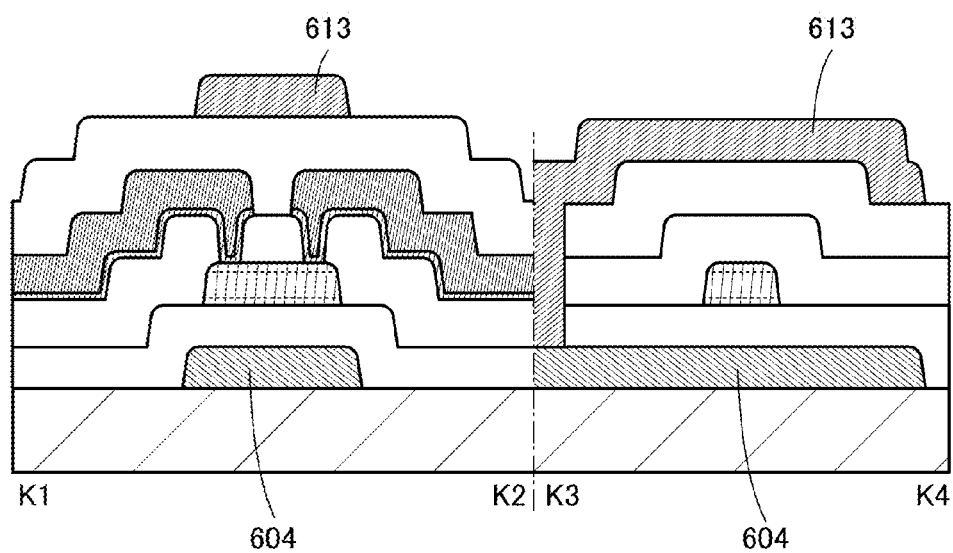

In FIG. 13B and FIG. 14B, a conductive film 613 may be provided over the insulating film 618. Examples in that case are shown in FIGS. 15A and 15B. For the conductive film 613, the description of the conductive film 513 is referred to. A potential or signal which is the same as that supplied to the conductive film 604 or a potential or signal which is different from that supplied to the conductive film 604 may be supplied to the conductive film 613. For example, by supplying a constant potential to the conductive film 613, the threshold voltage of a transistor may be controlled. In other words, the conductive film 613 can function as a second gate electrode. Furthermore, an s-channel structure may be formed using the conductive film 613 and the like.

<Method for Manufacturing Transistor>

A method for manufacturing the transistor illustrated in FIGS. 9A and 9B of one embodiment of the present invention is described below with reference to FIGS. 16A and 16B, FIGS. 17A and 17B, and FIGS. 18A and 18B. Note that for easy understanding, an example of a structure without the conductive film 513, the layer 509*a*, and the layer 509*b* is shown. Furthermore, although a stacked structure including the semiconductor film 506*a*, the semiconductor film 506*b*, and the semiconductor film 506*c* is shown in FIGS. 9A and 9B, a single layer of a semiconductor film 506 is provided in this example.

First, the substrate 500 is prepared.

Next, the insulating film 502 is formed. The insulating film 502 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, a semiconductor film is formed. The semiconductor film is to be the semiconductor film 506 through the following step. The semiconductor film can be formed by a sputtering method, a CVD method, an MBE method, a PLD method, an ALD method, or the like.

The semiconductor film is then processed by a photolithography method or the like to form the semiconductor film 506. Note that when the semiconductor film 506 is formed, part of the insulating film 502 may be etched and thinned in some cases. That is, the insulating film 502 may have a projection in a region in contact with the semiconductor film 506.

In the photolithography method, first, a resist is exposed to light through a photomask. Next, a region exposed to light is removed or left using a developing solution, so that a resist mask is formed. Then, etching through the resist mask is conducted. As a result, a conductive film, a semiconductor film, an insulating film, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing and/or wet etching treatment can be used for removal of the resist mask.

Next, a conductive film that is to be the conductive film 516*a* and the conductive film 516*b* is formed. The conductive film can be formed by a sputtering method, a CVD method, an MBE method, an ALD method, or a PLD method.

Figure 16A:
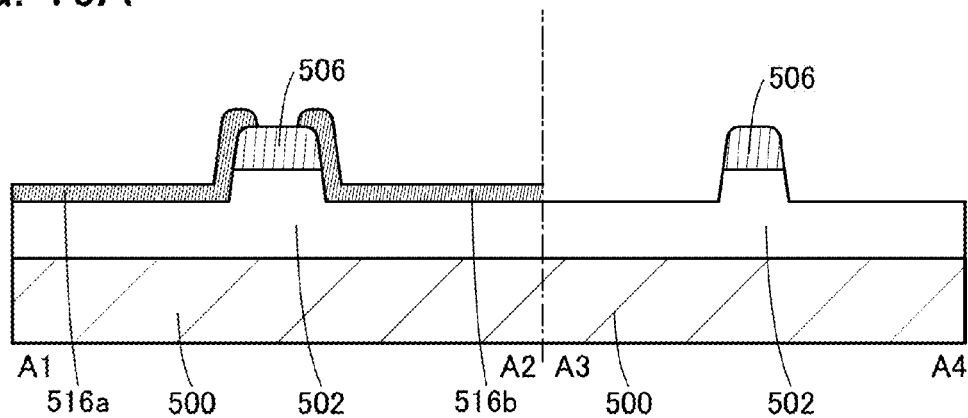
FIGS. 16A and 16B are cross-sectional views illustrating a method for manufacturing a transistor of one embodiment of the present invention.

Next, the conductive film is processed by a photolithography method or the like, so that the conductive film 516*a* and the conductive film 516*b* are formed (FIG. 16A).

Figure 16B:
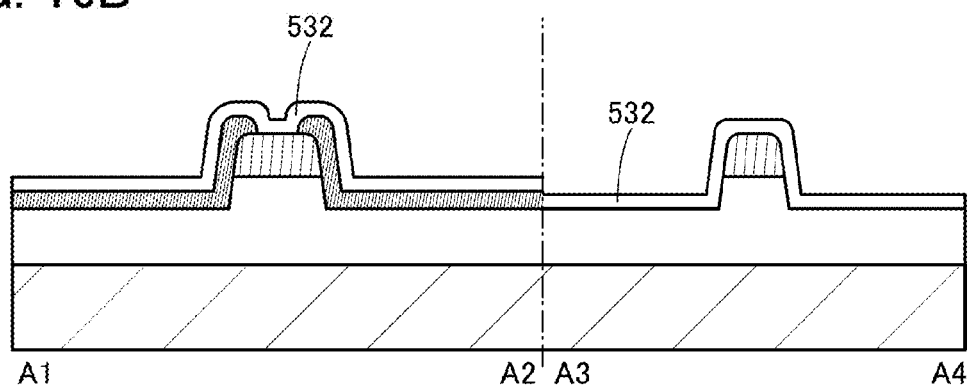

Next, an insulating film 532 that is to be the insulating film 512 is formed (see FIG. 16B). The insulating film 532 can be formed by a sputtering method, a CVD method, an MBE method, an ALD method, or a PLD method.

Next, the semiconductor film 506 is evaluated with the above-described microwave photoconductive decay method. Excitation light 530 is used for evaluation of the semiconductor film 506 (see FIG. 17A). The evaluation with the microwave photoconductive decay method is considered to hardly damage the semiconductor film 506. The insulating film 532 is provided over the semiconductor film 506, and accordingly the semiconductor film 506 is irradiated with the excitation light 530 through the insulating film 532, which allows the suppression of damage to the semiconductor film 506. However, some conditions of evaluation lead to a change in quality of the semiconductor film 506 by irradiation with the excitation light 530. Thus, the semiconductor film 506 other than a region that is to be a channel formation region therein is preferably irradiated with the excitation light 530. Within a predetermined range, evaluation may be performed at plural portions in the plane of the substrate 500 under the same conditions.

The insulating film 532 may be a film that does not absorb the excitation light 530. For example, in the case where the insulating film 532 that is a silicon oxynitride film (8.6 eV of bandgap) is irradiated with the excitation light 530 with a wavelength of 349 nm (3.55 eV), the excitation light 530 is not absorbed in the silicon oxynitride film and can reach the semiconductor film 506.

Next, a conductive film that is to be the conductive film 504 is formed. The conductive film can be deposited by a sputtering method, a CVD method, an MBE method, an ALD method, or a PLD method.

Figure 17A:
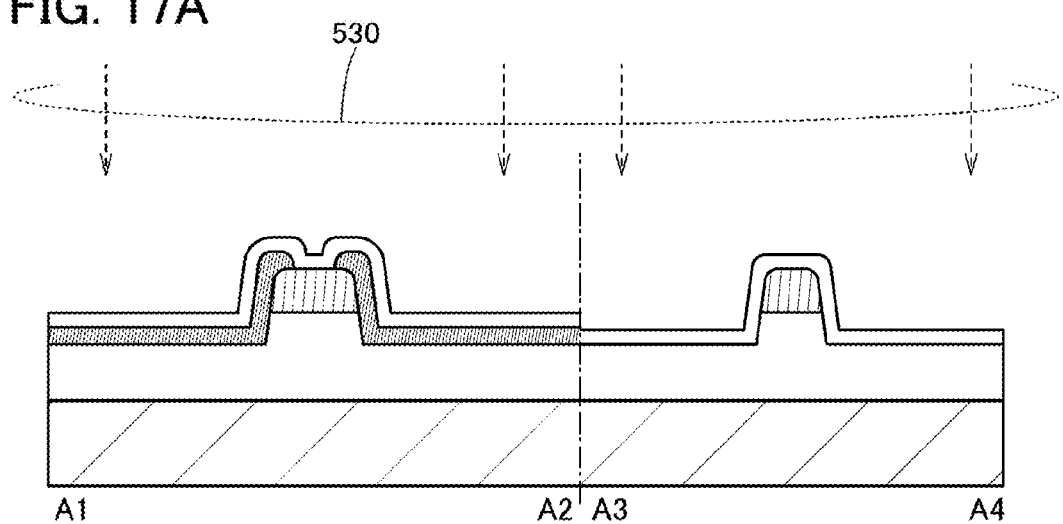
FIGS. 17A and 17B are cross-sectional views illustrating a method for manufacturing a transistor of one embodiment of the present invention.
Figure 17B:
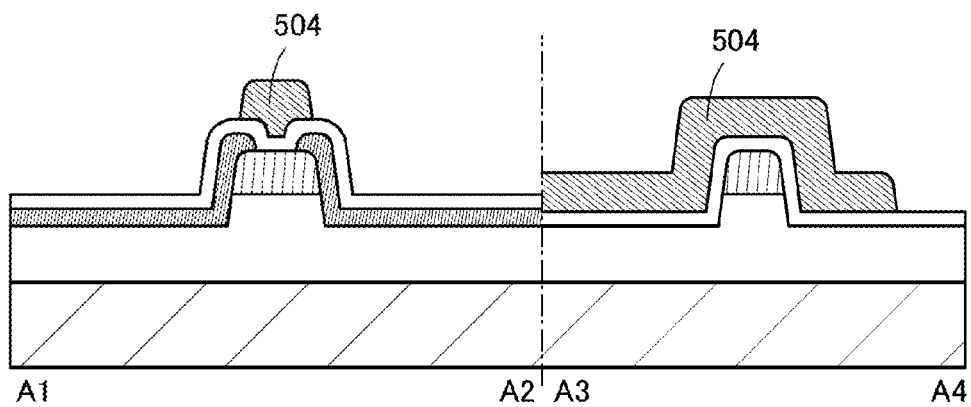

Then, the conductive film is processed by a photolithography method or the like, thereby forming the conductive film 504 (see FIG. 17B).

Figure 18A:
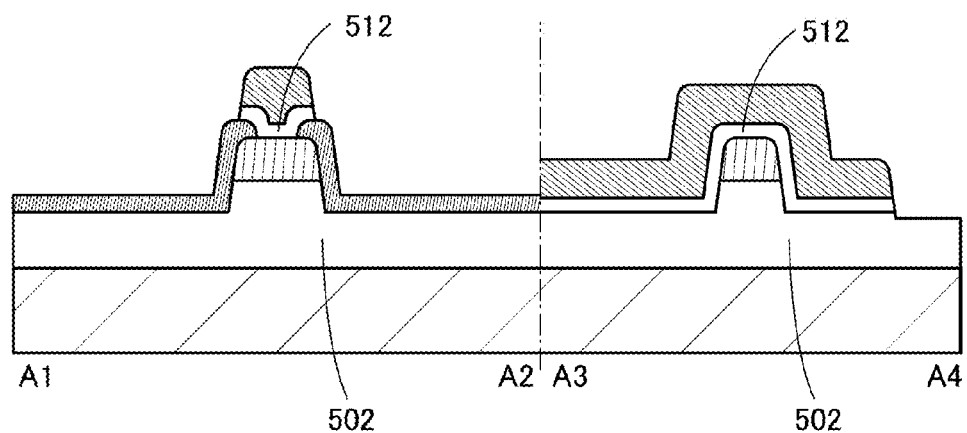
FIGS. 18A and 18B are cross-sectional views illustrating a method for manufacturing a transistor of one embodiment of the present invention.
Figure 18B:
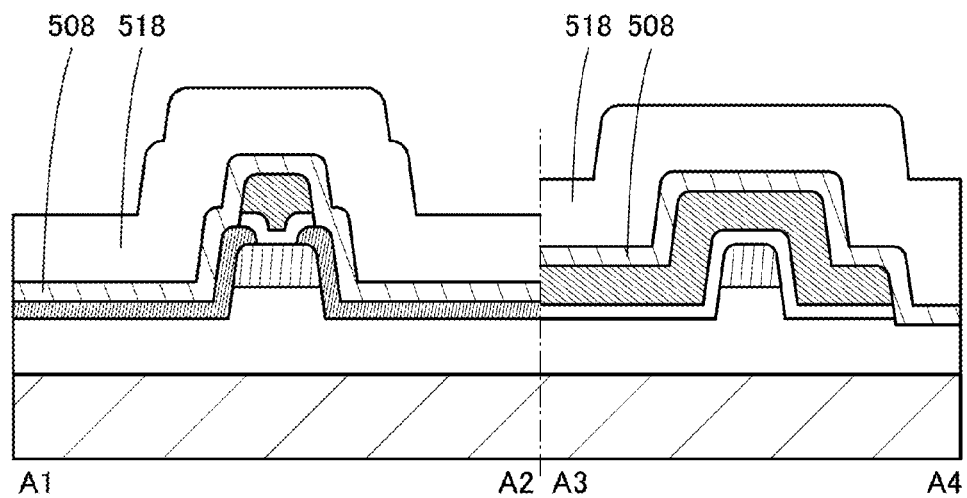

Next, the insulating film 532 is processed by a photolithography method or the like, thereby forming the insulating film 512 (see FIG. 18A). Note that when the insulating film 512 is formed, part of the insulating film 502 may be etched and thinned in some cases.

Next, the insulating film 508 is formed. The insulating film 508 can be deposited by a sputtering method, a CVD method, an MBE method, an ALD method, or a PLD method.

Then, the insulating film 518 is formed. Through the above steps, the transistor can be manufactured (see FIG. 18B). The insulating film 518 can be deposited by a sputtering method, a CVD method, an MBE method, an ALD method, or a PLD method.

As described above, the semiconductor film that has a channel formation region of a transistor can be evaluated in the process of manufacturing the transistor. The evaluation by extraction is not needed. Thus, the transistor can be manufactured with high yield. In addition, the transistor can be manufactured with high productivity. In addition, a semiconductor device including the transistor can be manufactured with high yield. Furthermore, a semiconductor device including the transistor can be manufactured with high productivity.

<Semiconductor Device>

An example of a semiconductor device of one embodiment of the present invention is shown below.

<Circuit>

An example of a circuit including a transistor of one embodiment of the present invention is shown below.

<CMOS Inverter>

Figure 19A:
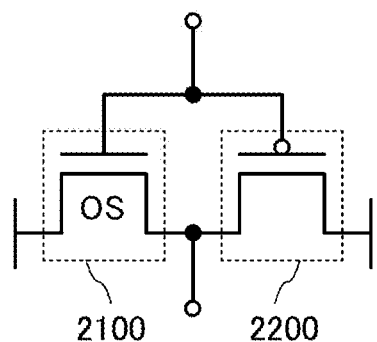
FIGS. 19A and 19B are each a circuit diagram illustrating a semiconductor device of one embodiment of the present invention.

A circuit diagram in FIG. 19A shows a configuration of a so-called CMOS inverter circuit in which a p-channel transistor 2200 and an n-channel transistor 2100 are connected to each other in series and in which gates of them are connected to each other.

<Structure 1 of Semiconductor Device>

Figure 20:
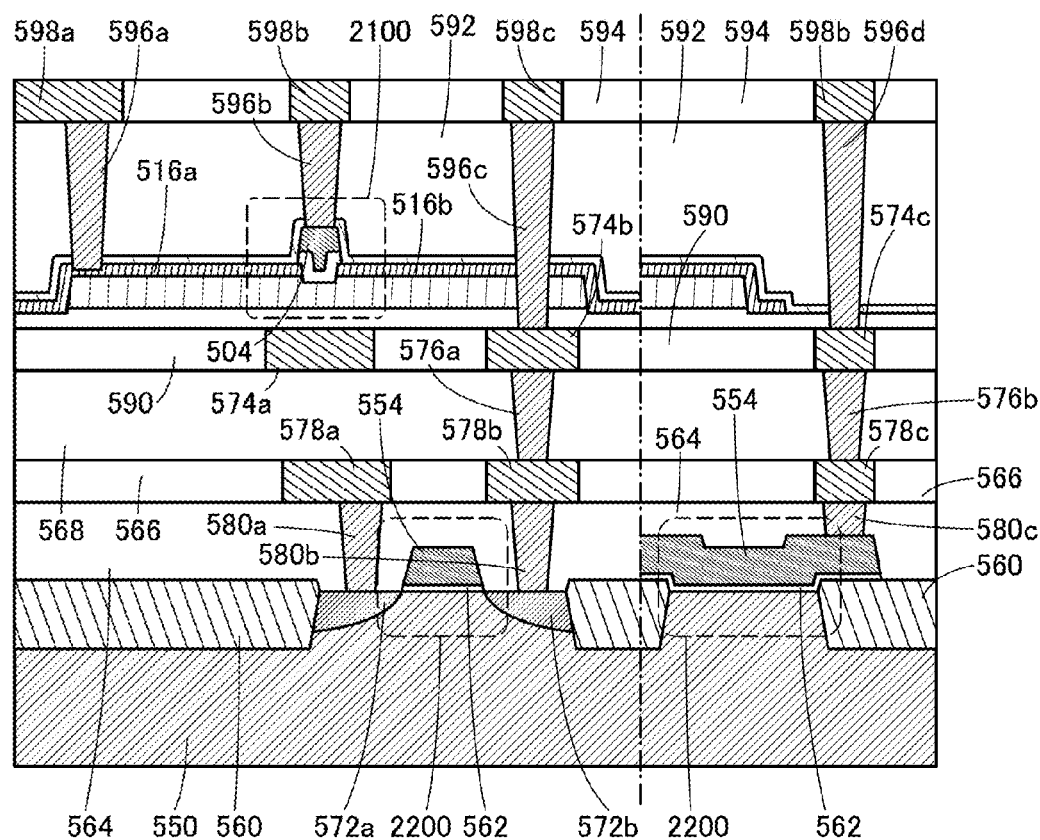
FIG. 20 is a cross-sectional view illustrating a semiconductor device of one embodiment of the present invention.

FIG. 20 is a cross-sectional view of the semiconductor device of FIG. 19A. The semiconductor device shown in FIG. 20 includes the transistor 2200 and the transistor 2100. The transistor 2100 is provided over the transistor 2200. Although an example where the transistor illustrated in FIGS. 9A and 9B is used as the transistor 2100 is shown, a semiconductor device of one embodiment of the present invention is not limited thereto. For example, the transistors illustrated in FIGS. 11A and 11B, FIGS. 12A and 12B, and FIGS. 13A and 13B may be used as the transistor 2100. Therefore, the description regarding the above-mentioned transistors is referred to for the transistor 2100 as appropriate.

The transistor 2200 shown in FIG. 20 is a transistor using a semiconductor substrate 550. The transistor 2200 includes a region 572a in the semiconductor substrate 550, a region 572b in the semiconductor substrate 550, an insulating film 562, and a conductive film 554.

In the transistor 2200, the regions 572a and 572b have a function as a source region and a drain region. The insulating film 562 functions as a gate insulating film. The conductive film 554 functions as a gate electrode. Therefore, resistance of a channel formation region can be controlled by a potential applied to the conductive film 554. In other words, conduction or non-conduction between the region 572a and the region 572b can be controlled by the potential applied to the conductive film 554.

As the semiconductor substrate 550, a semiconductor substrate of silicon, germanium, or the like, or a compound semiconductor substrate of silicon carbide, silicon germanium, gallium arsenide, indium phosphide, zinc oxide, or gallium oxide can be used, for example. A single crystal silicon substrate is preferably used as the semiconductor substrate 550.

For the semiconductor substrate 550, a semiconductor substrate including impurities imparting n-type conductivity is used. However, a semiconductor substrate including impurities imparting p-type conductivity may be used as the semiconductor substrate 550. In that case, a well including impurities imparting the n-type conductivity is provided in a region where the transistor 2200 is formed. Alternatively, the semiconductor substrate 550 may be an i-type semiconductor substrate.

A top surface of the semiconductor substrate 550 preferably has a (110) plane. Then, on-state characteristics of the transistor 2200 can be improved.

The regions 572a and 572b are regions including impurities imparting the p-type conductivity. Accordingly, the transistor 2200 has a structure of a p-channel transistor.

Note that the transistor 2200 is separated from an adjacent transistor by a region 560 and the like. The region 560 is an insulating region.

The semiconductor device illustrated in FIG. 20 includes an insulating film 564, an insulating film 566, an insulating film 568, a conductive film 580a, a conductive film 580b, a conductive film 580c, a conductive film 578a, a conductive film 578b, a conductive film 578c, a conductive film 576a, a conductive film 576b, a conductive film 574a, a conductive film 574b, a conductive film 574c, a conductive film 596a, a conductive film 596b, a conductive film 596c, a conductive film 596d, a conductive film 598a, a conductive film 598b, a conductive film 598c, an insulating film 590, an insulating film 592, and an insulating film 594.

The insulating film 564 is over the transistor 2200. The insulating film 566 is over the insulating film 564. The insulating film 568 is over the insulating film 566. The insulating film 590 is over the insulating film 568. The transistor 2100 is provided over the insulating film 590. The insulating film 592 is over the transistor 2100. The insulating film 594 is over the insulating film 592.

The insulating film 564 includes an opening reaching the region 572a, an opening reaching the region 572b, and an opening reaching the conductive film 554. In the openings, the conductive film 580a, the conductive film 580b, and the conductive film 580c are embedded.

In addition, the insulating film 566 includes an opening reaching the conductive film 580a, an opening reaching the conductive film 580b, and an opening reaching the conductive film 580c. In the openings, the conductive film 578a, the conductive film 578b, and the conductive film 578c are embedded.

The insulating film 568 includes an opening reaching the conductive film 578b and an opening reaching the conductive film 578c. In the openings, the conductive film 576a and the conductive film 576b are embedded.

The insulating film 590 includes an opening overlapping a channel formation region of the transistor 2100, an opening reaching the conductive film 576a, and an opening reaching the conductive film 576b. In the openings, the conductive film 574a, the conductive film 574b, and the conductive film 574c are embedded.

The conductive film 574a may have a function as a bottom gate electrode of the transistor 2100. Alternatively, the electrical characteristics of the transistor 2100, such as the threshold voltage, may be controlled by application of a predetermined potential to the conductive film 574a, for example. Further alternatively, for example, the conductive film 574a and the conductive film 504 functioning as a top gate electrode of the transistor 2100 may be electrically connected to each other. Thus, the on-state current of the transistor 2100 can be increased. A punch-through phenomenon can be suppressed; thus, stable electrical characteristics in the saturation region of the transistor 2100 can be obtained.

The insulating film 592 includes an opening reaching the conductive film 574b through the conductive film 516b that is one of a source electrode and a drain electrode of the transistor 2100, an opening reaching the conductive film 516a that is the other of the source electrode and the drain electrode of the transistor 2100, an opening reaching the conductive film 504 that is a gate electrode of the transistor 2100, and an opening reaching the conductive film 574c. In the openings, the conductive film 596a, the conductive film 596b, and the conductive film 596c, and the conductive film 596d are embedded. Note that in some cases, an opening provided in a component of the transistor 2100 or the like is through other components.

The insulating film 594 includes an opening reaching the conductive film 596a, an opening reaching the conductive film 596b and the conductive film 596d, and an opening reaching the conductive film 596c. In the openings, the conductive film 598a, the conductive film 598b, and the conductive film 598c are embedded.

The insulating films 564, 566, 568, 590, 592 and 594 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulating films 564, 566, 568, 590, 592 and 594 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

At least one of the insulating films 564, 566, 568, 590, 592, and 594 preferably has a function of blocking oxygen and impurities such as hydrogen. When an insulating film that has a function of blocking oxygen and impurities such as hydrogen is placed near the transistor 2100, the electrical characteristics of the transistor 2100 can be stable.

As the insulating film having a function of blocking oxygen and impurities such as hydrogen, for example, an insulating film with a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used.

The conductive films 580a, 580b, 580c, 578a, 578b, 578c, 576a, 576b, 574a, 574b, 574c, 596a, 596b, 596c, 596d, 598a, 598b, and 598c may be formed to have, for example, a single-layer structure or a stacked-layer structure including an insulating film containing boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, or tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

Figure 21:
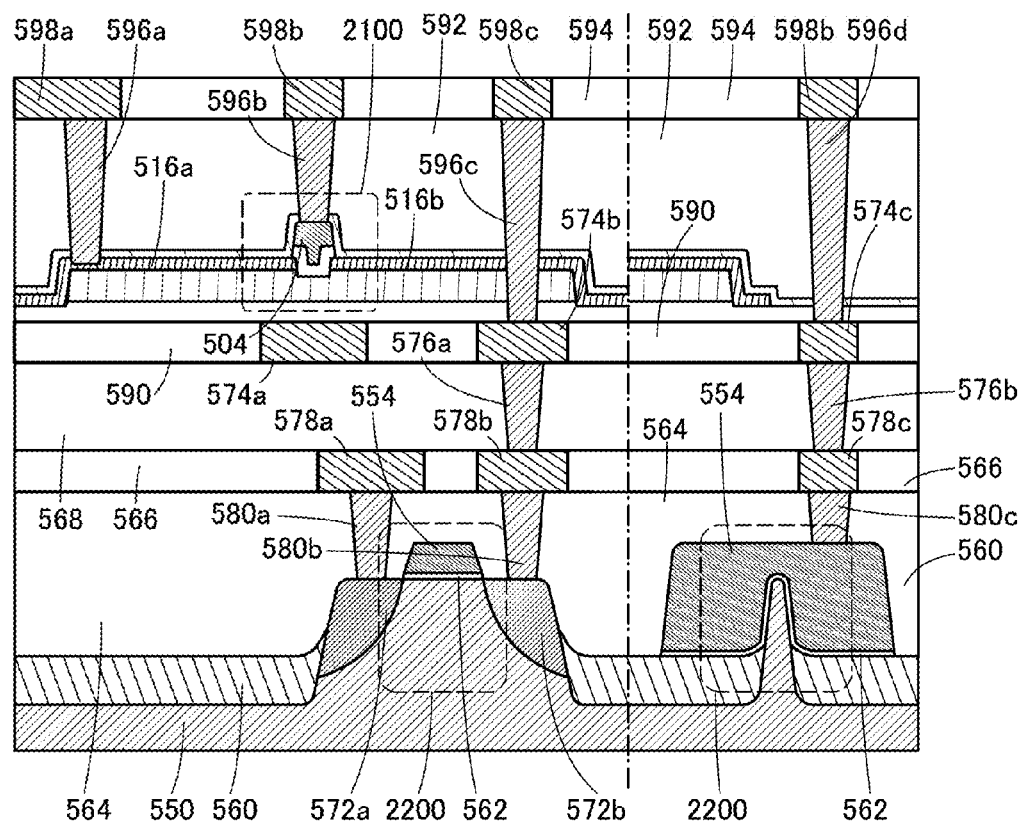
FIG. 21 is a cross-sectional view illustrating a semiconductor device of one embodiment of the present invention.

Note that a semiconductor device in FIG. 21 is the same as the semiconductor device in FIG. 20 except the structure of the transistor 2200. Therefore, the description of the semiconductor device in FIG. 20 is referred to for the semiconductor device in FIG. 21. In the semiconductor device in FIG. 21, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 22:
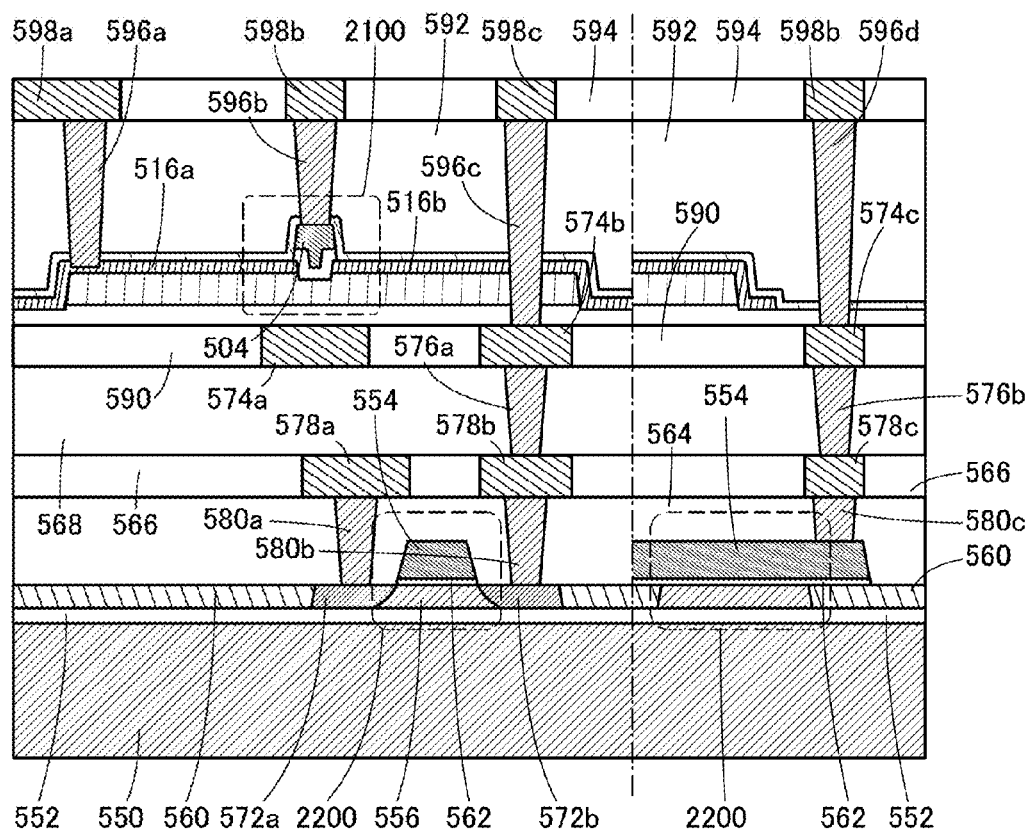
FIG. 22 is a cross-sectional view illustrating a semiconductor device of one embodiment of the present invention.

Note that a semiconductor device in FIG. 22 is the same as the semiconductor device in FIG. 20 except the structure of the transistor 2200. Therefore, the description of the semiconductor device in FIG. 20 is referred to for the semiconductor device in FIG. 22. In the semiconductor device in FIG. 22, the transistor 2200 is formed using an SOI substrate 550. In the structure in FIG. 22, a region 556 is apart from the semiconductor substrate 550 with an insulating film 552 provided therebetween. Since the SOI substrate is used as the semiconductor substrate 550, a punch-through phenomenon and the like can be suppressed; thus, the off-state characteristics of the transistor 2200 can be improved. Note that the insulating film 552 can be formed by turning part of the semiconductor substrate 550 into an insulator. For example, silicon oxide can be used as the insulating film 552.

In each of the semiconductor devices shown in FIGS. 20 to 22, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 19B:
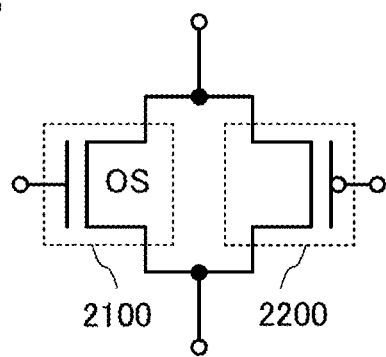

A circuit diagram in FIG. 19B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 23A:
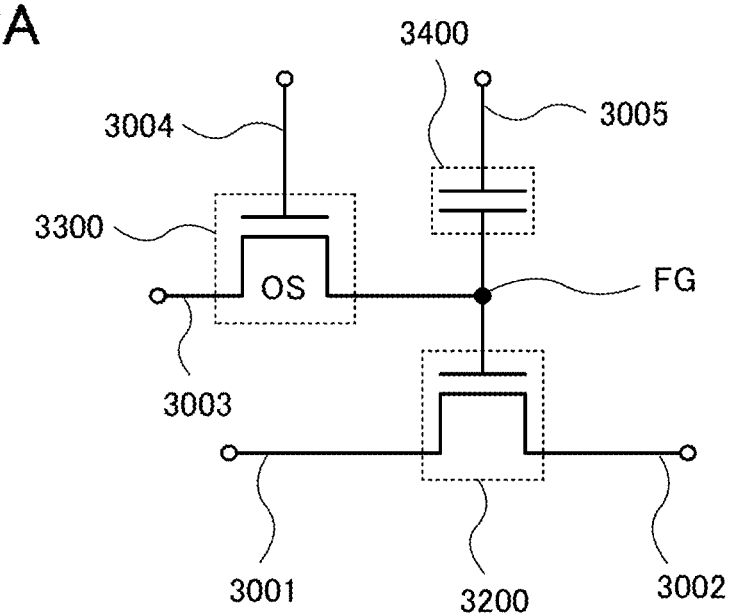
FIGS. 23A and 23B are each a circuit diagram illustrating a memory device of one embodiment of the present invention.
Figure 23B:
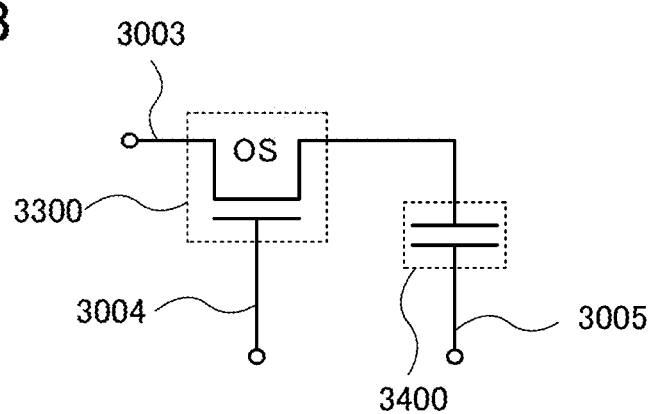

An example of a semiconductor device (memory device) which includes the transistor of one embodiment of the present invention, which can retain stored data even when not powered, and which has an unlimited number of write cycles is shown in FIGS. 23A and 23B.

The semiconductor device illustrated in FIG. 23A includes a transistor 3200 using a first semiconductor film, a transistor 3300 using a second semiconductor film, and a capacitor 3400. Note that any of the above-described transistors can be used as the transistor 3300.

The transistor 3300 is preferably a transistor with low off-state current. For example, a transistor using an oxide semiconductor film can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 23A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 23A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, whereby the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

<Structure 2 of Semiconductor Device>

Figure 24:
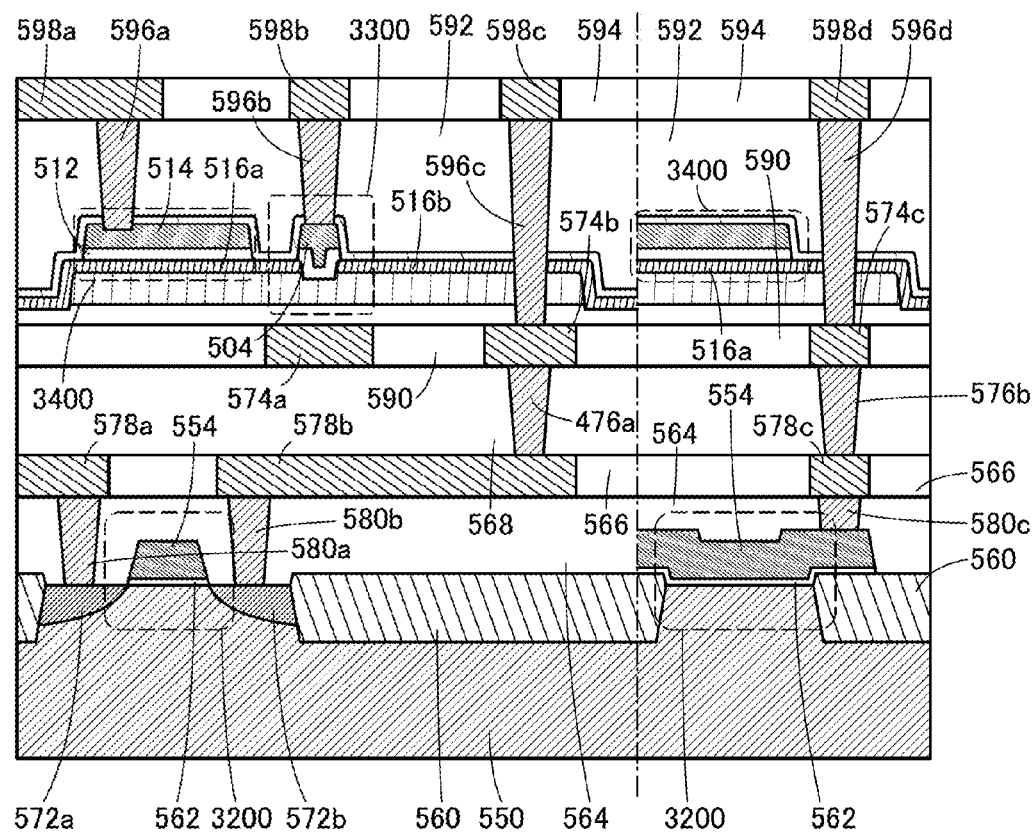
FIG. 24 is a cross-sectional view illustrating a semiconductor device of one embodiment of the present invention.

FIG. 24 is a cross-sectional view of the semiconductor device of FIG. 23A. The semiconductor device in FIG. 24 includes the transistor 3200, the transistor 3300, and the capacitor 3400. The transistor 3300 and the capacitor 3400 are provided over the transistor 3200. The description of the transistor 2100 is referred to for the transistor 3300. Furthermore, for the transistor 3200, the description of the transistor 2200 in FIG. 20 is referred to. Although the case where the transistor 2200 is a p-channel transistor is described in FIG. 20, the first transistor 3200 may be an n-channel transistor.

The transistor 2200 illustrated in FIG. 24 is a transistor using the semiconductor substrate 550. The transistor 2200 includes the region 572a in the semiconductor substrate 550, the region 572b in the semiconductor substrate 550, the insulating film 562, and a conductor 554.

The semiconductor device in FIG. 24 includes the insulating film 564, the insulating film 566, the insulating film 568, the conductive film 580a, the conductive film 580b, the conductive film 580c, the conductive film 578a, the conductive film 578b, the conductive film 578c, the conductive film 576a, the conductive film 576b, the conductive film 574a, the conductive film 574b, the conductive film 574c, the conductive film 596a, the conductive film 596b, the conductive film 596c, the conductive film 596d, the conductive film 598a, the conductive film 598b, the conductive film 598c, a conductive film 598d, the insulating film 590, the insulating film 592, and the insulating film 594.

The insulating film 564 is provided over the transistor 3200. The insulating film 566 is provided over the insulating film 564. The insulating film 568 is provided over the insulating film 566. The insulating film 590 is provided over the insulating film 568. The transistor 3300 is provided over the insulating film 590. The insulating film 592 is provided over the transistor 3300. The insulating film 594 is provided over the insulating film 592.

The insulating film 564 includes an opening reaching the region 572a, an opening reaching the region 572b, and an opening reaching the conductive film 554. In the openings, the conductive film 580a, the conductive film 580b, and the conductive film 580c are embedded.

In addition, the insulating film 566 includes an opening reaching the conductive film 580a, an opening reaching the conductive film 580b, and an opening reaching the conductive film 580c. In the openings, the conductive film 578a, the conductive film 578b, the conductive film 578c are embedded.

The insulating film 568 includes an opening reaching the conductive film 578b and an opening reaching the conductive film 578c. In the opening, the conductive film 576a and the conductive film 576b are embedded.

Furthermore, the insulating film 590 includes an opening overlapping with the channel formation region of the transistor 3300, an opening reaching the conductive film 576a, and an opening reaching the conductive film 576b. In the openings, the conductive film 574a, the conductive film 574b, and the conductive film 574c are embedded.

The conductive film 574a may have a function as a bottom-gate electrode of the transistor 3300. Alternatively, for example, electrical characteristics such as the threshold voltage of the transistor 3300 may be controlled by application of a constant potential to the conductive film 574a. Further alternatively, for example, the conductive film 574a and the conductive film 504 functioning as a top gate electrode of the transistor 3300 may be electrically connected to each other. Thus, the on-state current of the transistor 3300 can be increased. A punch-through phenomenon can be suppressed; thus, stable electrical characteristics in the saturation region of the transistor 3300 can be obtained.

The insulating film 592 includes an opening reaching the conductive film 574b through the conductive film 516b that is one of a source electrode and a drain electrode of the transistor 3300, an opening reaching a conductive film 514 which overlaps with the conductive film 516a that is the other of the source electrode and the drain electrode of the transistor 3300 with the insulating film 512 provided therebetween, an opening reaching the conductive film 504 that is the gate electrode of the transistor 3300, and an opening reaching the conductive film 574c through the conductive film 516a that is the other of the source electrode and the drain electrode of the transistor 3300. In the openings, the conductive film 596a, the conductive film 596b, the conductive film 596c, and the conductive film 596d are embedded. Note that in some cases, an opening provided in a component of the transistor 3300 or the like is through other components.

The insulating film 594 includes an opening reaching the conductive film 596a, an opening reaching the conductive film 596b, an opening reaching the conductive film 596c, and an opening reaching the conductive film 596d. In the openings, the conductive film 598a, the conductive film 598b, the conductive film 598c, and the conductive film 598d.

At least one of the insulating films 564, 566, 568, 590, 592, and 594 preferably has a function of blocking oxygen and impurities such as hydrogen. When an insulating film that has a function of blocking oxygen and impurities such as hydrogen is placed near the transistor 3300, the electrical characteristics of the transistor 3300 can be stable.

The conductive film 598d may have a single-layer structure or a stacked structure of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

One of the source and the drain of the transistor 3200 is electrically connected to the conductive film 516b that is one of the source electrode and the drain electrode of the transistor 3300 through the conductive films 580a, 578a, 576a, 574b, and 596c. Furthermore, the conductive film 554 that is the gate electrode of the transistor 3200 is electrically connected to the conductive film 516a that is the other of the source electrode and the drain electrode of the transistor 3300 through the conductive films 580c, 578c, 576b, 574c, and 596d.

The capacitor 3400 includes an electrode electrically connected to the other of the source electrode and the drain electrode of the transistor 3300, the conductive film 514, and the insulating film 512. Note that the insulating film 512 can be formed through the same process as the gate insulating film of the transistor 3300; thus, productivity can be preferably increased in some cases. Furthermore, when a layer formed in the same process as the gate electrode of the transistor 3300 is used as the conductive film 514, productivity can be preferably improved in some cases.

Note that the description of the transistor illustrated in FIG. 20 can be referred to for the structures of the other components.

Figure 25:
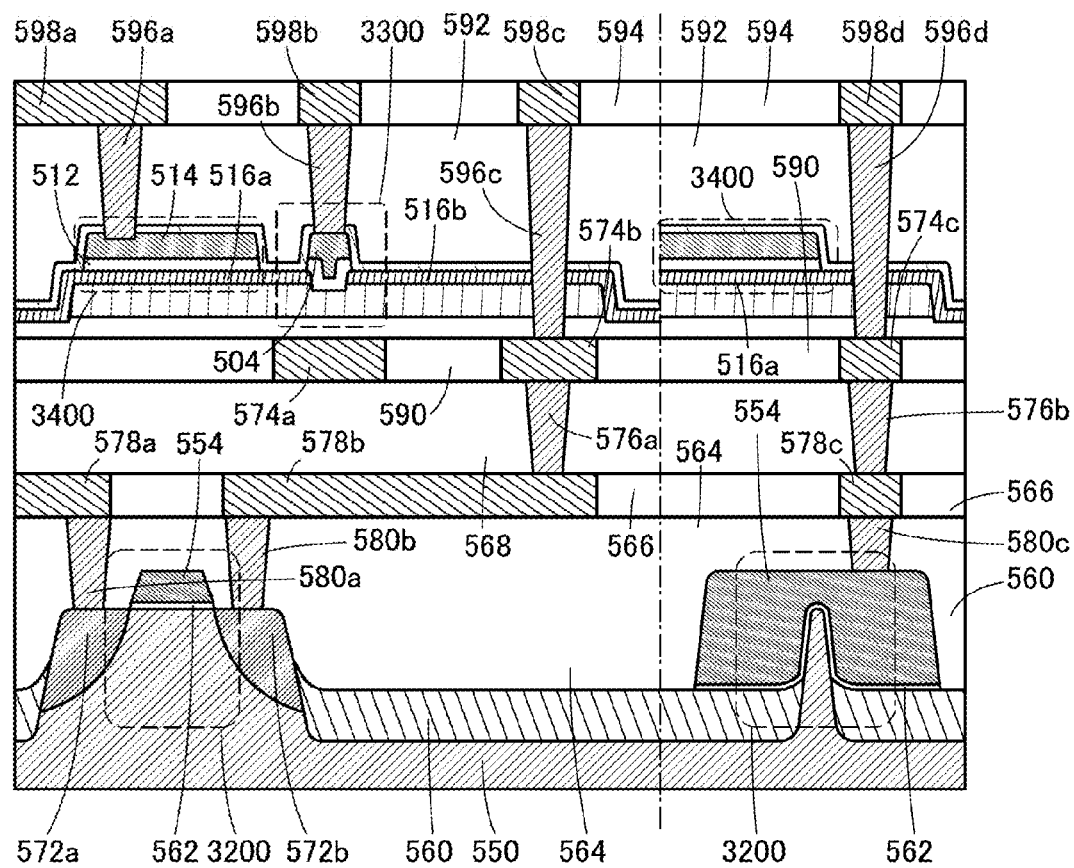
FIG. 25 is a cross-sectional view illustrating a semiconductor device of one embodiment of the present invention.

A semiconductor device in FIG. 25 is the same as the semiconductor device in FIG. 24 except the structure of the transistor 3200. Therefore, the description of the semiconductor device in FIGS. 23A and 23B is referred to for the semiconductor device in FIG. 25. In the semiconductor device in FIG. 25, the transistor 3200 is a FIN-type transistor. The description of the transistor 2200 in FIG. 21 is referred to for the transistor 3200 that is a FIN-type transistor. Note that although the transistor 2200 is illustrated as a p-channel transistor in FIG. 21, the transistor 3200 may be an n-channel transistor.

Figure 26:
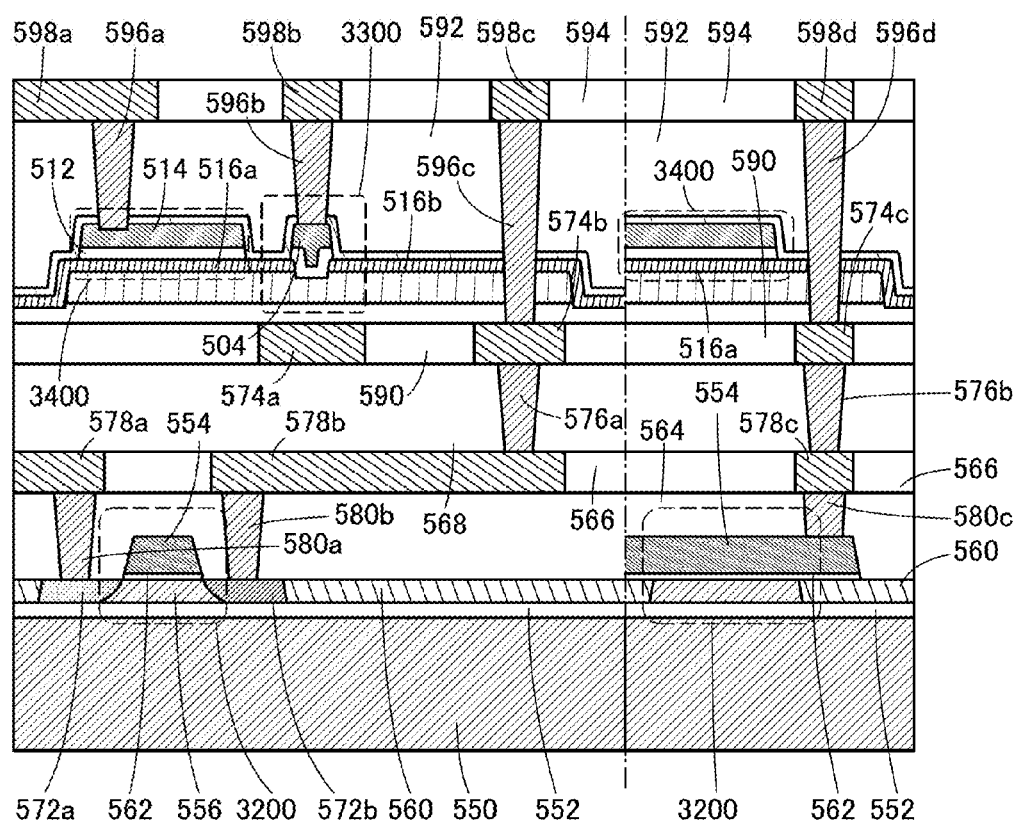
FIG. 26 is a cross-sectional view illustrating a semiconductor device of one embodiment of the present invention.

A semiconductor device in FIG. 26 is the same as the semiconductor device in FIG. 24 except a structure of the transistor 3200. Therefore, the description of the semiconductor device in FIG. 24 is referred to for the semiconductor device in FIG. 26. Specifically, in the semiconductor device in FIG. 26, the transistor 3200 is provided over the semiconductor substrate 550 that is an SOI substrate. For the transistor 3200, which is provided in the semiconductor substrate 550 that is an SOI substrate, the description of the transistor 2200 in FIG. 22 is referred to. Note that although the transistor 2200 is illustrated as a p-channel transistor in FIG. 22, the transistor 3200 may be an n-channel transistor.

<Memory Device 2>

The semiconductor device in FIG. 23B is different from the semiconductor device in FIG. 23A in that the transistor 3200 is not provided. Also in this case, writing and retaining operation of data can be performed in a manner similar to that of the semiconductor device in FIG. 23A.

Reading of data in the semiconductor device in FIG. 23B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of the one electrode of the capacitor 3400 retaining the potential $V_1$ ($=(C_B \times V_{B0} + C \times V_1)/(C_B + C)$) is higher than the potential of the third wiring 3003 in the case of the one electrode of the capacitor 3400 retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor film may be used for a driver circuit for driving a memory cell, and a transistor including the second semiconductor film may be stacked over the driver circuit as the transistor 3300.

When including a transistor using an oxide semiconductor film and having an low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulating film is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<Imaging Device>

An imaging device of one embodiment of the present invention is described below.

<Configuration Example of Imaging Device>

Figure 27A:
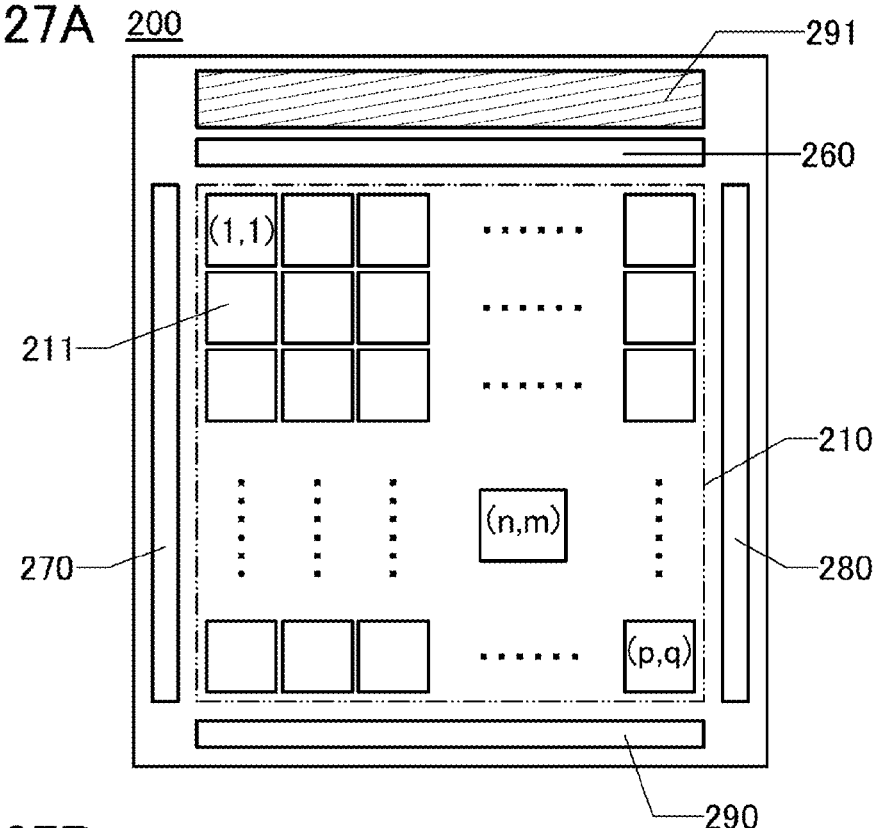
FIGS. 27A and 27B are top views each illustrating a semiconductor device of one embodiment of the present invention.

FIG. 27A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted over a semiconductor device such as an IC. Note that as the peripheral circuit, one or more of the peripheral circuits 260, 270, 280, and 290 may be omitted.

Figure 27B:
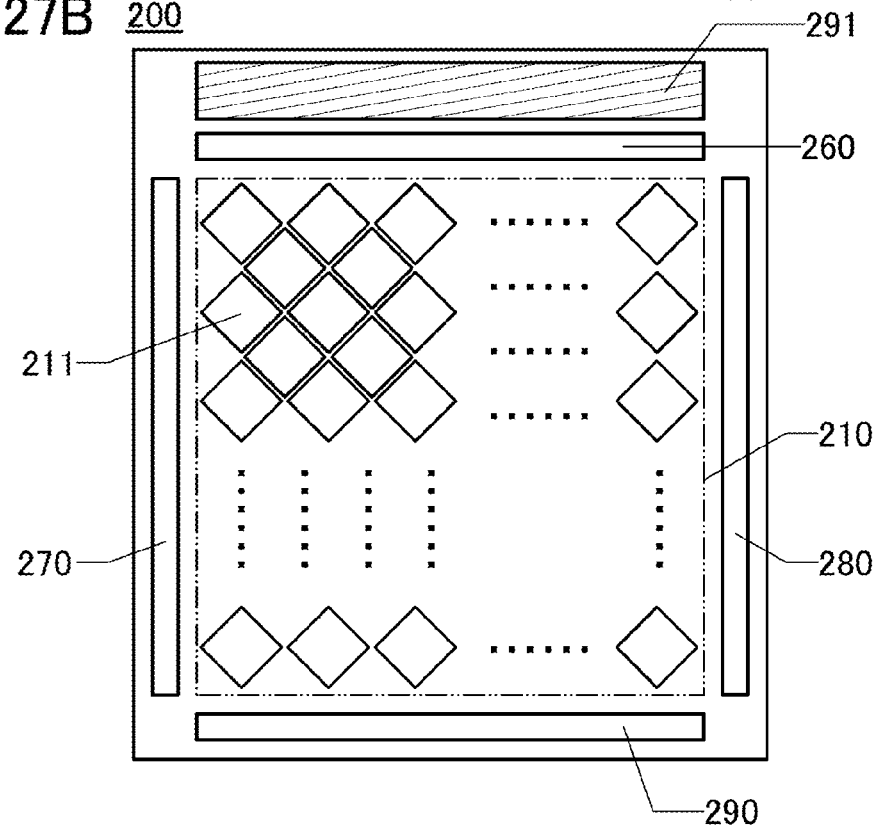

As illustrated in FIG. 27B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 28A:
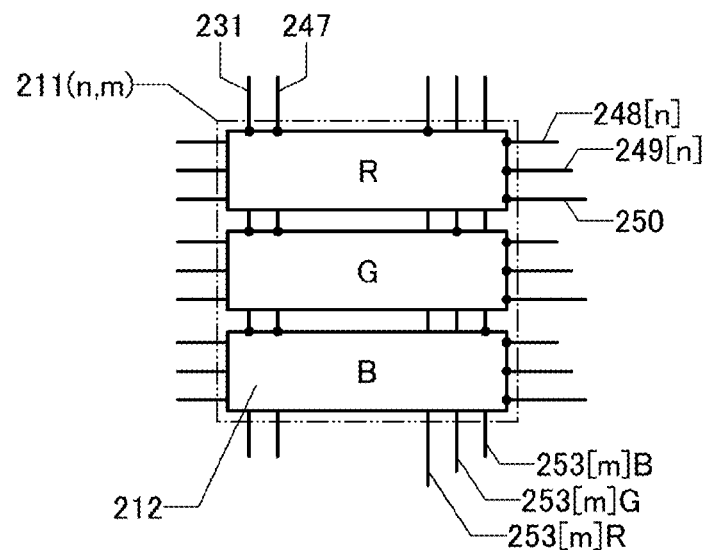
FIGS. 28A and 28B are block diagrams illustrating a semiconductor device of one embodiment of the present invention.

FIG. 28A is a plan view showing an example of the pixel 211 with which a color image is obtained. The pixel 211 illustrated in FIG. 28A includes a subpixel 212 provided with a color filter transmitting light with a red (R) wavelength band (also referred to "subpixel 212R"), a subpixel 212 provided with a color filter transmitting light with a green (G) wavelength band (also referred to "subpixel 212G"), and a subpixel 212 provided with a color filter transmitting light with a blue (B) wavelength band (also referred to "subpixel 212B"). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 28A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 28B:
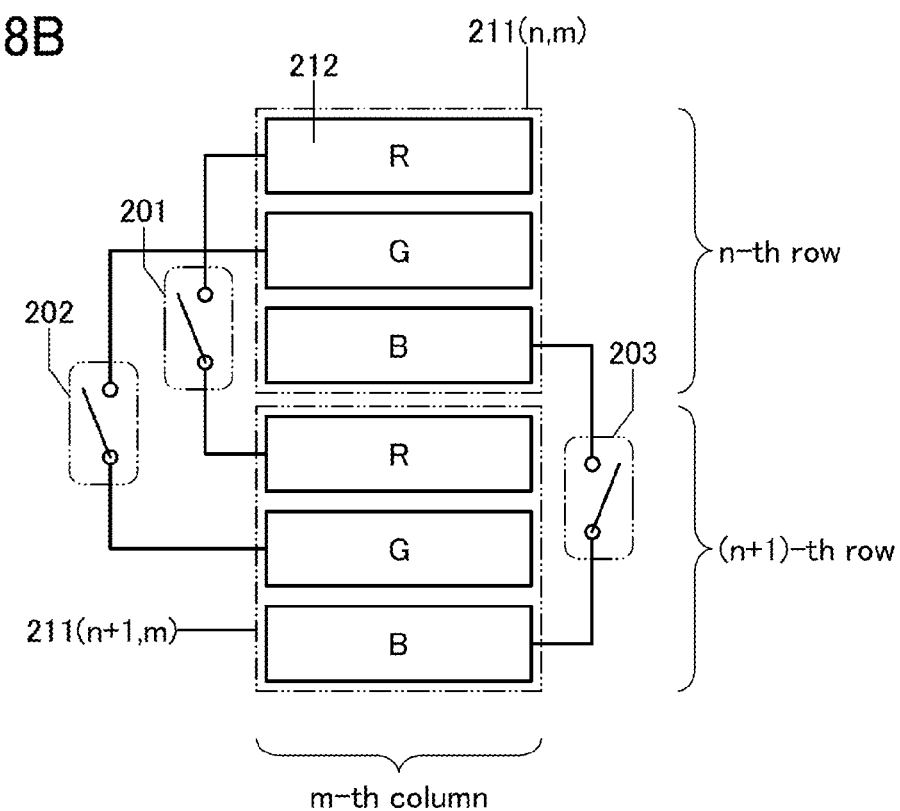

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 28B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 28B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 28A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, it is possible to employ the Bayer arrangement, in which the ratio of the number of pixels (the ratio of light-receiving areas) is set to red:green:blue=1:2:1. Alternatively, the pixel number ratio (the ratio of light receiving area) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light is incident on a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 29A and 29B. With the lens 255, the photoelectric conversion element can receive incident light efficiently. Specifically, as illustrated in FIG. 29A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with two-dotted chain lines, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 29B. When the light 256 enters the photoelectric conversion element 220 from the photoelectric conversion element 220 side, the imaging device 200 with high sensitivity can be provided.

Figure 29A:
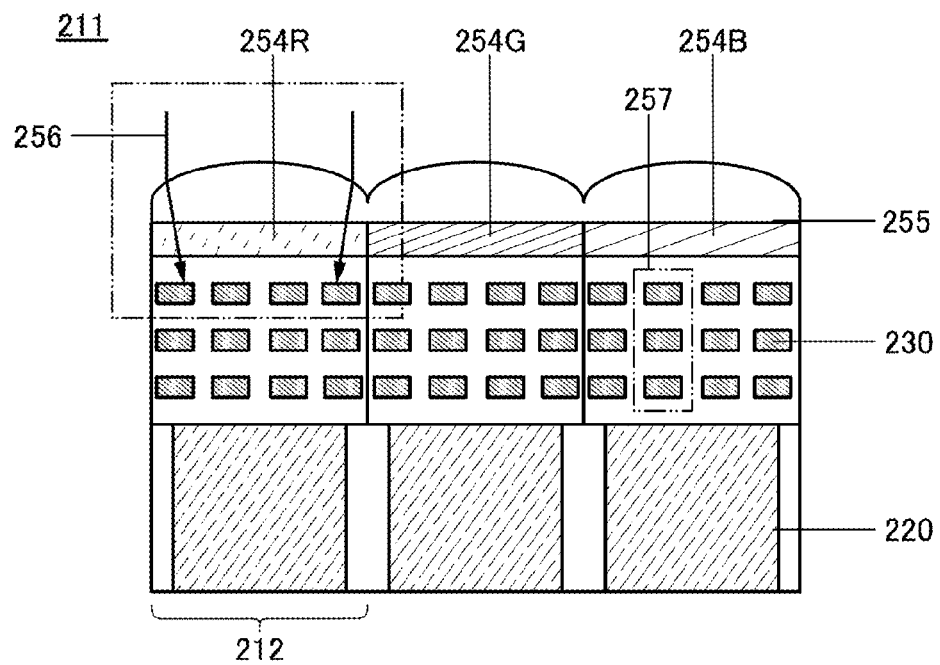
FIGS. 29A and 29B are cross-sectional views each illustrating a semiconductor device of one embodiment of the present invention.
Figure 29B:
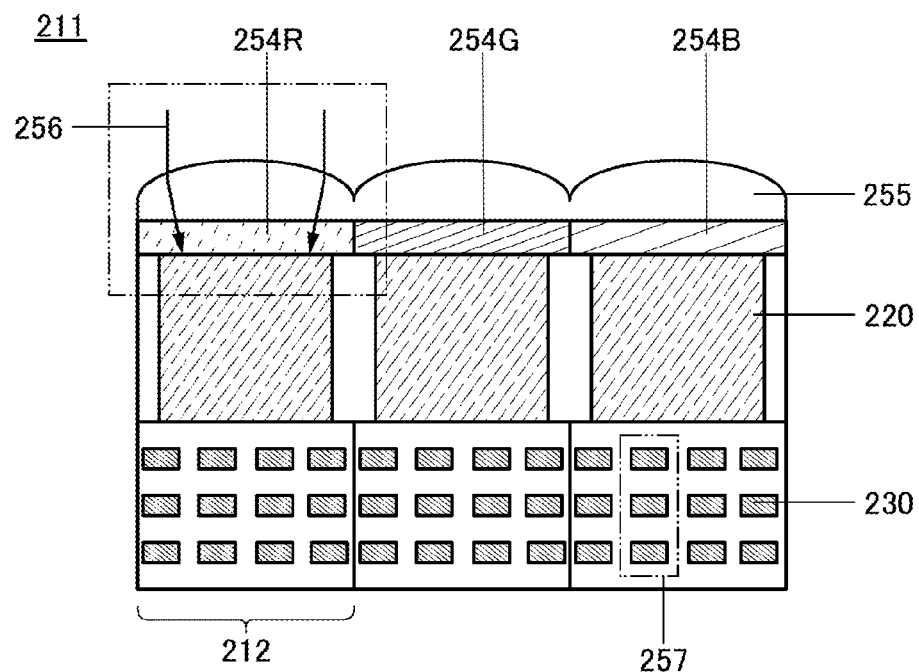

As the photoelectric conversion element 220 illustrated in FIGS. 29A and 29B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

The use of selenium for the photoelectric conversion element 220 enables the photoelectric conversion element 220 to have a favorable light absorption coefficient over a wide wavelength range including X-rays and gamma rays in addition to visible light, ultraviolet light, and infrared rays.

One pixel 211 included in the imaging device 200 may include the subpixel 212 with a first filter in addition to the subpixel 212 illustrated in FIGS. 28A and 28B.

<Configuration Example 2 of Pixel>

An example of a pixel including a transistor using silicon and a transistor using an oxide semiconductor is described below.

Figure 30A:
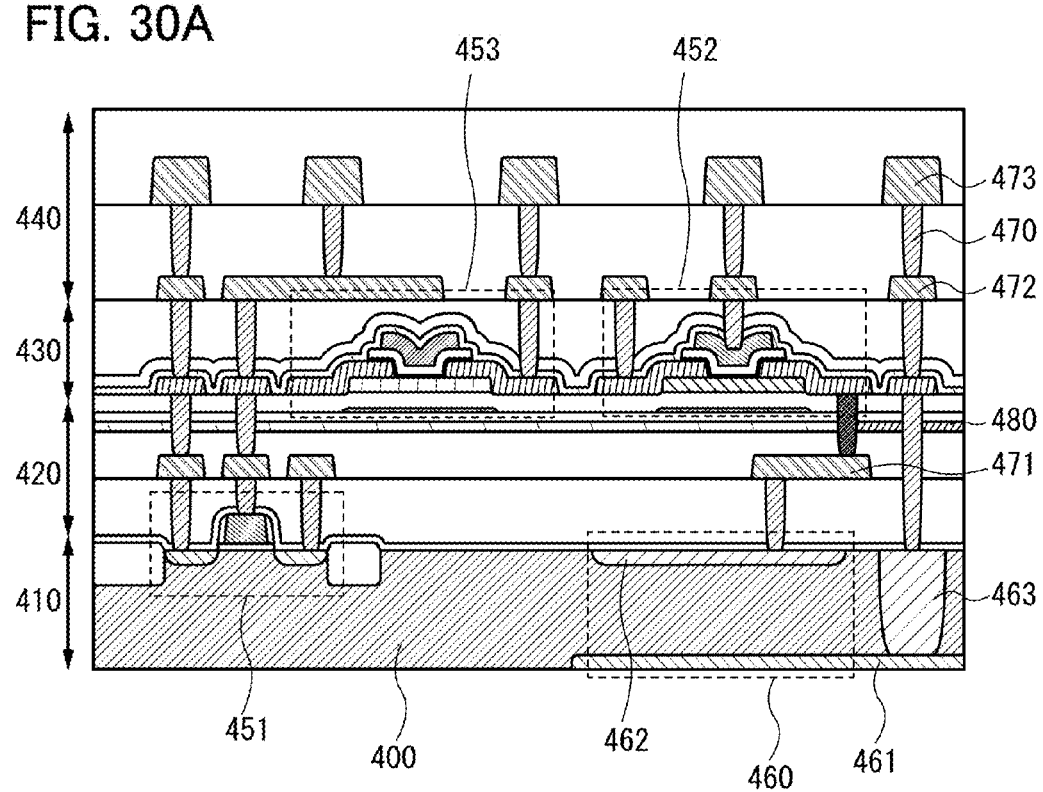
FIGS. 30A and 30B are cross-sectional views each illustrating a semiconductor device of one embodiment of the present invention.
Figure 30B:
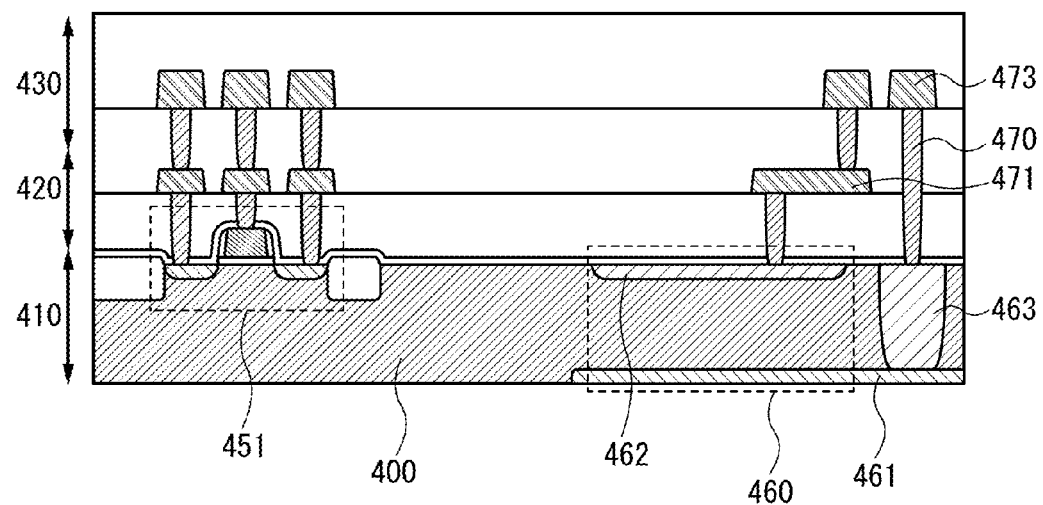

FIG. 30A and FIG. 30B are each a cross-sectional view of an element in an imaging device. The imaging device illustrated in FIG. 30A includes a transistor 451 including silicon over a silicon substrate 400, transistors 452 and 453 which include an oxide semiconductor and are stacked over the transistor 451, and a photodiode 460 provided in a silicon substrate 400. The transistors and the photodiode 460 are electrically connected to various plugs 470 and wirings 471. In addition, an anode 461 of the photodiode 460 is electrically connected to the plug 470 through a low-resistance region 463.

The imaging device includes a layer 410 including the transistor 451 provided on the silicon substrate 400 and the photodiode 460 provided in the silicon substrate 400, a layer 420 which is in contact with the layer 410 and includes the wirings 471, a layer 430 which is in contact with the layer 420 and includes the transistors 452 and 453, and a layer 440 which is in contact with the layer 430 and includes a wiring 472 and a wiring 473.

In the example of the cross-sectional view in FIG. 30A, a surface of the silicon substrate 400 opposite to a surface where the transistor 451 is formed includes a light-receiving surface of the photodiode 460. With such a structure, a light path can be secured without an influence of the transistors and the wirings. Thus, a pixel with a high aperture ratio can be formed. Note that the light-receiving surface can be the same as the surface where the transistor 451 is formed.

In the case of forming a pixel with use of transistors, the layer 410 may include the transistor. Alternatively, a structure in which the layer 410 is not provided and the pixel is formed using only transistors may be employed.

In the case of forming a pixel with use of transistors, the layer 430 may be omitted. An example of a cross-sectional view in which the layer 430 is not provided is shown in FIG. 30B.

Note that the silicon substrate 400 may be an SOI substrate. Furthermore, the silicon substrate 400 can be replaced with a substrate made of germanium, silicon germanium, silicon carbide, gallium arsenide, aluminum gallium arsenide, indium phosphide, gallium nitride, or an organic semiconductor.

Here, an insulating film 480 is provided between the layer 410 including the transistor 451 and the photodiode 460 and the layer 430 including the transistors 452 and 453. However, there is no limitation on the position of the insulating film 480.

Hydrogen in an insulating film provided in the vicinity of a channel formation region of the transistor 451 terminates dangling bonds of silicon; accordingly, the reliability of the transistor 451 can be improved. In contrast, hydrogen in the insulating film provided in the vicinity of the transistor 452, the transistor 453, and the like becomes one of factors generating a carrier in the oxide semiconductor film. Thus, the hydrogen may cause a reduction of the reliability of the transistor 452 and the transistor 453. Therefore, in the case where the transistor using an oxide semiconductor film is provided over the transistor using a silicon-based semiconductor film, it is preferable that the insulating film 480 having a function of blocking hydrogen be provided between the transistors. When the hydrogen is confined below the insulating film 480, the reliability of the transistor 451 can be improved. In addition, the hydrogen can be prevented from being diffused from a part below the insulating film 480 to a part above the insulating film 480; thus, the reliability of the transistor 452 and the transistor 453 can be increased.

For the insulating film 480, the description of the insulating film 508 is referred to, for example.

In the cross-sectional view of FIG. 30A, the photodiode 460 provided in the layer 410 and the transistors provided in the layer 430 can be formed to overlap each other. This structure can increase the degree of integration of pixels. In other words, the resolution of the imaging device can be increased.

As illustrated in FIG. 31A1 and FIG. 31B1, part or the whole of the imaging device can be bent. FIG. 31A1 illustrates a state in which the imaging device is bent in the direction of two-dotted chain line X1-X2. FIG. 31A2 is a cross-sectional view illustrating a portion indicated by two-dotted chain line X1-X2 in FIG. 31A1. FIG. 31A3 is a cross-sectional view illustrating a portion indicated by two-dotted chain line Y1-Y2 in FIG. 31A1.

FIG. 31B1 illustrates a state where the imaging device is bent in the direction of two-dotted chain line X3-X4 and the direction of two-dotted chain line Y3-Y4. FIG. 31B2 is a cross-sectional view illustrating a portion indicated by two-dotted chain line X3-X4 in FIG. 31B1. FIG. 31B3 is a cross-sectional view illustrating a portion indicated by two-dotted chain line Y3-Y4 in FIG. 31B1.

The bent imaging device enables the curved field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 32:
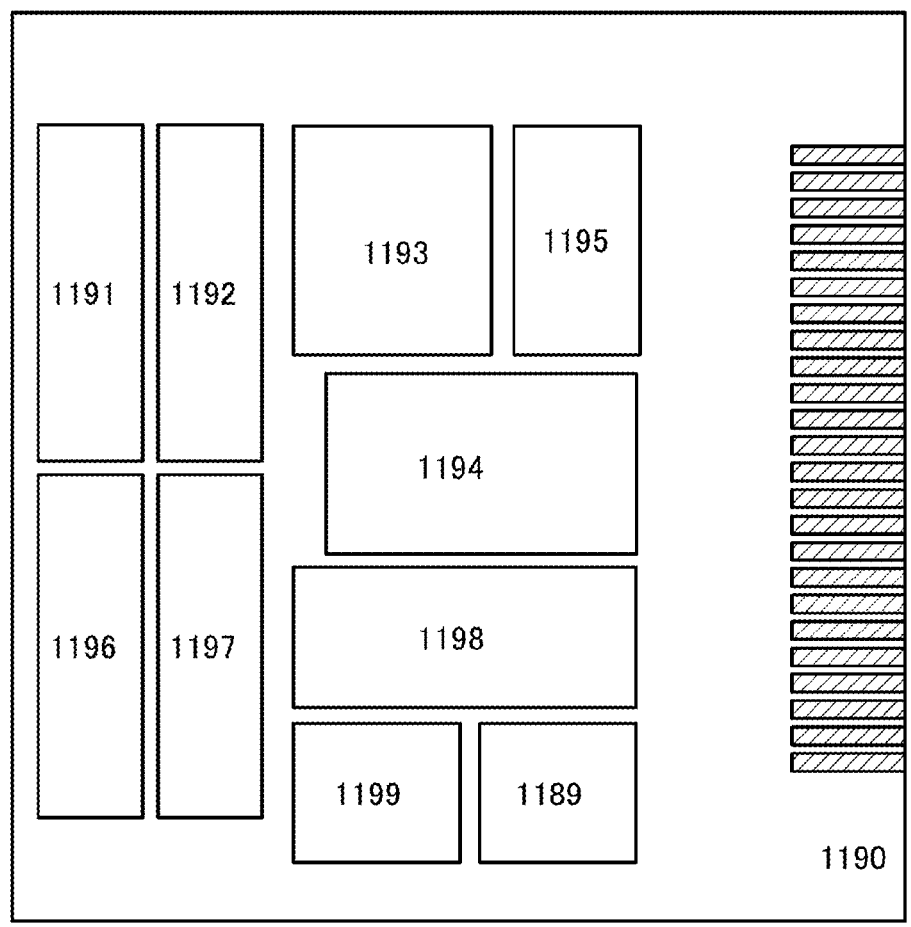
FIG. 32 is a block diagram illustrating a semiconductor device of one embodiment of the present invention.

FIG. 32 is a block diagram illustrating a configuration example of a CPU including any of the above-described transistors as a component.

The CPU illustrated in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example in which the configuration has been simplified, and an actual CPU may have various configurations depending on the application. For example, the CPU may have the following configuration: a structure including the CPU illustrated in FIG. 32 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 32, a memory cell is provided in the register 1196. For the memory cell of the register 1196, any of the above-described transistors, the above-described memory device, or the like can be used.

In the CPU illustrated in FIG. 32, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 33:
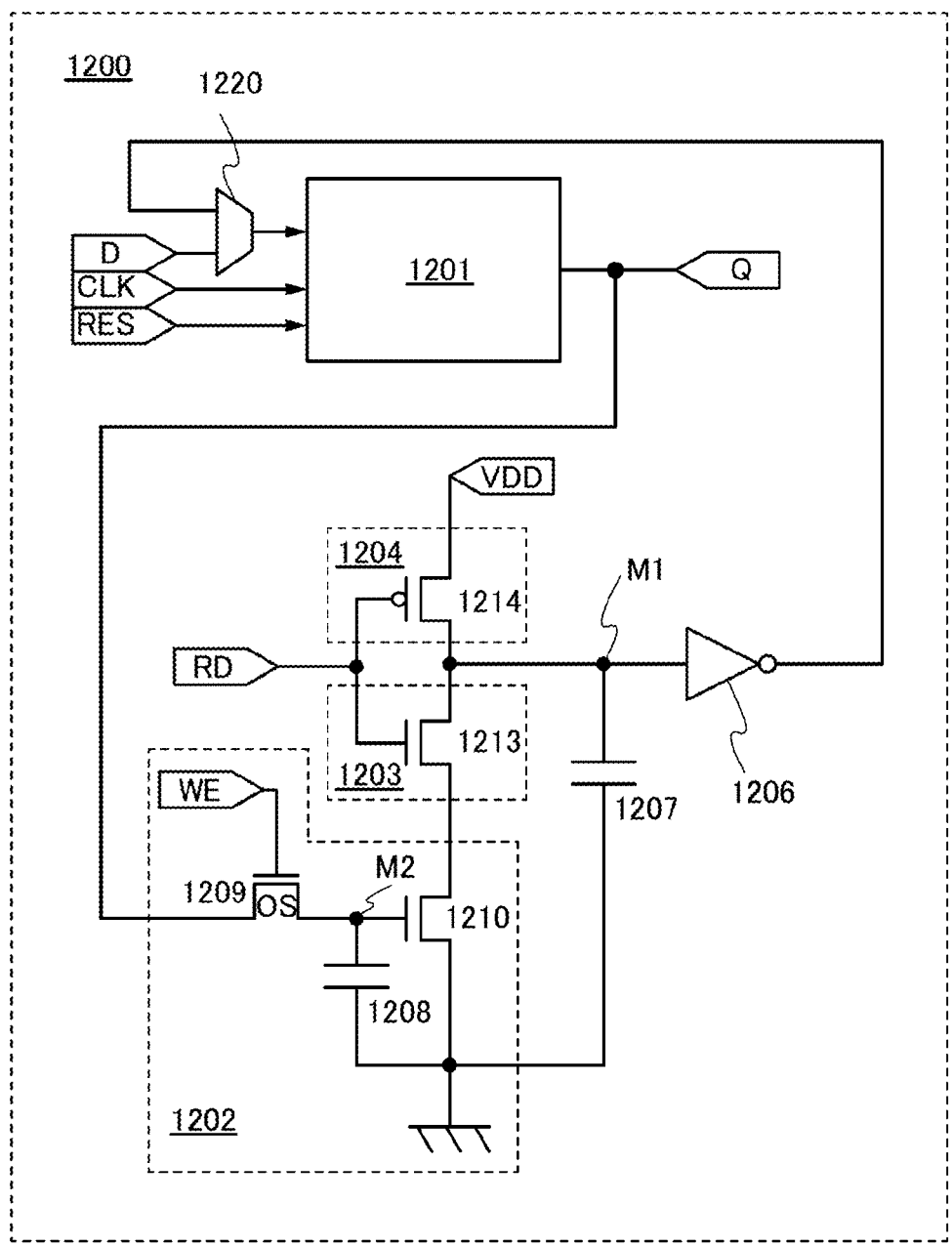
FIG. 33 is a circuit diagram of a semiconductor device of one embodiment of the present invention.

FIG. 33 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 33 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 33, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 33, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer using a semiconductor other than an oxide semiconductor or in the substrate 1190 can be used for the rest of the transistors.

As the circuit 1201 in FIG. 33, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU in this embodiment, the memory element 1200 can also be used in an LSI such as a digital signal processor (DSP), a custom LSI, a programmable logic device (PLD), or a field programmable gate array (FPGA), and a radio frequency (RF) device.

<Display Device>

A display device of one embodiment of the present invention is described below with reference to FIGS. 34A to 34C and FIGS. 35A and 35B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (such a display device is also referred to as EL display device) and a display device including a liquid crystal element (such a display device is also referred to as liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 34A:
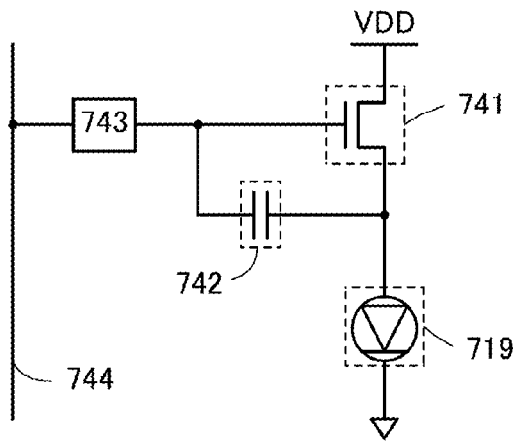
FIGS. 34A to 34C are a circuit diagram, a top view, and a cross-sectional view illustrating a semiconductor device of one embodiment of the present invention.
Figure 34B:
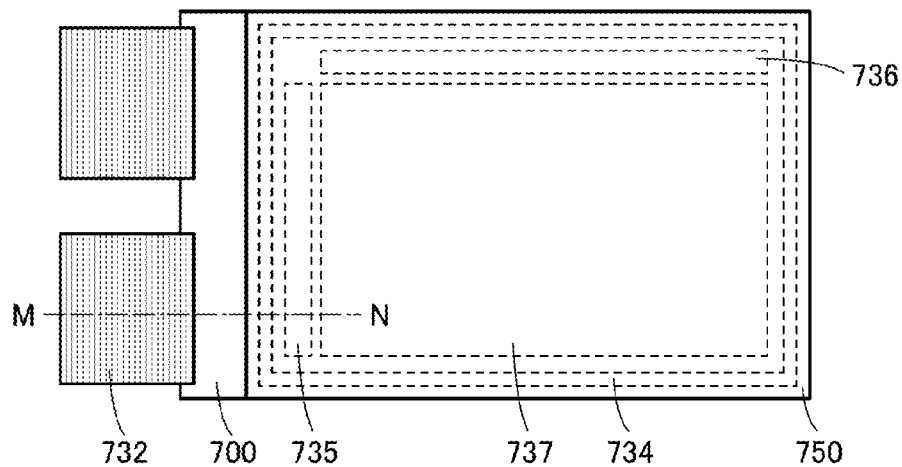
Figure 34C:
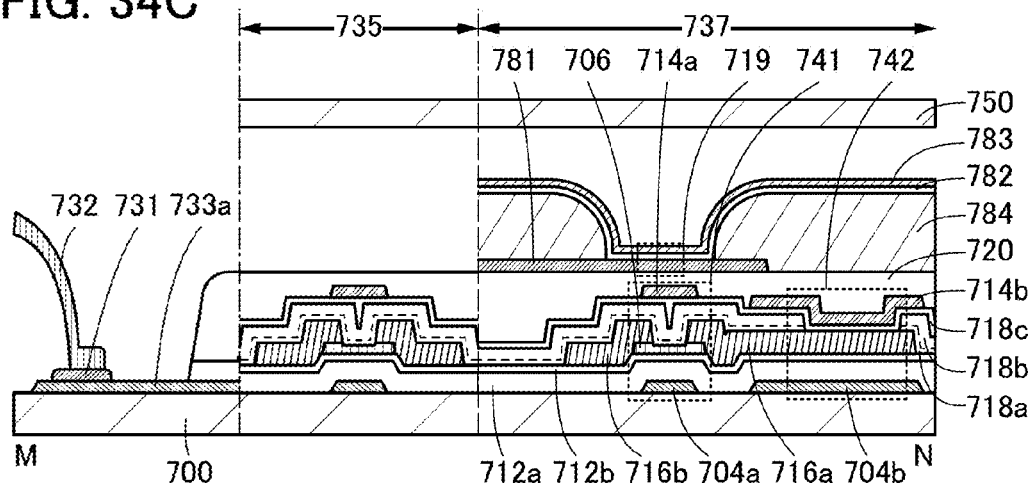

FIGS. 34A to 34C illustrate an example of an EL display device according to one embodiment of the present invention. FIG. 34A is a circuit diagram of a pixel in an EL display device. FIG. 34B is a top view showing the whole of the EL display device. FIG. 34C is a cross-sectional view taken along part of dashed-dotted line M-N in FIG. 34B.

FIG. 34A illustrates an example of a circuit diagram of a pixel used in an EL display device.

The EL display device illustrated in FIG. 34A includes a switching element 743, a transistor 741, a capacitor 742, and a light-emitting element 719.

Note that FIG. 34A and the like each illustrate an example of a circuit structure; therefore, a transistor can be provided additionally. In contrast, for each node in FIG. 34A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other electrode of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switch element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 34B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 34C is a cross-sectional view of part of the EL display device taken along the dashed-dotted line M-N in FIG. 34B.

FIG. 34C illustrates a structure of the transistor 741 including the following components: a conductive film 704a over the substrate 700; an insulating film 712a over the conductive film 704a; an insulating film 712b over the insulating film 712a; a semiconductor film 706 that is over the insulating film 712b and overlaps with the conductive film 704a; a conductive film 716a and a conductive film 716b in contact with the semiconductor film 706; an insulating film 718a over the semiconductor film 706, the conductive film 716a, and the conductive film 716b; an insulating film 718b over the insulating film 718a; an insulating film 718c over the insulating film 718b; and a conductive film 714a that is over the insulating film 718c and overlaps with the semiconductor film 706. Note that the structure of the transistor 741 is just an example; the transistor 741 may have a structure different from that illustrated in FIG. 34C.

Thus, in the transistor 741 illustrated in FIG. 34C, the conductive film 704a functions as a gate electrode, the insulating film 712a and the insulating film 712b function as a gate insulating film, the conductive film 716a functions as a source electrode, the conductive film 716b functions as a drain electrode, the insulating film 718a, the insulating film 718b, and the insulating film 718c function as a gate insulating film, and the conductive film 714a serves as a gate electrode. Note that in some cases, electrical characteristics of the semiconductor film 706 change if light enters the semiconductor film 706. To prevent this, it is preferable that one or more of the conductive film 704a, the conductive film 716a, the conductive film 716b, and the conductive film 714a have a light-blocking property.

Note that the interface between the insulating film 718a and the insulating film 718b is indicated by a broken line. This means that the boundary between them is not clear in some cases. For example, in the case where the insulating film 718a and the insulating film 718b are formed using insulating films of the same kind, the insulating film 718a and the insulating film 718b are not distinguished from each other in some cases depending on an observation method.

FIG. 34C illustrates a structure of the capacitor 742 including the following components: a conductive film 704b over the substrate; the insulating film 712a over the conductive film 704b; the insulating film 712b over the insulating film 712a; the conductive film 716a that is over the insulating film 712b and overlaps with the conductive film 704b; the insulating film 718a over the conductive film 716a; the insulating film 718b over the insulating film 718a; the insulating film 718c over the insulating film 718b; and a conductive film 714b that is over the insulating film 718c and overlaps with the conductive film 716a. In the structure, a part of the insulating film 718a and a part of the insulating film 718b are removed in a region where the conductive film 716a and the conductive film 714b overlap with each other.

In the capacitor 742, each of the conductive film 704b and the conductive film 714b serves as one electrode, and the conductive film 716a serves as the other electrode.

Thus, the capacitor 742 can be formed using a film of the transistor 741. The conductive film 704a and the conductive film 704b are preferably formed using the same type of conductive film. In that case, the conductive film 704a and the conductive film 704b can be formed in the same step. Furthermore, it is preferable that the film 714a and the conductive film 714b be the same type of conductive film. In that case, the conductive film 714a and the conductive film 714b can be formed in the same step.

The capacitor 742 illustrated in FIG. 34C has a large capacitance per area occupied by the capacitor. Therefore, the EL display device illustrated in FIG. 34C has high display quality. Note that although the capacitor 742 illustrated in FIG. 34C has the structure in which the part of the insulating film 718a and the part of the insulating film 718b are removed to reduce the thickness of the region where the conductive film 716a and the conductive film 714b overlap with each other, the structure of the capacitor according to one embodiment of the present invention is not limited to the structure. For example, a structure in which a part of the insulating film 718c is removed to reduce the thickness of the region where the conductive film 716a and the conductive film 714b overlap with each other may be used.

An insulating film 720 is provided over the transistor 741 and the capacitor 742. Here, the insulating film 720 may have an opening reaching the conductive film 716a that serves as the source electrode of the transistor 741. A conductive film 781 is provided over the insulating film 720. The conductive film 781 may be electrically connected to the transistor 741 through the opening in the insulating film 720.

A partition wall 784 having an opening reaching the conductive film 781 is provided over the conductive film 781. A light-emitting layer 782 in contact with the conductive film 781 through the opening provided in the partition wall 784 is provided over the partition wall 784. A conductive film 783 is provided over the light-emitting layer 782. A region where the conductive film 781, the light-emitting layer 782, and the conductive film 783 overlap with one another serves as the light-emitting element 719.

So far, examples of the EL display device are described. Next, an example of a liquid crystal display device is described.

Figure 35A:
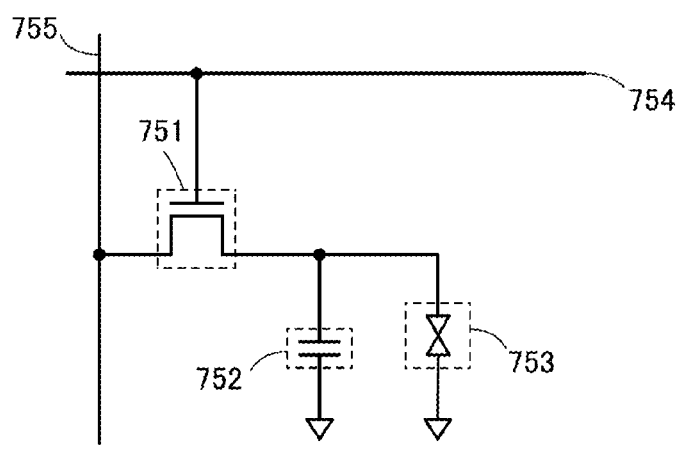
FIGS. 35A and 35B are a circuit diagram and a cross-sectional view illustrating a semiconductor device of one embodiment of the present invention.

FIG. 35A is a circuit diagram illustrating a configuration example of the pixel of a liquid crystal display device. A pixel shown in FIGS. 35A and 35B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 35B:
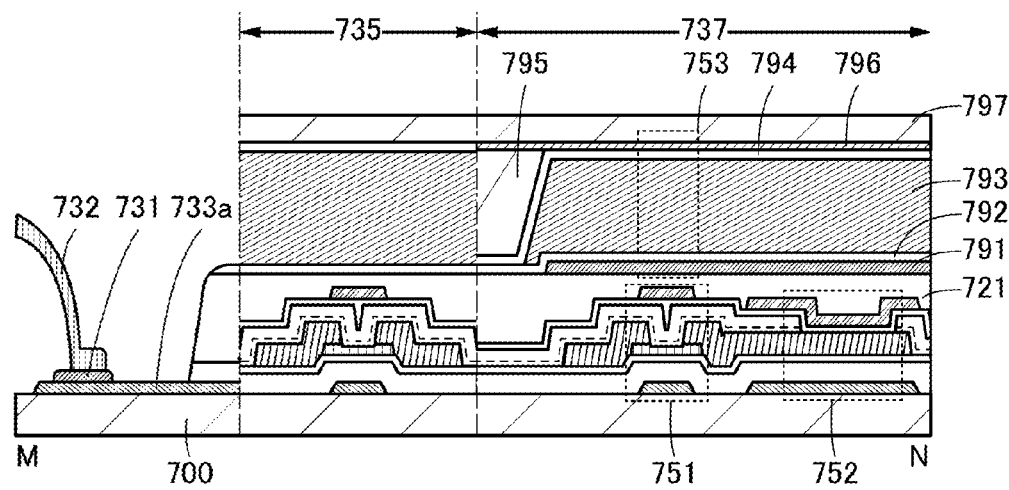

Note the description of the liquid crystal display device is made on the assumption that the top view of the liquid crystal display device is similar to that of the EL display device. A cross-sectional view of the liquid crystal display device taken along dashed-dotted line M-N in FIG. 34B is illustrated in FIG. 35B. In FIG. 35B, the FPC 732 is connected to the wiring 733a through the terminal 731. Note that the wiring 733a may be formed using the same kind of conductive film as the conductive film of the transistor 751 or using the same kind of semiconductor film as the semiconductor film of the transistor 751.

For the transistor 751, the description of the transistor 741 is referred to. For the capacitor 752, the description of the capacitor 742 is referred to. Note that the structure of the capacitor 742 in FIG. 34C corresponds to, but is not limited to, the structure of the capacitor 752 in FIG. 35B.

Note that in the case where an oxide semiconductor film is used as the semiconductor film of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulating film 721 is provided over the transistor 751 and the capacitor 752. The insulating film 721 has an opening reaching the transistor 751. A conductive film 791 is provided over the insulating film 721. The conductive film 791 is electrically connected to the transistor 751 through the opening in the insulating film 721.

An insulating film 792 serving as an alignment film is provided over the conductive film 791. A liquid crystal layer 793 is provided over the insulating film 792. An insulating film 794 serving as an alignment film is provided over the liquid crystal layer 793. A spacer 795 is provided over the insulating film 794. A conductive film 796 is provided over the spacer 795 and the insulating film 794. A substrate 797 is provided over the conductive film 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an MN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such an electronic device are illustrated in FIGS. 36A to 36F.

Figure 36A:
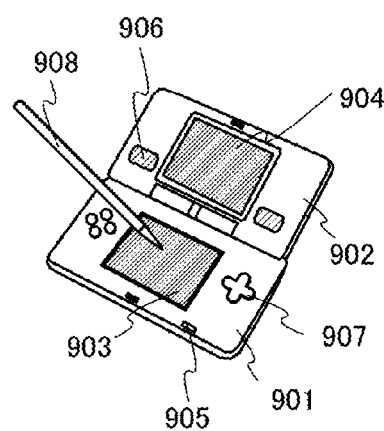
FIGS. 36A to 36F illustrate electronic devices of one embodiment of the present invention.

FIG. 36A illustrates a portable game console including a housing 901, a housing 902, a display portion 903, a display portion 904, a microphone 905, a speaker 906, an operation key 907, a stylus 908, and the like. Although the portable game machine in FIG. 36A has the two display portions 903 and 904, the number of display portions included in the portable game machine is not limited to this.

Figure 36B:
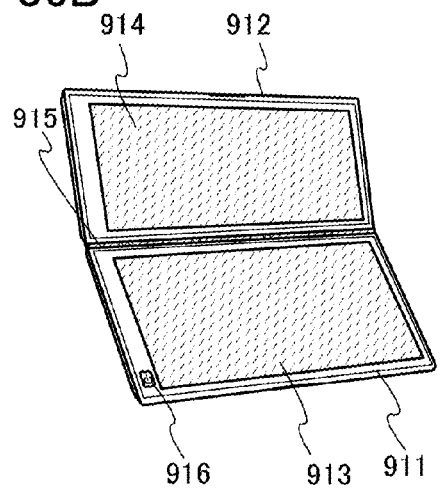

FIG. 36B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 36C:
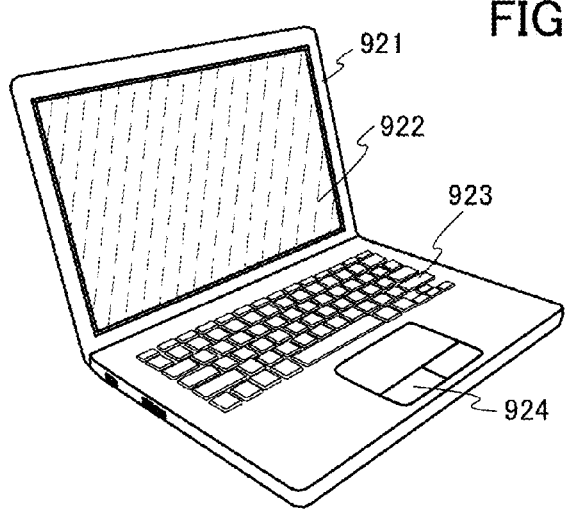

FIG. 36C illustrates a laptop personal computer, which includes a housing 921, a display portion 922, a keyboard 923, a pointing device 924, and the like.

Figure 36D:
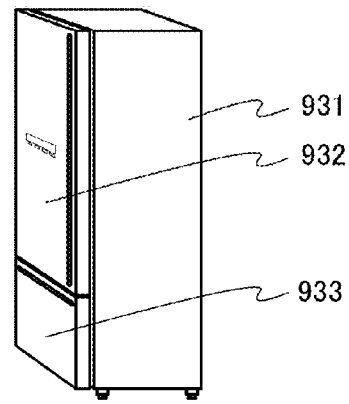

FIG. 36D illustrates the electric refrigerator-freezer including a housing 931, a door for a refrigerator 932, a door for a freezer 933, and the like.

Figure 36E:
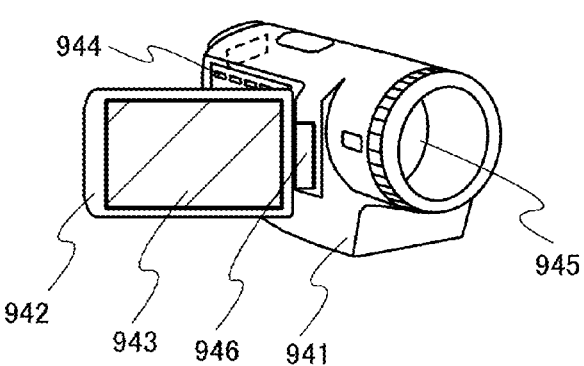

FIG. 36E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 36F:
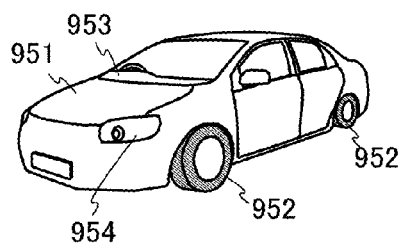

FIG. 36F illustrates a passenger car, which includes a car body 951, wheels 952, a dashboard 953, lights 954, and the like.

EXAMPLE 1

In this example, shown is an example in which examination by a microwave photoconductive decay method is performed on samples including an oxide semiconductor film provided over a substrate and an insulating film provided over the oxide semiconductor film.

A method for manufacturing Sample A1, Sample A2, Sample A3, Sample A4, and Sample A5 subjected to a microwave photoconductive decay method is described.

First, a quartz substrate with a thickness of 1.1 mm was prepared as a substrate. Next, as an oxide semiconductor film, a 100-nm-thick In—Ga—Zn oxide was deposited. Next, heat treatment was performed at 450° C. for an hour in a nitrogen atmosphere. Next, heat treatment was performed at 450° C. for an hour in an oxygen atmosphere. Next, as an insulating film, a 20-nm-thick silicon oxynitride film was formed. Through the steps, Sample A1 to Sample A5 were formed.

The In—Ga—Zn oxide was deposited by a sputtering method with use of an In—Ga—Zn oxide target whose atomic ratio of In, Ga, and Zn was 1:1:1. As a deposition gas, a gas in which argon and oxygen were mixed to have a volume of oxygen of 33% was used. The pressure in deposition was adjusted to 0.7 Pa with Miniature Gauge MG-2 manufactured by CANON ANELVA CORPORATION. The deposition power was set to 0.5 kW with use of a DC power source. The substrate temperature was 300° C.

The silicon oxynitride film was deposited by a PECVD method. As a deposition gas, a gas in which monosilane and nitrous oxide were mixed to have a volume ratio of 1:800 was used. The pressure in the deposition was adjusted to be 200 Pa. The deposition power was set to 150 W with use of a high-frequency power source with a frequency of 60 MHz. The substrate temperature was 350° C.

Note that Gap in deposition of the silicon oxynitride film was set to 16 mm (Sample A1), 20 mm (Sample A2), 24 mm (Sample A3), 28 mm (Sample A4), and 32 mm (Sample A5).

Figure 37:
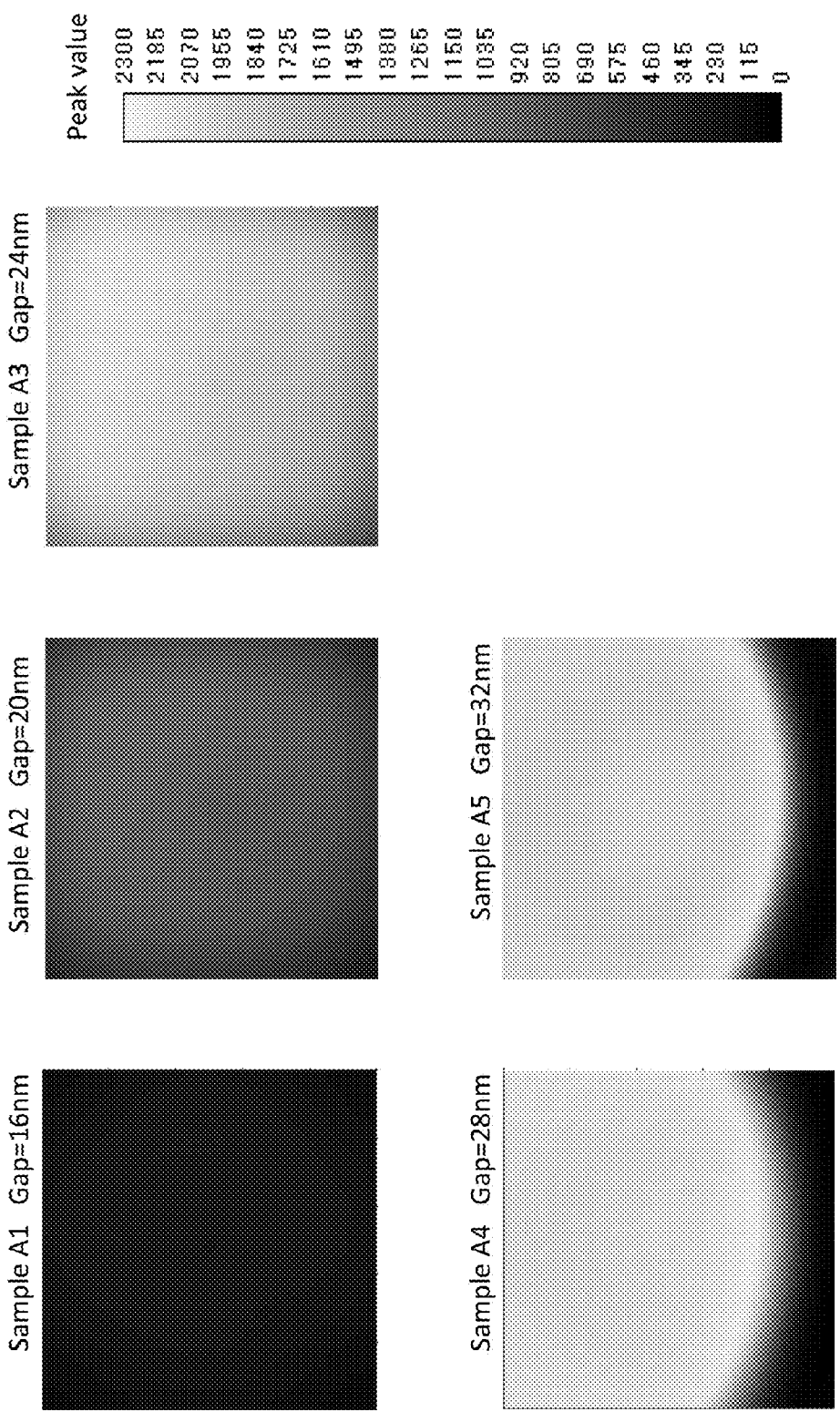
FIG. 37 shows in-plane distribution of peak values of resistivity of microwave examined by a microwave photoconductive decay method.

Next, Sample A1 to Sample A5 were examined by a microwave photoconductive decay method. FIG. 37 shows in-plane distribution of peak values of reflectivity of microwaves in oxide semiconductor films in Sample A1 to Sample A5. As the excitation light, a third harmonic of a laser using, as a laser medium, yttrium lithium fluoride to which neodymium was added (YLF-3HG with a wavelength of 349 nm) was used. For the examination by a microwave photoconductive decay method, a system for evaluation of low temperature poly silicon and SiC (LTA-1800SP) manufactured by KOBELCO RESEARCH INSTITUTE, INC. was used.

Figure 38:
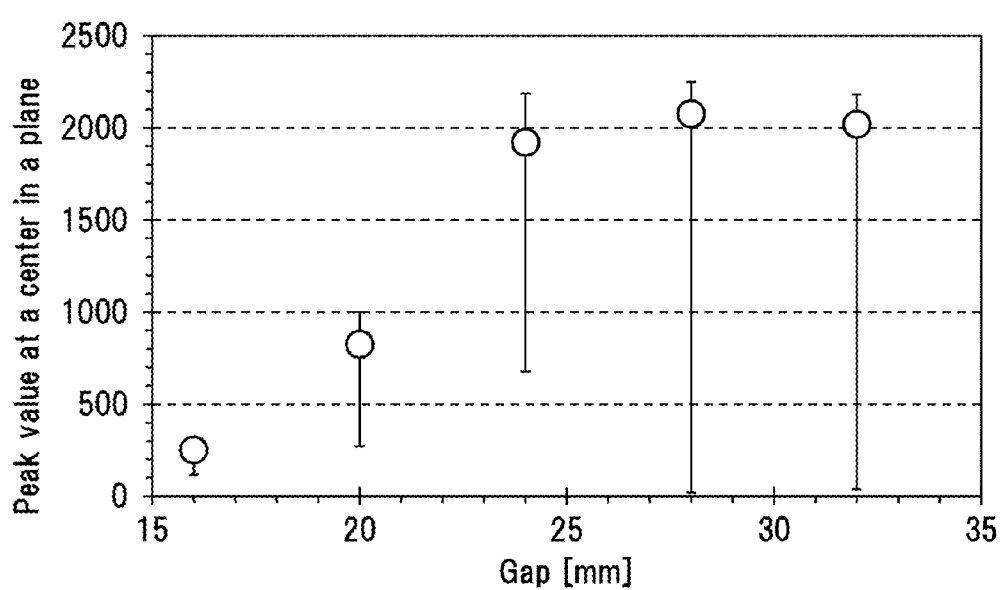
FIG. 38 shows a relation between a peak value of resistivity of microwave and Gap.

FIG. 38 shows peak values of reflectivity of microwaves at centers in planes of Sample A1 to Sample A5. In the graph, the tops of error bars each indicate the maximum value in the plane, and the bottoms of error bars each indicate the minimum value in the plane.

According to FIG. 37 and FIG. 38, when Gap at the time of deposition of the silicon oxynitride film was large, the peak values of reflectivity of microwaves in planes widely vary, and the distribution of the peak values hardly changes. In contrast, when the Gap was reduced to be less than 28 mm, variation in peak values of reflectivity of microwaves in planes became small. Note that when Gap was less than or equal to 20 mm, a variation in peak values of reflectivity of microwaves in planes was small, but the peak values of reflectivity of microwaves in an entire plane of the oxide semiconductor film were small.

Figure 39:
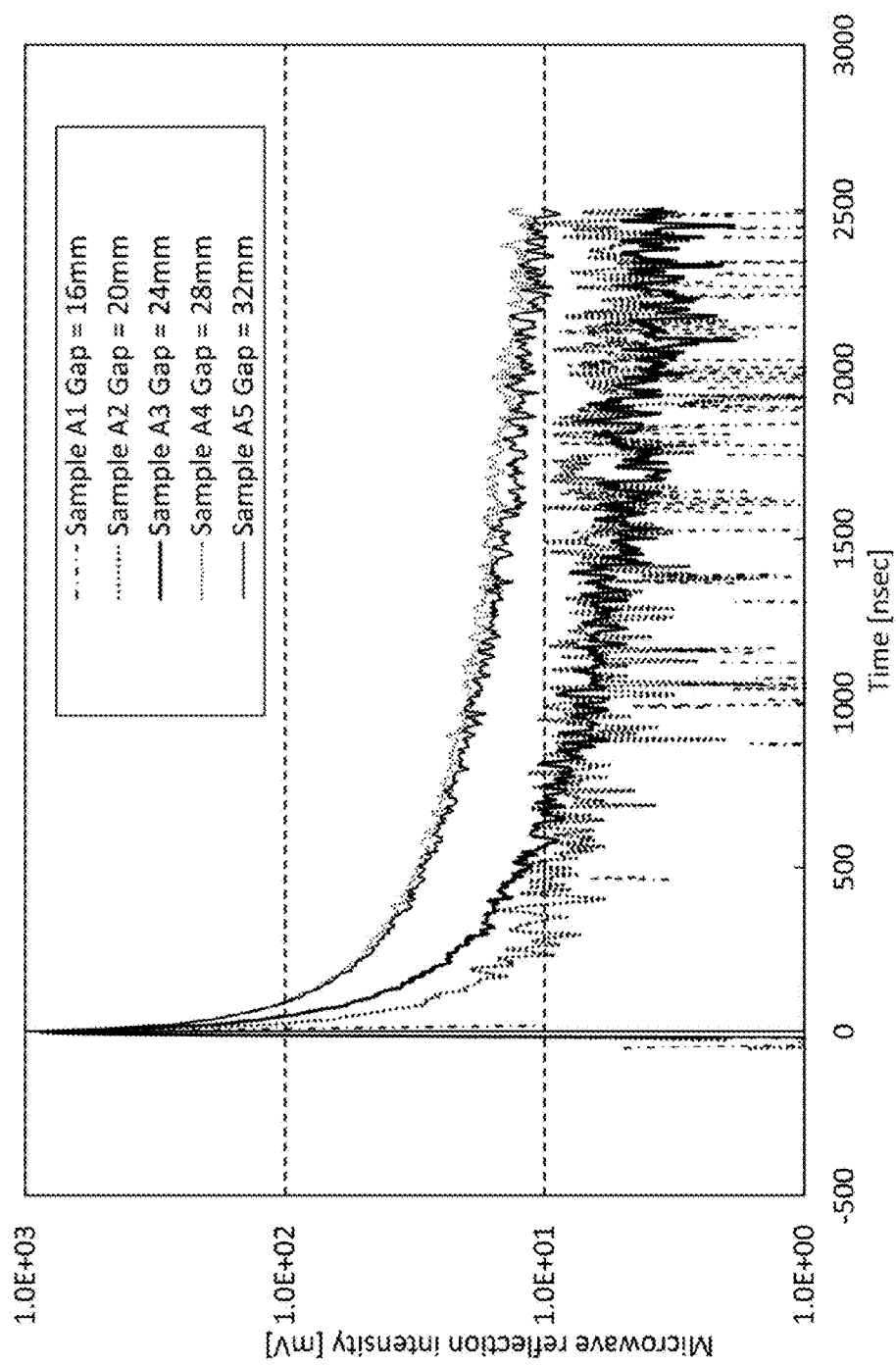
FIG. 39 shows attenuation curves of the microwave reflection intensities.

FIG. 39 shows changes over time (also referred to as attenuation curve) of the microwave reflection intensities in Sample A1 to Sample A5, obtained by a microwave photoconductive decay method.

The microwave reflection intensity was adjusted so as to have a maximum peak value when the time t was 0. Each peak value on the attenuation curve in FIG. 39 is not an original value of microwave reflection intensity but a value obtained by multiplying the original value by a value calculated by "GAN setting" with the apparatus used for examination by a microwave photoconductive decay method. Note that "GAN setting" is a setting automatically determined by the apparatus so that values on the vertical axis of attenuation curve have the same digit number. In other words, the peak value on the attenuation curve shown in FIG. 39 is multiplied by an inverse number of the value determined by "GAIN setting", whereby an original value of the microwave reflection intensity can be obtained. Table 1 below shows an original value of microwave reflection intensity (peak value) shown in FIG. 39, τ1, τ2, and stretched exponential coefficient β included in a fitting formula (shown below) of attenuation curve.

$$R(t) = R_0 \left\{ \exp\left(-\frac{t}{\tau_1}\right) + \exp\left[\left(-\frac{t}{\tau_2}\right)^\beta\right] \right\} \quad \text{[Formula 3]}$$

TABLE 1

| | Peak Value [mV] | τ1 [nsec] | τ2 [nsec] | β |
|---|---|---|---|---|
| Gap 16 mm | — | — | — | — |
| Gap 20 mm | — | — | — | — |
| Gap 24 mm | 1874 | 33.17 | 12.79 | 0.27 |
| Gap 28 mm | 2058 | 43.69 | 30.90 | 0.25 |
| Gap 32 mm | 2021 | 43.02 | 32.02 | 0.27 |

Note that the peak value, τ1, τ2, and β in the case where Gap is less than or equal to 20 mm are not shown because an adverse effect of noise of the attenuation curves in FIG. 39 is considerable, and accordingly fitting is difficult.

Figure 40:
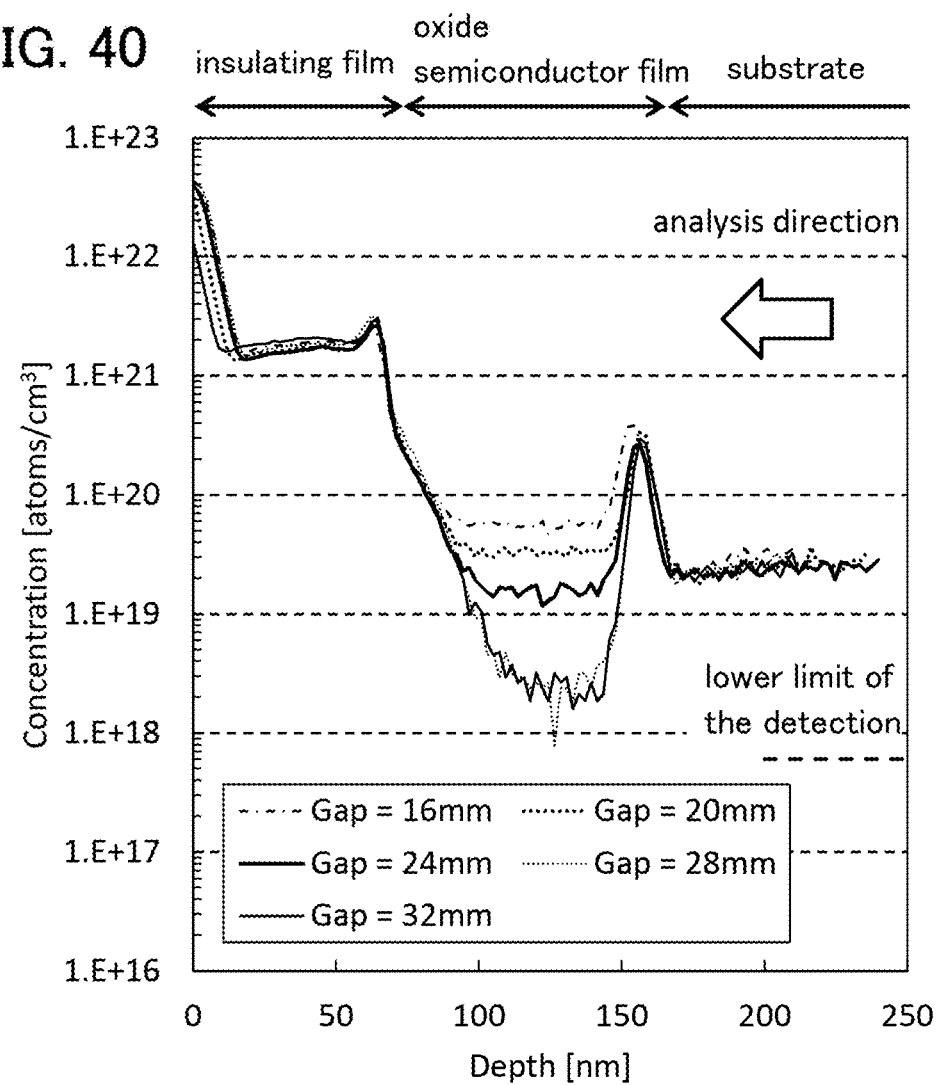
FIG. 40 shows depth profiles of hydrogen concentrations of samples in Example.

In addition, estimation of hydrogen concentration was performed on Sample A1 to Sample A5. In the estimation of hydrogen concentration, a SIMS analysis apparatus was used for measurement. FIG. 40 shows a depth profile of hydrogen concentration of Sample A1 to Sample A5.

According to FIG. 39, as Gap becomes smaller, the density of excessive carrier is decreased fast (i.e., the attenuation curve shifts on the lower side). When Gap is less than or equal to 24 mm, an adverse effect of noise markedly appears on the attenuation curves. According to FIG. 40, as Gap is smaller, the hydrogen concentration in the oxide semiconductor film is increased.

Figure 41:
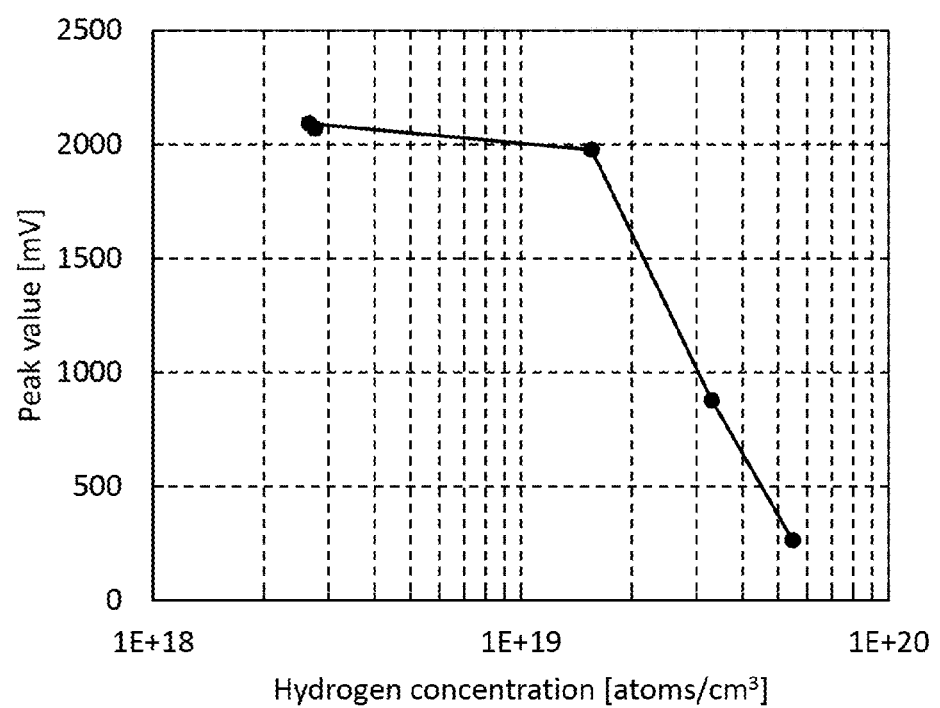
FIG. 41 shows a relation between the hydrogen concentration in an oxide semiconductor film and a peak value of resistivity of microwave.

FIG. 41 shows a relation between the peak value of reflectivity of microwave in FIG. 39 and the hydrogen concentration in the oxide semiconductor film in FIG. 40. The hydrogen concentration in the oxide semiconductor film indicates an average value of the depths of 110 nm to 130 nm in the graph shown in FIG. 40. A horizontal axis represents the hydrogen concentration in the oxide semiconductor film, the vertical axis represents the peak value of reflectivity of microwave, and data are plotted, so that a correlation therebetween can be examined.

According to FIG. 41, when the hydrogen concentration in the oxide semiconductor film is higher than or equal to $3.3 \times 10^{19}$ atoms/cm$^3$, the peak value of reflectivity of microwave can be noticeably decreased. The above result suggests that the preferable hydrogen concentration in the oxide semiconductor film is lower than $1.5 \times 10^{19}$ atoms/cm$^3$, and further preferable concentration is lower than $1 \times 10^{19}$ atoms/cm$^3$.

EXAMPLE 2

In this example, a relation between the spin density attributed to NO$_x$, in an insulating film and the spin density of signal attributed to VoH in the oxide semiconductor film was examined.

A method for manufacturing Sample B1, Sample B2, Sample B3, Sample B4, and Sample B5 used in this example is described.

First, as a substrate, a 0.5-mm-thick quartz substrate was prepared. Next, as an oxide semiconductor film, a 50-nm-thick In—Ga—Zn oxide was deposited. Next, heat treatment was performed at 450° C. for an hour in a nitrogen atmosphere. Next, heat treatment was performed at 450° C. for an hour in an oxygen atmosphere. Then, a 7.5-nm-thick silicon oxynitride film was formed as an insulating film, so that Sample B1 was completed. Alternatively, a silicon oxynitride film that is the same as that in Sample B1 was formed to a thickness of 10 nm, whereby Sample B2 was completed. Alternatively, a silicon oxynitride film that is the same as that in Sample B1 was formed to a thickness of 12.5 nm, whereby Sample B3 was completed. Alternatively, a silicon oxynitride film that is the same as that in Sample B1 was formed to a thickness of 15 nm, whereby Sample B4 was completed. Alternatively, a silicon oxynitride film that is the same as that in Sample B1 was formed to a thickness of 20 nm, whereby Sample B5 was completed.

The In—Ga—Zn oxide was deposited by a sputtering method with use of an In—Ga—Zn oxide target whose atomic ratio of In, Ga, and Zn was 1:1:1. As a deposition gas, a gas in which argon and oxygen were mixed to have a volume of oxygen of 33% was used. The pressure in deposition was adjusted to 0.7 Pa with Miniature Gauge MG-2 manufactured by CANON ANELVA CORPORATION. The deposition power was set to 0.5 kW with use of a DC power source. The substrate temperature was 300° C.

The silicon oxynitride film was deposited by a PECVD method. As a deposition gas, a gas in which monosilane and nitrous oxide were mixed to have a volume ratio of 1:800 was used. The pressure in the deposition was adjusted to be 200 Pa. The deposition power was 150 W with use of a high-frequency power source with a frequency of 60 MHz. The substrate temperature was 350° C. Gap was set to 28 mm.

Figure 42:
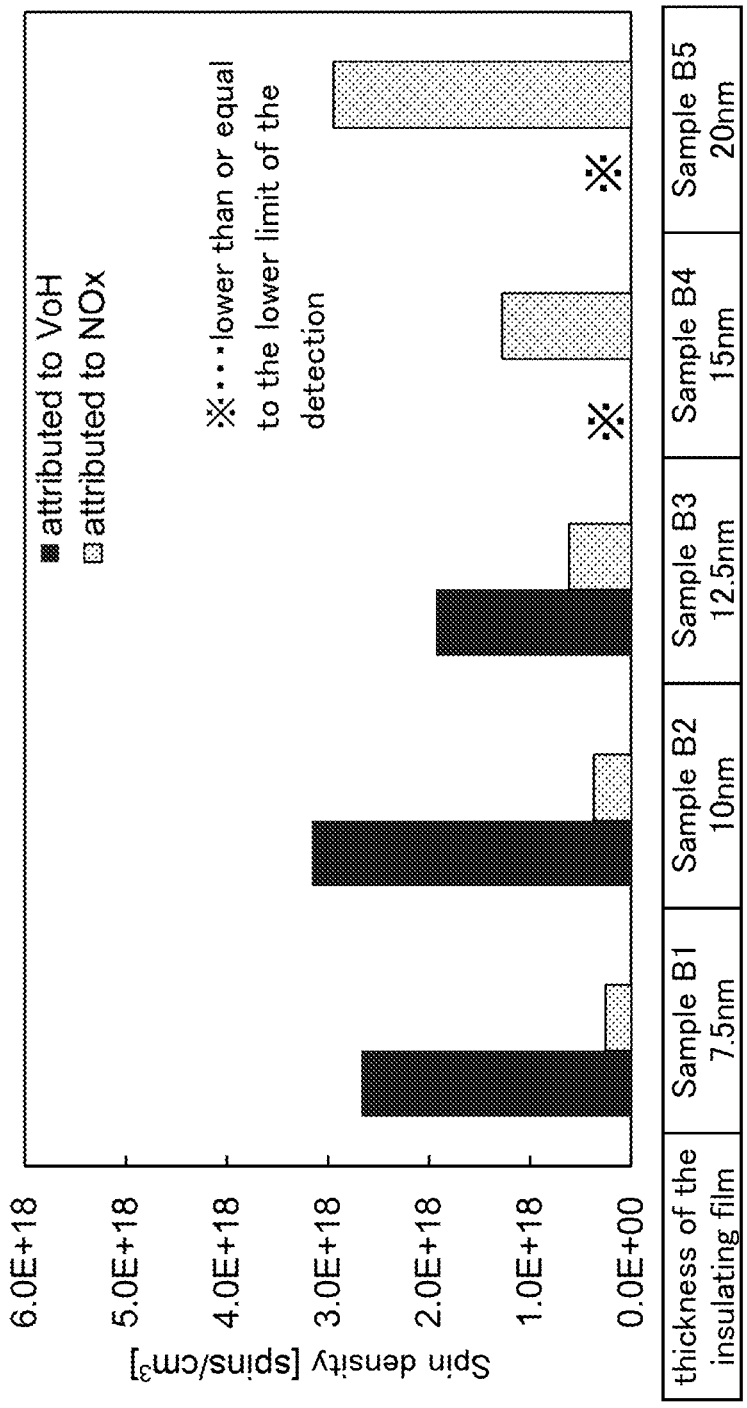
FIG. 42 shows spin densities examined by electron spin resonance.

Next, Sample B1 to Sample B5 were examined by ESR. Sample B1 to Sample B5 were located so that each film surface of the In—Ga—Zn oxide was perpendicular to a magnetic field. FIG. 42 shows the spin density of a signal of defect states (attributed to VoH) relating to signals that appear when the g-factor is in the vicinity of 1.93 in the oxide semiconductor film, and the spin density attributed to NO in the insulating film. For measurement by ESR, an electron spin resonance spectrometer JES-FA300 manufactured by JEOL Ltd. was used.

According to FIG. 42, as the insulating film is thinner, the spin density attributed to NO$_x$, is lower. Furthermore, under the condition where the thickness of the insulating film is greater than equal to 10 nm, as the insulating film is thicker, the spin density attributed to VoH is lower. When the thickness of the insulating film is greater than or equal to 15 nm, the spin density attributed to VoH is lower than or equal to the lower limit ($1.4 \times 10^{17}$ spins/cm$^3$) of the detection.

EXAMPLE 3

In this example, a relation between the spin density attributed to NO$_x$ in an insulating film and the spin density attributed to VoH in an oxide semiconductor film was evaluated, depending on presence or absence of plasma treatment after formation of the insulating film and a type of plasma treatment.

A method for manufacturing samples used in this example is described.

First, as a substrate, a 0.5-mm-thick quartz substrate was prepared. Next, as an oxide semiconductor film, a 50-nm-thick In—Ga—Zn oxide was deposited. Next, heat treatment was performed at 450° C. for an hour in a nitrogen atmosphere. Next, heat treatment was performed at 450° C. for an hour in an oxygen atmosphere. Next, a 10-nm-thick silicon oxynitride film was formed as the insulating film. Next, plasma treatment was performed. As plasma treatment, oxygen (O$_2$) plasma treatment or nitrous oxide (N$_2$O) plasma treatment was performed for 90 seconds, 180 seconds, or 300 seconds.

The In—Ga—Zn oxide was deposited by a sputtering method with use of an In—Ga—Zn oxide target whose atomic ratio of In, Ga, and Zn was 1:1:1. As a deposition gas, a gas in which argon and oxygen were mixed to have a volume of oxygen of 33% was used. The pressure in deposition was adjusted to 0.7 Pa with Miniature Gauge MG-2 manufactured by CANON ANELVA CORPORATION. The deposition power was set to 0.5 kW with use of a DC power source. The substrate temperature was 300° C.

The silicon oxynitride film was deposited by a PECVD method. As a deposition gas, a gas in which monosilane and nitrous oxide were mixed to have a volume ratio of 1:800 was used. The pressure in the deposition was adjusted to be 200 Pa. The deposition power was 150 W with use of a high-frequency power source with a frequency of 60 MHz. The substrate temperature was 350° C. Gap was set to 28 mm.

In the oxygen (O$_2$) plasma treatment, oxygen with a flow rate of 800 sccm was supplied to a reaction chamber in a PECVD apparatus by a PECVD method. The pressure in supplying oxygen was adjusted to be 200 Pa. The deposition power was set to 150 W with use of a high-frequency power source of 60 MHz. The substrate temperature was 350° C. Gap was set to 28 mm.

In the nitrous oxide (N$_2$O) plasma treatment, nitrous oxide with a flow rate of 800 sccm was supplied into a reaction chamber of a PECVD apparatus by a PECVD method. The pressure in supplying nitrous oxide was adjusted to be 200 Pa. The deposition power was set to 150 W with use of a high-frequency power source of 60 MHz. The substrate temperature was 350° C. Gap was set to 28 mm.

Figure 43:
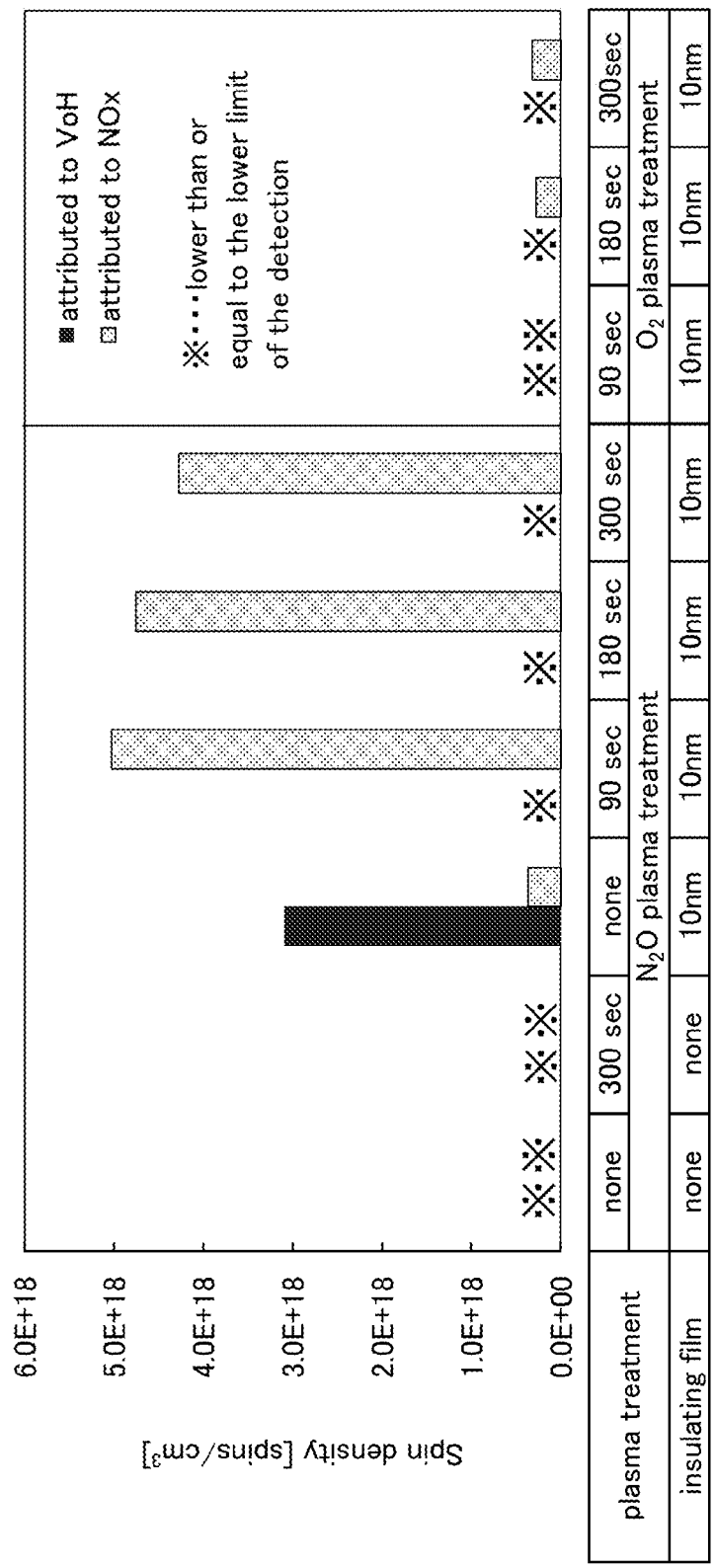
FIG. 43 shows spin densities examined by electron spin resonance.

Next, the samples were examined by ESR. Furthermore, a sample without an insulating film or a sample that has not been subjected to plasma treatment were also examined by ESR. The samples were located so that each film surface of the In—Ga—Zn oxide was perpendicular to a magnetic field. FIG. 43 shows the spin density of defect states (attributed to VoH) relating to signals that appear when the g-factor is in the vicinity of 1.93 in the oxide semiconductor film, and the spin density relating to signals attributed to NO$_x$ in the insulating film. For measurement by ESR, an electron spin resonance spectrometer JES-FA300 manufactured by JEOL Ltd. was used.

According to FIG. 43, $NO_x$ is formed in the insulating film during deposition of the insulating film, and VoH is generated in the oxide semiconductor film. Furthermore, with plasma treatment, the spin density (attributed to VoH in the oxide semiconductor film) is lower than or equal to the lower limit ($2.6 \times 10^{17}$ spins/cm$^3$) of the detection. Moreover, it can be confirmed that as the plasma treatment is performed for a longer time, the spin density attributed to VoH is decreased. Moreover, when the oxygen ($O_2$) plasma treatment and the nitrous oxide ($N_2O$) plasma treatment are compared, the oxygen ($O_2$) plasma treatment enables the spin density attributed to $NO_x$ to be further decreased, and a short period of time is preferable for performance of plasma treatment.

EXAMPLE 4

In this example, the spin density attributed to VoH in an oxide semiconductor film, caused by plasma treatment performed after formation of an insulating film, was examined. In this example, the oxide semiconductor film is a stacked film.

A method for manufacturing samples used in this example is described.

First, as a substrate, a 0.5-mm-thick quartz substrate was prepared. Next, as a first oxide semiconductor film, a 50-nm-thick In—Ga—Zn oxide was deposited. Next, heat treatment was performed at 450° C. for an hour in a nitrogen atmosphere. Next, heat treatment was performed at 450° C. for an hour in an oxygen atmosphere. Next, as a second oxide semiconductor film, a 5-nm-thick In—Ga—Zn oxide was deposited. Next, a 10-nm-thick oxynitride film was formed as an insulating film. Then, oxygen ($O_2$) plasma treatment was performed for 90 seconds, 180 seconds, or 300 seconds.

The In—Ga—Zn oxide that was used for the first oxide semiconductor film was deposited by a sputtering method with use of an In—Ga—Zn oxide target whose atomic ratio of In, Ga, and Zn was 1:1:1. As a deposition gas, a gas in which argon and oxygen were mixed to have a volume of oxygen of 33% was used. The pressure in deposition was adjusted to 0.7 Pa with Miniature Gauge MG-2 manufactured by CANON ANELVA CORPORATION. The deposition power was set to 0.5 kW with use of a DC power source. The substrate temperature was 300° C.

The In—Ga—Zn oxide that was used for the second oxide semiconductor film was deposited by a sputtering method with use of an In—Ga—Zn oxide target whose atomic ratio of In, Ga, and Zn was 1:3:2. As a deposition gas, a gas in which argon and oxygen were mixed to have a volume of oxygen of 33% was used. The pressure in deposition was adjusted to 0.4 Pa with Miniature Gauge MG-2 manufactured by CANON ANELVA CORPORATION. The deposition power was set to 0.5 kW with use of a DC power source. The substrate temperature was 200° C.

The silicon oxynitride film was deposited by a PECVD method. As a deposition gas, a gas in which monosilane and nitrous oxide were mixed to have a volume ratio of 1:800 was used. The pressure in the deposition was adjusted to be 200 Pa. The deposition power was 150 W with use of a high-frequency power source with a frequency of 60 MHz. The substrate temperature was 350° C. Gap was set to 28 mm.

In the oxygen ($O_2$) plasma treatment, oxygen with a flow rate of 800 sccm was supplied to a reaction chamber in a PECVD apparatus by a PECVD method. The pressure in supplying oxygen was adjusted to be 200 Pa. The deposition power was set to 150 W with use of a high-frequency power source of 60 MHz. The substrate temperature was 350° C. Gap was set to 28 mm.

Figure 44:
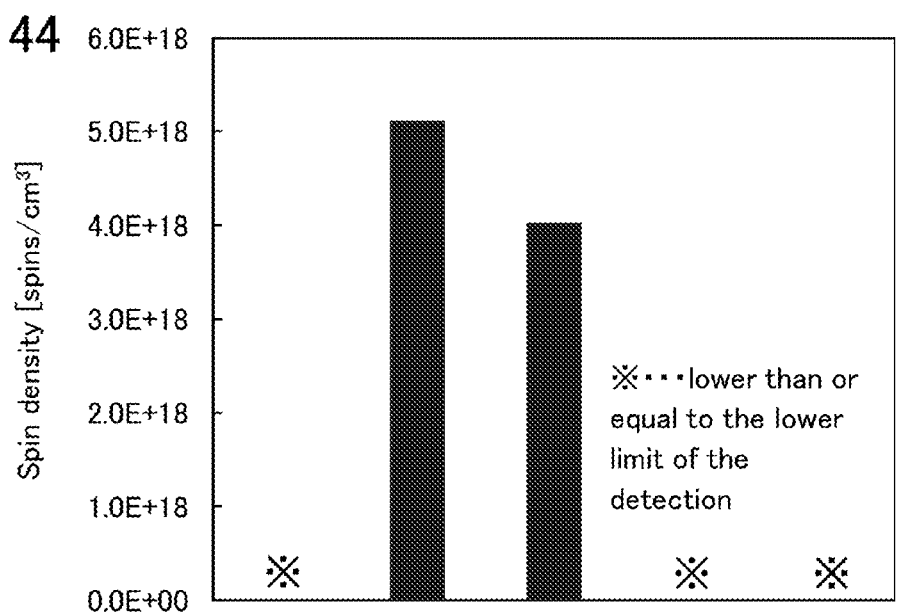
FIG. 44 shows spin densities examined by electron spin resonance.

Next, the samples were examined by ESR. Furthermore, a sample without an insulating film or a sample that has not been subjected to plasma treatment were also examined by ESR. The samples were located so that each film surface of the In—Ga—Zn oxide was perpendicular to a magnetic field. FIG. 44 shows the spin density of defect states (attributed to VoH) relating to signals that appear when the g-factor is in the vicinity of 1.93 in the oxide semiconductor film. For measurement by ESR, an electron spin resonance spectrometer JES-FA300 manufactured by JEOL Ltd. was used.

According to FIG. 44, with plasma treatment, the spin density attributed to VoH in the oxide semiconductor film can be decreased. In particular, with plasma treatment performed for 180 seconds or longer, the spin density attributed to VoH in the oxide semiconductor film can be lower than or equal to the lower limit ($7.4 \times 10^{17}$ spins/cm$^3$) of the detection.

Figure 45:
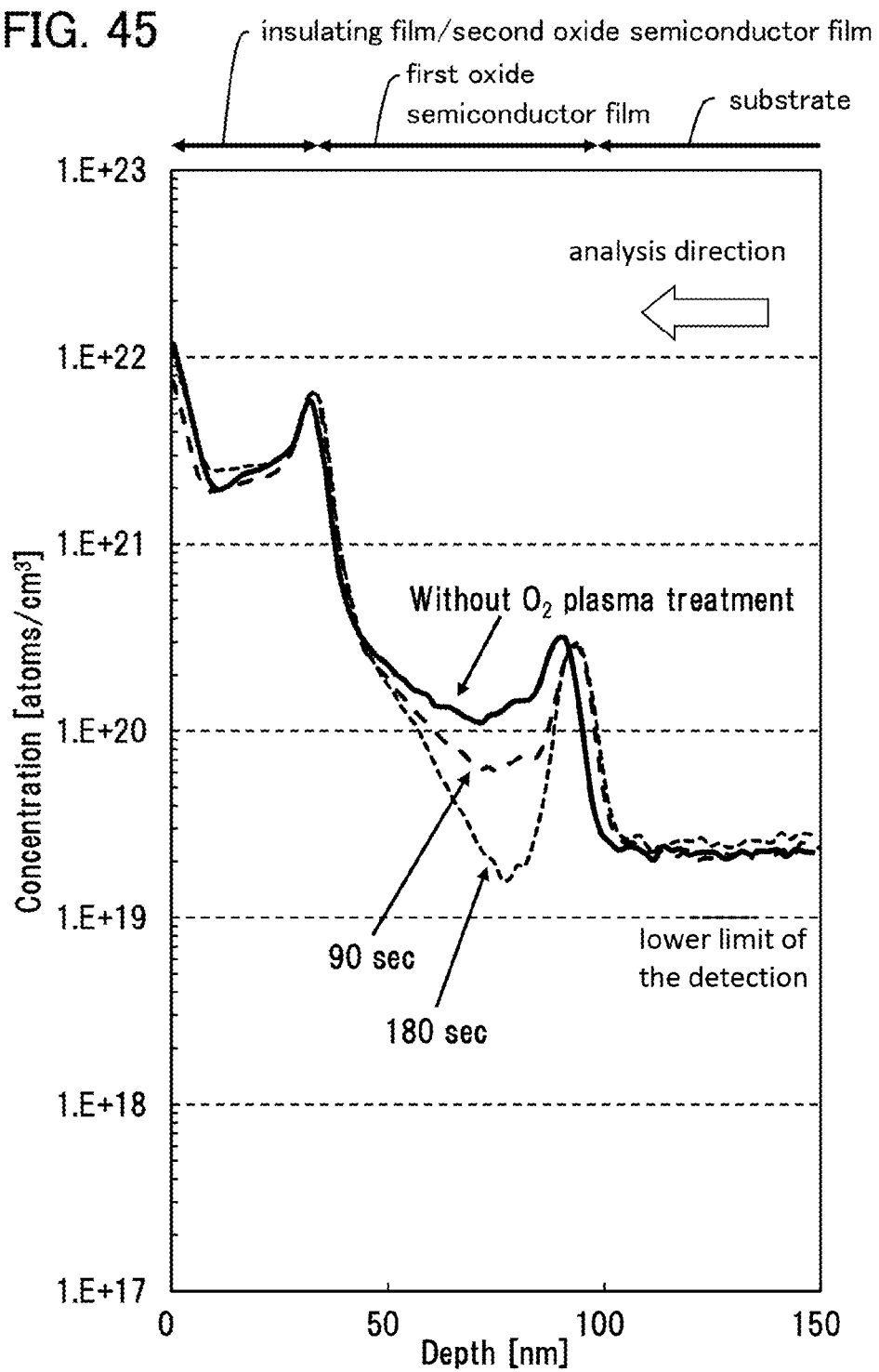
FIG. 45 shows depth profiles of hydrogen concentrations in samples in Example.

The hydrogen concentration in part of the above samples (sample including the insulating film and being subjected to oxygen ($O_2$) plasma treatment for zero seconds, 90 seconds, or 180 seconds) was evaluated. The hydrogen concentration was measured with use of a SIMS analysis apparatus. FIG. 45 shows depth profiles of the hydrogen concentrations of the samples.

According to FIG. 45, the hydrogen concentration in the first oxide semiconductor film changes and depends on the time during which the oxygen ($O_2$) plasma treatment is performed, and as the treatment time for the oxygen ($O_2$) plasma treatment is longer, the hydrogen concentration is decreased. This result suggests that the oxygen ($O_2$) plasma treatment performed after formation of the insulating film enables the hydrogen concentration in the first oxide semiconductor film and the second oxide semiconductor film to be decreased, which leads to a reduction in the spin density attributed to VoH.

EXAMPLE 5

In this example, electrical characteristics of a transistor, depending on presence or absence of oxygen ($O_2$) plasma treatment performed after formation of an insulating film, were examined.

Figure 46:
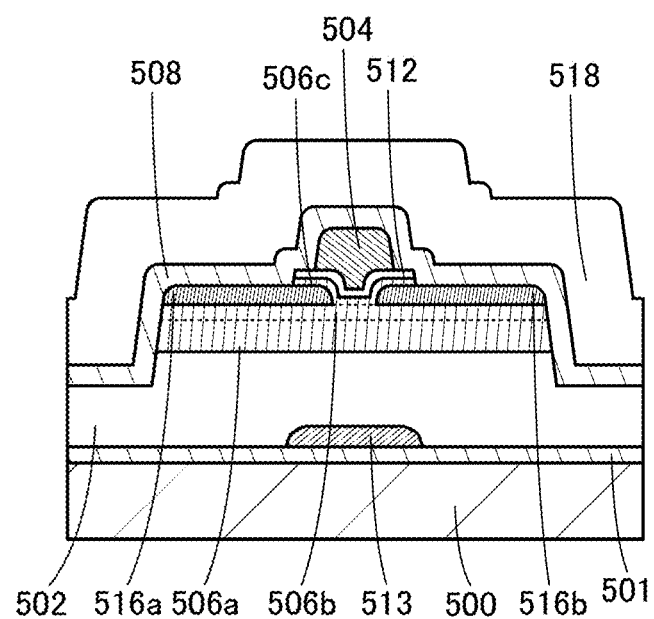
FIG. 46 is a cross-sectional view of a transistor.

A structure of the transistor formed as a sample is the same as that in FIG. 46.

In the sample, a silicon wafer was used as a substrate 500. As an insulating film 501, a 50-nm-thick aluminum oxide film was used. A 50-nm-thick tungsten film was used as a conductive film 513. As an insulating film 502, a 300-nm-thick silicon oxynitride film was used. As a semiconductor film 506a, a 40-nm-thick In—Ga—Zn oxide film was used. As a semiconductor film 506b, a 20-nm-thick In—Ga—Zn oxide film was used. As each of a conductive film 516a and a conductive film 516b, a 20-nm-thick tungsten film was used. As a semiconductor film 506c, a 5-nm-thick In—Ga—Zn oxide film was used. As an insulating film 512, a 10-nm-thick silicon oxynitride film was used. As a conductive film 504, a multilayer film in which a 10-nm-thick titanium nitride film and a 30-nm-thick tungsten film were stacked was used. An insulating film 508 was a 40-nm-thick aluminum oxide film. An insulating film 518 was a 150-nm-thick silicon oxynitride film.

The semiconductor film 506a was deposited by a sputtering method with use of an In—Ga—Zn oxide target whose atomic ratio of In, Ga, and Zn was 1:3:4. As a deposition gas, 40 sccm of an argon gas and 5 sccm of an oxygen gas were used. The pressure in deposition was adjusted to 0.7 Pa with Miniature Gauge MG-2 manufactured by CANON ANELVA CORPORATION. The deposition power was 0.5 kW with use of a DC power source. The substrate temperature was 200° C.

The semiconductor film 506b was deposited by a sputtering method with use of an In—Ga—Zn oxide target whose atomic ratio of In, Ga, and Zn is 1:1:1. As a deposition gas, 30 sccm of an argon gas and 15 sccm of an oxygen gas were used. The pressure in deposition was adjusted to 0.7 Pa with Miniature Gauge MG-2 manufactured by CANON ANELVA CORPORATION. The deposition power was set to 0.5 kW with use of a DC power source. The substrate temperature was 300° C.

The semiconductor film 506c was deposited by a sputtering method with use of an In—Ga—Zn oxide target whose atomic ratio of In, Ga, and Zn was 1:3:2. As a deposition gas, 30 sccm of an argon gas and 15 sccm of an oxygen gas were used. The pressure in deposition was adjusted to 0.4 Pa with Miniature Gauge MG-2 manufactured by CANON ANELVA CORPORATION. The deposition power was set to 0.5 kW with use of a DC power source. The substrate temperature was 200° C.

After an insulating film that is to be the insulating film 512 was formed, oxygen ($O_2$) plasma treatment was performed. In the oxygen ($O_2$) plasma treatment, oxygen with a flow rate of 800 sccm was supplied to a reaction chamber in a PECVD apparatus by a PECVD method. The pressure in supplying oxygen was adjusted to be 200 Pa. The deposition power was set to 150 W with use of a high-frequency power source of 60 MHz. The substrate temperature was 350° C. Gap was set to 28 mm.

The transistor formed under the above condition was Sample C1. For comparison, a transistor that was not subjected to oxygen ($O_2$) plasma treatment after formation of an insulating film that is to be the insulating film 512 was formed as Sample C2. As the size of the transistor (each of Sample C1 and Sample C2), the channel length was 0.84 μm, the channel width was 0.80 μm, and a length of a region in each of the conductive film 516a and the conductive film 516b overlapping with the conductive film 504 with the insulating film 512 interposed therebetween is 0.2 μm, seen in the channel length direction.

The gate voltage (Vg) versus drain current (Id) characteristics (hereinafter, also referred to as Vg-Id characteristics) of Sample C1 and Sample C2 were measured. The measurement of the Vg-Id characteristics was performed by measuring drain current (Id) when the drain voltage (Vd) was set to 0.1 V or 1.8 V and the gate voltage (Vg) was swept in the range of −3 V to +3 V. Note that the field-effect mobility ($\mu_{FE}$) of the transistors with a drain voltage (Vd) of 0.1 V is represented by the right axis of each of FIGS. 47A and 47B.

Figure 47A:
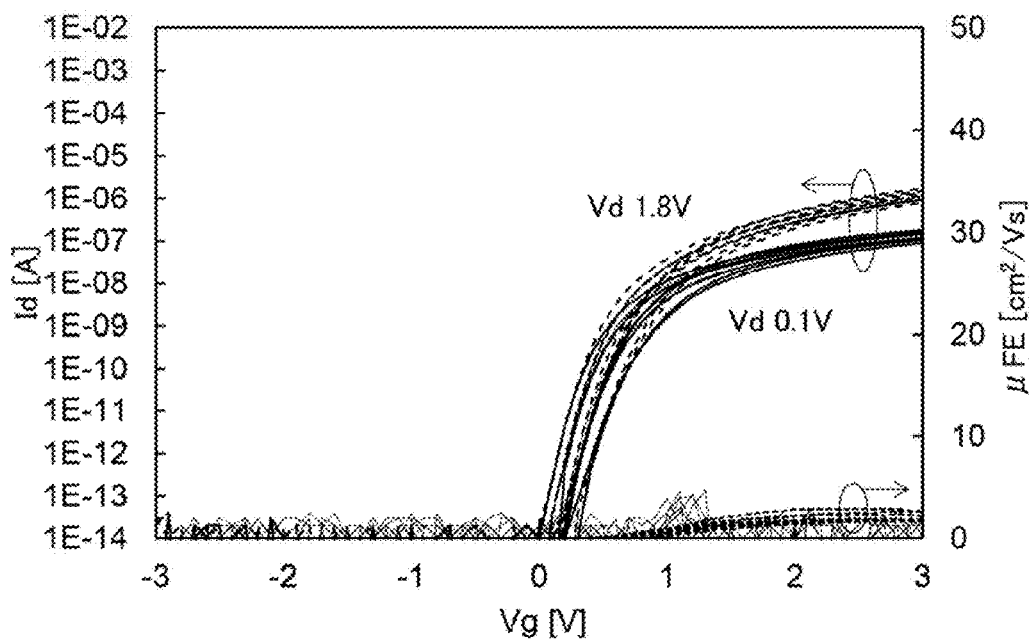
FIGS. 47A and 47B show electrical characteristics of transistors.
Figure 47B:
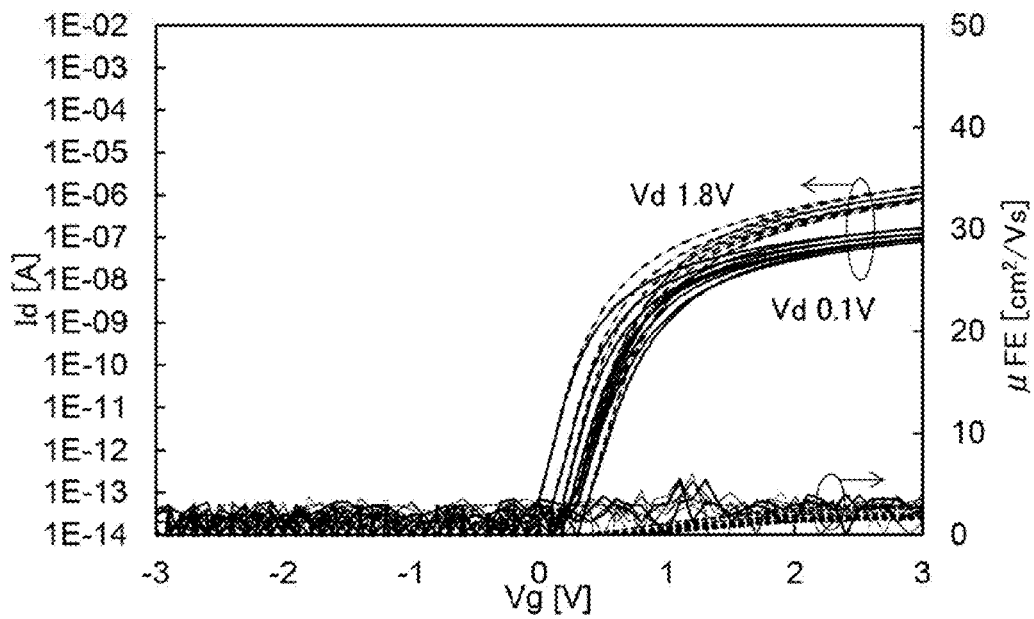

FIG. 47A shows electrical characteristics (Vg-Id characteristics and the field-effect mobility with respect to Vg) of Sample C1, and FIG. 47B shows electrical characteristics (Vg-Id characteristics and the field-effect mobility with respect to Vg) of Sample C2.

According to FIGS. 47A and 47B, a variation in threshold voltage in Sample C1 is smaller than that in Sample C2.

Evaluation of reliability was performed on Sample C1 and Sample C2. The reliability was evaluated by gate BT stress tests.

A measurement method in a positive gate BT stress test (positive BT) is described. To measure electrical characteristics in the initial state (a state before stress application) of a target transistor of the positive gate BT stress test, a change in drain current Id, that is, Vg-Id characteristics (shown in FIGS. 47A and 47B) were measured under the following conditions: the substrate temperature was 40° C., the drain voltage Vd was 0.1 V or 1.8 V, and the gate voltage was swept from −3 V to +3 V.

Next, the substrate temperature was increased to 150° C., and then a source voltage Vs, a drain voltage Vd, and a back gate voltage Vbg of the transistor were each set to 0 V. After that, a gate voltage Vg of 3.3 V was applied so that the intensity of the electric field applied to the insulating film 512 was 1.65 MV/cm. The gate voltage was kept being applied for 12 hours.

Note that a gate voltage Vg of −3.3 V was applied in a negative gate BT stress test (negative BT).

Figure 48A:
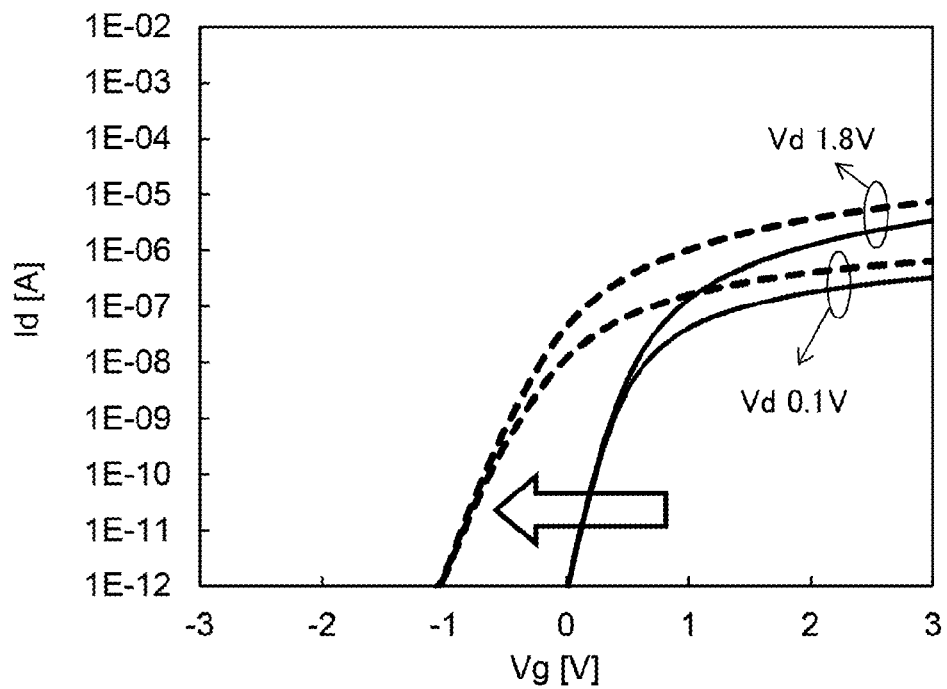
FIGS. 48A and 48B are graphs showing electrical characteristics of transistors measured between before and after gate BT stress tests.
Figure 48B:
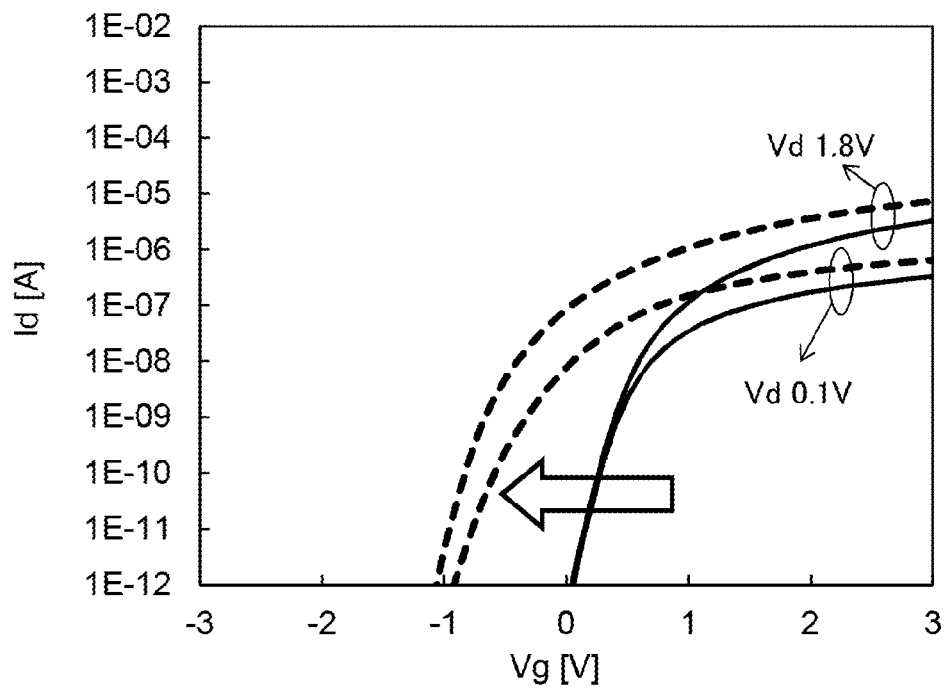
Figure 49A:
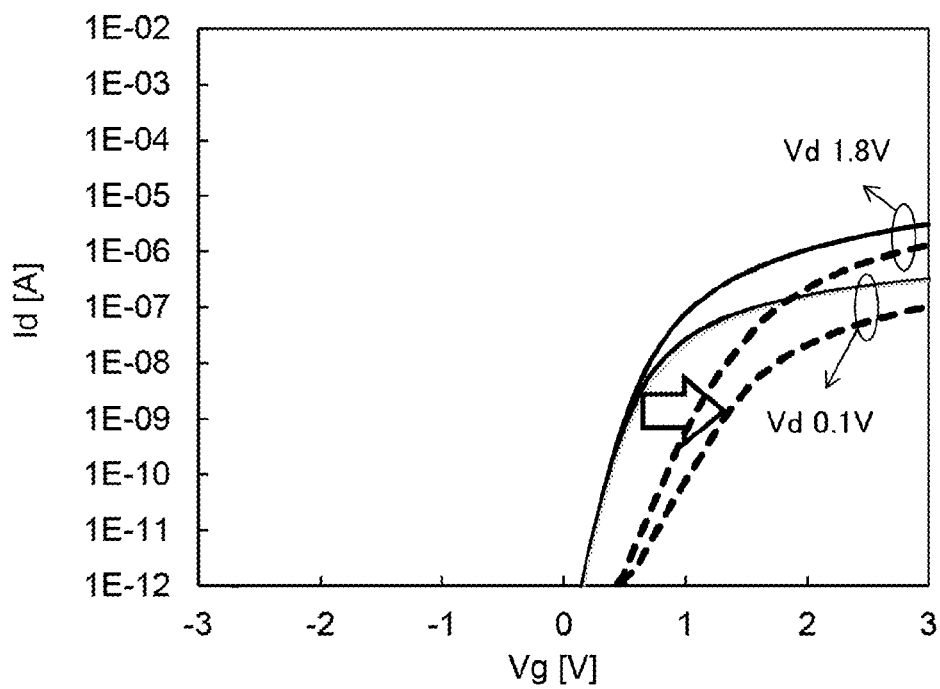
FIGS. 49A and 49B are graphs showing electrical characteristics of transistors measured between before and after gate BT stress tests.
Figure 49B:
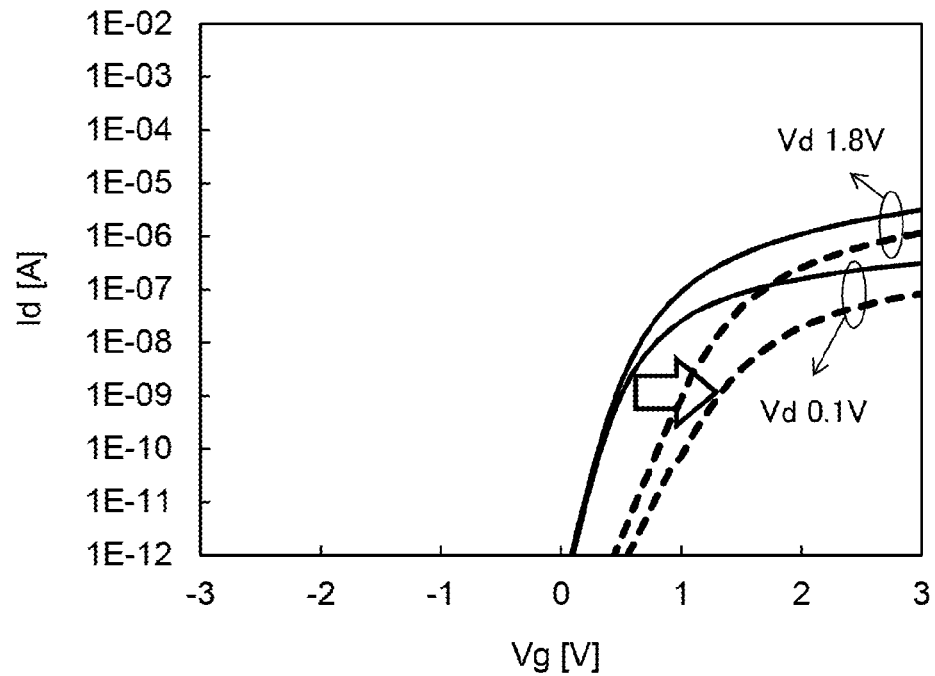

FIGS. 48A and 48B and FIGS. 49A and 49B show electrical characteristics (Vg-Id characteristics) of Sample C1 and Sample C2 before and after the gate BT stress test. Specifically, FIG. 48A shows results of Sample C1 before and after a positive BT test; FIG. 48B shows results of Sample C2 before and after a positive BT test; FIG. 49A shows results of Sample C1 before and after a negative BT test; and FIG. 49B shows results of Sample C2 before and after a negative BT test. In each of FIGS. 48A and 48B and FIGS. 49A and 49B, a solid line represents electrical characteristics before the gate BT stress test (before BT), and a dotted line represents electrical characteristics after the gate BT stress test (after BT).

Table 2 shows a change in threshold voltage (ΔVth) and a change in shift value (ΔShift), obtained from the results in FIGS. 48A and 48B and FIGS. 49A and 49B, before and after the test when the drain voltage Vd is 1.8 V. Note that the threshold voltage (Vth) refers to a gate voltage (voltage between a source and a gate) when a channel is formed. In a curve where the horizontal axis represents the gate voltage (Vg) and the vertical axis represents the square root of drain current (Id) and where data are plotted (Vg-√Id characteristics), the threshold voltage (Vth) was defined as a gate voltage (Vg) at a point of intersection of an extrapolated tangent line having the highest inclination with the square root of drain current (Id) of 0 (Id=0 A). In a curve where the horizontal axis represents the gate voltage (Vg) and the vertical axis represents the logarithm of the drain current (Id) and where data are plotted (Vg-Id characteristics), the shift value (Shift) is defined as a gate voltage (Vg) at a point of intersection of an extrapolated tangent line having the highest inclination with a drain current (Id) of $1\times10^{-12}$ A.

TABLE 2

|  |  | Sample C1 | Sample C2 |
|---|---|---|---|
| Positive BT | Δ Vth | 0.63 | 0.76 |
|  | Δ Shift | 1.03 | 1.11 |
| Negative BT | Δ Vth | 0.69 | 0.61 |
|  | Δ Shift | 0.32 | 0.36 |

According to FIGS. 48A and 48B, FIGS. 49A and 49B, and Table 2, a change in threshold voltage (ΔVth) and a change in shift value (ΔShift) of Sample C1 are smaller than those of Sample C2, and thus, Sample C1 is a transistor having stable electrical characteristics.

This application is based on Japanese Patent Application serial no. 2014-191058 filed with Japan Patent Office on Sep. 19, 2014, the entire contents of which are hereby incorporated by reference.

What is claimed is:

1. A method for evaluating an oxide semiconductor film in a semiconductor device comprising an insulating film, the oxide semiconductor film, and a conductive film,
wherein the oxide semiconductor film includes a region overlapping with the conductive film with the insulating film provided therebetween,
wherein plasma treatment is performed after the insulating film is formed, and
wherein after the plasma treatment, a peak value of reflectivity of a microwave in the oxide semiconductor film is calculated by a microwave photoconductive decay method, so that a hydrogen concentration in the oxide semiconductor film is estimated from a relation between peak values of reflectivity of microwave and hydrogen concentrations measured by SIMS in oxide semiconductor films.

2. The method for evaluating an oxide semiconductor film according to claim 1, wherein in the microwave photoconductive decay method, an excitation light with a wavelength less than or equal to 349 nm is used.

3. The method for evaluating an oxide semiconductor film according to claim 1,
wherein the oxide semiconductor film includes an oxide containing at least one of indium, zinc, and an element M, and
wherein the element M is aluminum, gallium, yttrium, or tin.

4. The method for evaluating an oxide semiconductor film according to claim 1,
wherein the semiconductor film other than a region that is to be a channel formation region therein is irradiated with an excitation light during the measurement of microwave photoconductive decay method.

5. A method for evaluating an oxide semiconductor film in a semiconductor device comprising an insulating film, the oxide semiconductor film, and a conductive film,
wherein the oxide semiconductor film includes a region overlapping with the conductive film with the insulating film provided therebetween,
wherein plasma treatment is performed after the insulating film is formed,
wherein a gas containing oxygen is used for the plasma treatment, and
wherein after the plasma treatment, a peak value of reflectivity of a microwave in the oxide semiconductor film is calculated by a microwave photoconductive decay method, so that a hydrogen concentration in the oxide semiconductor film is estimated from a relation between peak values of reflectivity of microwave and hydrogen concentrations measured by SIMS in oxide semiconductor films.

6. The method for evaluating an oxide semiconductor film according to claim 5, wherein in the microwave photoconductive decay method, an excitation light with a wavelength less than or equal to 349 nm is used.

7. The method for evaluating an oxide semiconductor film according to claim 5,
wherein the oxide semiconductor film includes an oxide containing at least one of indium, zinc, and an element M, and
wherein the element M is aluminum, gallium, yttrium, or tin.

8. The method for evaluating an oxide semiconductor film according to claim 5,
wherein the semiconductor film other than a region that is to be a channel formation region therein is irradiated with an excitation light in the microwave photoconductive decay method.

9. A method for manufacturing a semiconductor device, comprising the steps of:
forming an oxide semiconductor film;
forming an insulating film over the oxide semiconductor film;
performing plasma treatment on the insulating film;
evaluating the oxide semiconductor film by a microwave photoconductive decay method after forming the insulating film;
estimating a hydrogen concentration in the oxide semiconductor film from a predetermined relation between peak values of reflectivity of microwave measured by a microwave photoconductive decay method and hydrogen concentrations measured by SIMS in oxide semiconductor films, and
forming a conductive film over the insulating film,
wherein the plasma treatment is performed for a time period longer than or equal to 90 seconds and shorter than 180 seconds.

10. The method for manufacturing a semiconductor device according to claim 9, wherein a gas containing oxygen is used for the plasma treatment.

11. The method for manufacturing a semiconductor device according to claim 9, wherein the oxide semiconductor film includes an oxide containing at least one of indium, zinc, and an element M, and
wherein the element M is aluminum, gallium, yttrium, or tin.

12. The method for manufacturing a semiconductor device according to claim 9,
wherein the semiconductor film other than a region that is to be a channel formation region therein is irradiated with an excitation light in the microwave photoconductive decay method.

13. A method for manufacturing a semiconductor device, comprising the steps of:
forming an oxide semiconductor film;
forming an insulating film over the oxide semiconductor film;
performing plasma treatment on the insulating film;
evaluating the oxide semiconductor film by a microwave photoconductive decay method after forming the insulating film;
estimating a hydrogen concentration in the oxide semiconductor film from a predetermined relation between peak values of reflectivity of microwave measured by a microwave photoconductive decay method and hydrogen concentrations measured by SIMS in oxide semiconductor films, and
forming a conductive film over the insulating film.

14. The method for manufacturing a semiconductor device according to claim 13, wherein a gas containing oxygen is used for the plasma treatment.

15. The method for manufacturing a semiconductor device according to claim 13, wherein the oxide semiconductor film includes an oxide containing at least one of indium, zinc, and an element M, and
wherein the element M is aluminum, gallium, yttrium, or tin.

16. The method for manufacturing a semiconductor device according to claim 13, wherein the semiconductor film other than a region that is to be a channel formation region therein is irradiated with an excitation light in the microwave photoconductive decay method.

* * * * *